United States Patent
Maghsoodi et al.

(10) Patent No.: US 9,688,863 B2
(45) Date of Patent: *Jun. 27, 2017

(54) HIGH GAIN DURABLE ANTI-REFLECTIVE COATING

(71) Applicant: Enki Technology, Inc., San Jose, CA (US)

(72) Inventors: Sina Maghsoodi, San Jose, CA (US); Brenor L. Brophy, San Jose, CA (US); Thomas E. Colson, Sunnyvale, CA (US); Peter R. Gonsalves, Santa Clara, CA (US); Ze'ev R. Abrams, New York, NY (US)

(73) Assignee: Enki Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/182,729

(22) Filed: Jun. 15, 2016

(65) Prior Publication Data

US 2016/0289457 A1 Oct. 6, 2016

Related U.S. Application Data

(63) Continuation of application No. 14/799,507, filed on Jul. 14, 2015, now Pat. No. 9,399,720, which is a (Continued)

(51) Int. Cl.
*C09D 173/00* (2006.01)
*C09D 5/00* (2006.01)
(Continued)

(52) U.S. Cl.
CPC .............. *C09D 5/006* (2013.01); *C03C 17/30* (2013.01); *C09D 7/1216* (2013.01);
(Continued)

(58) Field of Classification Search
None
See application file for complete search history.

(56) References Cited

U.S. PATENT DOCUMENTS 2,432,484 A 12/1947 Moulton
4,049,506 A 9/1977 Gilding
(Continued)

FOREIGN PATENT DOCUMENTS

DE 10253841 A1 5/2004
EP 1181256 B1 3/2006
(Continued)

OTHER PUBLICATIONS

"Figures 4a and 4b from U.S. Appl. No. 13/184,568", 2012, 1 Page.
(Continued)

*Primary Examiner* — Robert S Loewe
(74) *Attorney, Agent, or Firm* — MacMillan, Sobanski & Todd, LLC

(57) ABSTRACT

Disclosed herein are polysilsesquioxane-based anti-reflective coating (ARC) compositions, methods of preparation, and methods of deposition on a substrate. In one embodiment, the polysilsesquioxane of this disclosure is prepared in a two-step process of acid catalyzed hydrolysis of organoalkoxysilane followed by addition of tetralkoxysilane that generates silicone polymers with >40 mol % silanol based on Si-NMR. These high silanol siloxane polymers are stable and have a long shelf-life in polar organic solvents at room temperature. Also disclosed are low refractive index ARC made from these compositions with and without additives such as porogens, templates, thermal radical initiator, photo radical initiators, crosslinkers, Si—OH condensation catalyst and nano-fillers. Also disclosed are methods and apparatus for applying coatings to flat substrates including substrate pre-treatment processes, coating processes and coating curing processes including skin-curing using hot-air knives.

(Continued)

Also disclosed are coating compositions and formulations for highly tunable, durable, highly abrasion-resistant functionalized anti-reflective coatings.

37 Claims, 49 Drawing Sheets

Related U.S. Application Data continuation of application No. 14/799,479, filed on Jul. 14, 2015, now Pat. No. 9,376,589, and a continuation-in-part of application No. 14/491,259, filed on Sep. 19, 2014, now Pat. No. 9,382,449, and a continuation-in-part of application No. 14/799,223, filed on Jul. 14, 2015.

(60) Provisional application No. 60/024,440, filed on Jul. 14, 2014.

(51) Int. Cl.
| | |
|---|---|
| *G02B 1/11* | (2015.01) |
| *C03C 17/30* | (2006.01) |
| *C09D 183/08* | (2006.01) |
| *G02B 1/111* | (2015.01) |
| *G02B 1/12* | (2006.01) |
| *H01L 31/0216* | (2014.01) |
| *H01L 31/18* | (2006.01) |
| *H01L 33/00* | (2010.01) |
| *H01L 33/44* | (2010.01) |
| *C09D 183/04* | (2006.01) |
| *C09D 7/12* | (2006.01) |
| *G02B 5/02* | (2006.01) |
| *C08K 3/36* | (2006.01) |
| *G02B 1/14* | (2015.01) |

(52) U.S. Cl.
CPC ......... *C09D 173/00* (2013.01); *C09D 183/04* (2013.01); *C09D 183/08* (2013.01); *G02B 1/11* (2013.01); *G02B 1/111* (2013.01); *G02B 1/12* (2013.01); *G02B 5/021* (2013.01); *H01L 31/02168* (2013.01); *H01L 31/18* (2013.01); *H01L 33/005* (2013.01); *H01L 33/44* (2013.01); *C03C 2217/20* (2013.01); *C08K 3/36* (2013.01); *G02B 1/14* (2015.01); *G02B 5/0215* (2013.01); *G02B 5/0221* (2013.01)

(56) References Cited

U.S. PATENT DOCUMENTS

| | | |
|---|---|---|
| 4,210,699 A | 7/1980 | Olson et al. |
| 4,246,038 A | 1/1981 | Vaughn et al. |
| 4,319,983 A | 3/1982 | Yoo |
| 4,387,960 A | 6/1983 | Tani |
| 4,535,026 A | 8/1985 | Yoldas et al. |
| 4,687,707 A | 8/1987 | Matsuo et al. |
| 4,857,613 A | 8/1989 | Zolk et al. |
| 4,929,278 A | 5/1990 | Ashley et al. |
| 4,966,812 A | 10/1990 | Ashley et al. |
| 5,091,460 A | 2/1992 | Seto et al. |
| 5,368,892 A | 11/1994 | Berquier |
| 5,527,931 A | 6/1996 | Rich et al. |
| 5,580,819 A | 12/1996 | Li et al. |
| 5,698,266 A | 12/1997 | Floch et al. |
| 5,851,674 A | 12/1998 | Pellerite et al. |
| 5,858,462 A | 1/1999 | Yamazaki |
| 6,054,601 A | 4/2000 | Standke et al. |
| 6,177,131 B1 | 1/2001 | Glaubitt et al. |
| 6,183,872 B1 | 2/2001 | Tanaka et al. |
| 6,277,485 B1 | 8/2001 | Invie et al. |
| 6,312,152 B2 | 11/2001 | Dee et al. |
| 6,337,133 B1 | 1/2002 | Akamatsu et al. |
| 6,376,064 B1 | 4/2002 | Gasworth et al. |
| 6,472,073 B1 | 10/2002 | Singh et al. |
| 6,506,496 B1 | 1/2003 | Frugier et al. |
| 6,556,228 B1 | 4/2003 | Camis |
| 6,692,832 B2 | 2/2004 | Murphy |
| 6,768,048 B2 | 7/2004 | Woll et al. |
| 6,828,381 B1 | 12/2004 | Armbrust et al. |
| 6,902,767 B2 | 6/2005 | Kelsoe |
| 6,906,115 B2 | 6/2005 | Hanazawa et al. |
| 6,942,924 B2 | 9/2005 | He et al. |
| 6,997,018 B2 | 2/2006 | Sakoske et al. |
| 7,128,778 B2 | 10/2006 | Thompson |
| 7,128,944 B2 | 10/2006 | Becker et al. |
| 7,241,505 B2 | 7/2007 | Glaubitt et al. |
| 7,345,351 B2 | 3/2008 | Moon et al. |
| 7,351,449 B2 | 4/2008 | Hunt et al. |
| 7,575,809 B2 | 8/2009 | Glaubitt et al. |
| 7,588,823 B2 | 9/2009 | Taylor |
| 7,635,522 B2 | 12/2009 | Cnossen et al. |
| 7,642,199 B2 | 1/2010 | Meredith et al. |
| 7,704,608 B2 | 4/2010 | Thies et al. |
| 8,217,261 B2 | 7/2012 | Wieting |
| 8,263,312 B2 | 9/2012 | Fu et al. |
| 8,304,161 B2 | 11/2012 | Bradford et al. |
| 8,557,877 B2 | 10/2013 | Mukhopadhyay et al. |
| 8,668,960 B1 | 3/2014 | Hanumanthu et al. |
| 8,864,897 B2 | 10/2014 | Nair et al. |
| 9,353,268 B2 | 5/2016 | Brophy et al. |
| 9,376,589 B2 | 6/2016 | Maghsoodi et al. |
| 9,376,593 B2 | 6/2016 | Maghsoodi et al. |
| 9,382,449 B2 | 7/2016 | Maghsoodi et al. |
| 9,399,720 B2 | 7/2016 | Maghsoodi et al. |
| 9,461,185 B2 | 10/2016 | Nair et al. |
| 2001/0031811 A1 | 10/2001 | Li et al. |
| 2002/0090519 A1 | 7/2002 | Kursawe et al. |
| 2002/0090739 A1 | 7/2002 | Laguitton |
| 2002/0150765 A1 | 10/2002 | Chang et al. |
| 2006/0286813 A1 | 12/2006 | Meredith et al. |
| 2006/0292345 A1 | 12/2006 | Dave et al. |
| 2007/0074757 A1 | 4/2007 | Mellott et al. |
| 2007/0116970 A1 | 5/2007 | Kato et al. |
| 2007/0148435 A1 | 6/2007 | Meredith et al. |
| 2007/0184247 A1 | 8/2007 | Simpson et al. |
| 2007/0264437 A1 | 11/2007 | Zimmermann et al. |
| 2008/0014335 A1 | 1/2008 | Fu et al. |
| 2008/0063859 A1 | 3/2008 | Fath |
| 2008/0113188 A1 | 5/2008 | Shah et al. |
| 2008/0248312 A1 | 10/2008 | Thies et al. |
| 2008/0271782 A1 | 11/2008 | Sharma et al. |
| 2009/0029145 A1 | 1/2009 | Thies et al. |
| 2009/0043025 A1 | 2/2009 | Tsujimoto et al. |
| 2009/0087665 A1 | 4/2009 | Suzuki et al. |
| 2009/0151773 A1 | 6/2009 | Hayes et al. |
| 2009/0191346 A1 | 7/2009 | Thies et al. |
| 2009/0194165 A1 | 8/2009 | Murphy et al. |
| 2009/0285993 A1 | 11/2009 | Kang et al. |
| 2010/0015454 A1 | 1/2010 | Anderson et al. |
| 2010/0016502 A1 | 1/2010 | Rentrop et al. |
| 2010/0101649 A1 | 4/2010 | Huignard et al. |
| 2010/0221557 A1 | 9/2010 | Higuchi et al. |
| 2010/0275815 A1 | 11/2010 | Dave |
| 2010/0313950 A1 | 12/2010 | Mukhopadhyay et al. |
| 2011/0003130 A1 | 1/2011 | Marchet et al. |
| 2011/0151146 A1 | 6/2011 | Okano et al. |
| 2011/0236835 A1 | 9/2011 | Fu et al. |
| 2011/0308602 A1 | 12/2011 | Junghänel et al. |
| 2012/0040179 A1 | 2/2012 | Dave et al. |
| 2012/0225215 A1 | 9/2012 | Kalyankar et al. |
| 2012/0251718 A1 | 10/2012 | Kalyankar et al. |
| 2013/0034653 A1 | 2/2013 | Kumar et al. |
| 2013/0034722 A1 | 2/2013 | Kalyankar et al. |
| 2013/0095237 A1 | 4/2013 | Kalyankar et al. |
| 2013/0180580 A1 | 7/2013 | Krasnov et al. |
| 2013/0186466 A1 | 7/2013 | Hebrink et al. |
| 2014/0004334 A1 | 1/2014 | Kalyankar |
| 2014/0011019 A1 | 1/2014 | Mukhopadhyay et al. |
| 2014/0150850 A1 | 6/2014 | Hwang et al. |

(56) References Cited

U.S. PATENT DOCUMENTS

| | | |
|---|---|---|
| 2014/0166092 A1 | 6/2014 | Kozinsky et al. |
| 2014/0170403 A1 | 6/2014 | Tang et al. |
| 2014/0261615 A1 | 9/2014 | Nair et al. |
| 2014/0261673 A1 | 9/2014 | Nair et al. |
| 2014/0272126 A1 | 9/2014 | Liang et al. |
| 2015/0037570 A1 | 2/2015 | Brophy et al. |
| 2016/0002498 A1 | 1/2016 | Maghsoodi et al. |
| 2016/0013329 A1 | 1/2016 | Brophy et al. |
| 2016/0032141 A1 | 2/2016 | Maghsoodi et al. |
| 2016/0032147 A1 | 2/2016 | Maghsoodi et al. |
| 2016/0035912 A1 | 2/2016 | Nair et al. |
| 2016/0083620 A1 | 3/2016 | Maghsoodi et al. |

FOREIGN PATENT DOCUMENTS

| | | |
|---|---|---|
| EP | 1674891 A1 | 6/2006 |
| JP | 02264074 A | 10/1990 |
| JP | 04085380 A | 3/1992 |
| JP | 09048640 A | 2/1997 |
| JP | 2002053806 A | 2/2002 |
| JP | 2003201443 A | 7/2003 |
| JP | 2005196802 A | 7/2005 |
| JP | 2006215542 A | 8/2006 |
| KR | 1020140065250 A | 5/2014 |
| WO | 9743224 A1 | 11/1997 |
| WO | 0010934 A1 | 3/2000 |
| WO | 0064830 A1 | 11/2000 |
| WO | 2004044071 A2 | 5/2004 |
| WO | 2004051755 A1 | 6/2004 |
| WO | 2005044554 A2 | 5/2005 |
| WO | 2007068545 A2 | 6/2007 |
| WO | 2008027698 A1 | 3/2008 |
| WO | 2008074823 A1 | 6/2008 |
| WO | 2010127034 A1 | 11/2010 |
| WO | 2013012753 A1 | 1/2013 |
| WO | 2014193513 | 12/2014 |
| WO | 2014193513 A3 | 2/2015 |
| WO | 2016011041 A1 | 1/2016 |
| WO | 2016011071 A2 | 1/2016 |
| WO | 2016011071 A3 | 3/2016 |
| WO | 2016064494 A2 | 4/2016 |
| WO | 2016064494 A3 | 4/2016 |

OTHER PUBLICATIONS

Abrams, et al., "Field and Lab Verification of Hydrophobic Anti-Reflective and Anti-Soiling Coatings on Photovoltaic Glass", Topic 5BV.1.50: Operation of PV Systems and Plants, presented at the 29th European PV Solar Energy conference and Exhibition (EUPVSEC), Amsterdam, The Netherlands, Sep. 22-26, 2014, 6 pages.

Abrams, et al., "Field Performance Gains of Anti-Soiling & Anti-Reflective Photovoltaic Glass Coating", SNEC 2014—The 8th International Photovoltaic Power Generation Conference & Exhibition, Shanghai, China, May 20-22, 2014, 7 pages.

Aegerter, et al., "Coatings made by Sol-Gel and Chemical Nanotechnology", J. Sol-Gel Sci. Technol., vol. 47, Jun. 5, 2008, pp. 203-236.

Cuddihy, et al., "Antisoiling Technology: Theories of Surface Soiling and Performance of Antisoiling Surface coatings", JPL Publication 84-72, JPL Document 5101-251, DOE/JPL-1012-102, Jet Propulsion Laboratory, Pasadena, California, Nov. 15, 1984, 38 pages.

Garcia, et al., "Soiling and other optical losses in solar-tracking PV plants in Navarra", Progress in Photovoltaics: Research and Applications, vol. 19, Iss. 2,, Mar. 2011, pp. 211-217.

Hacke, et al., "Characterization of Multicrystalline Silicon Modules with System Bias Voltage Applied in Damp Heat", Presented at the 25th European Photovoltaic Solar Energy, Conference and Exhibition (EUPVSEC), Valencia, Spain, Sep. 6-10, 2010, Conference Paper NREL/CP-5200-49344, Jul. 2011, 8 pages.

Hacke, et al., "System voltage potential-induced degradation mechanisms in PV modules and methods for test", Presented at the 37th IEEE Photovoltaic Specialists Conference (PVSC), Seattle, Washington, Jun. 19-24, 2011, Jul. 2011, 9 pages.

Hacke, et al., "Test-to-Failure of Crystalline Silicon Modules", Presented at the 35th IEEE Photovoltaic Specialists Conference, Honolulu, Hawaii, Jun. 20-25, 2010, Conference Paper NREL/CP-5200-47755, Oct. 2010, 10 pages.

Kimber, et al., "The Effect of Soiling on Large Grid-Connected Photovoltaic Systems in California and the Southwest Region of the United States", Conference Record of the 2006 IEEE 4th World Conference on Photovoltaic Energy Conversion, vol. 2, pp. 2391-2395, May 2006.

Makita, et al., "Sol-Gel Preparation of Silica Films with Controlled Surface Morphology and Their Application to a Low Reflective Glass", Journal of Sol-Gel Science and Technology, vol. 14, 1999, pp. 175-186.

Nocuń, et al., "Sodium diffusion barrier coatings prepared by sol-gel method", Optica Applicata, vol. XXXVIII, No. 1,, 2008, pp. 171-179.

PCT/US2010/032823, "International Preliminary Report on Patentability for International Application Serial No. PCT/US2010/032823 mailed Nov. 10, 2011", 5 pages.

PCT/US2010/032823, "International Search Report and Written Opinion for International Application Serial No. PCT/US2010/032823 mailed Jun. 28, 2010", 7 pages.

PCT/US2012/046791, "International Application Serial No. PCT/US2012/046791, International Preliminary Report on Patentability and Written Opinion mailed Jan. 30, 2014", Southern Illinois University Carbondale et al, 7 Pages.

PCT/US2012/046791, "International Search Report and Written Opinion for International Application Serial No. PCT/US2012/046791 mailed Sep. 21, 2012", 8 pages.

PCT/US2014/022857, "International Application Serial No. PCT/US2014/022857, International Preliminary Report on Patentability and Written Opinion mailed Sep. 24, 2015", Enki Technology, Inc., 5 Pages.

PCT/US2014/022857, "International Application Serial No. PCT/US2014/022857, International Search Report and Written Opinion mailed Dec. 19, 2014", Enki Technology, Inc., 8 Pages.

PCT/US2015/040393, "International Application Serial No. PCT/US2015/040393, International Search Report and Written Opinion mailed Nov. 13, 2015", Enki Technology, Inc., 11 pages.

PCT/US2015/040440, "International Application Serial No. PCT/US2015/040440 International Search Report and Written Opinion mailed Feb. 5, 2016", Enki Technology, Inc., 17 pages.

PCT/US2015/050561, "International Application Serial No. PCT/US2015/050561, International Search Report and Written Opinion mailed Jun. 15, 2016", Enki Technology, Inc., 12 Pages.

Pingel, et al., "Potential Induced Degradation of solar cells and panels", 35th IEEE Photovoltaic Specialists Conference (PVSC), 2010, 6 pages.

Pop, et al., "A Highly Abrasive-Resistant, Long-Lasting Anti-Reflective Coating for PV Module Glass", 40th IEEE Photovoltaic Specialists Conference, Denver, Colorado, USA, Jun. 8-13, 2014, 5 pages.

Rose, et al., "Mass Production of PV Modules with 18% Total-Area Efficiency and High Energy Delivery Per Peak Watt", Conference Record of the 2006 IEEE 4th World Conference on Photovoltaic Energy Conversion (WCPEC), vol. 2, Waikoloa, HI, May 7-12, 2006, pp. 2018-2023.

San Vicente, et al., "Long-term durability of sol-gel porous coatings for solar glass covers", Thin Solid Films, vol. 517, issue 10, Mar. 31, 2009 (e-version 2008), pp. 3157-3160.

San Vicente, et al., "Surface modification of porous antireflective coatings for solar glass covers", Solar Energy, vol. 35, issue 4, Apr. 2011 (e-version 2010), pp. 676-680.

Schutze, et al., "Laboratory study of potential induced degradation of silicon photovoltaic modules", 37th IEEE Photovoltaic Specialists Conference (PVSC), 2011, 6 pages.

(56) References Cited

OTHER PUBLICATIONS

Tatapudi, "Potential Induced Degradation (PID) of Pre-Stressed Photovoltaic Modules: Effect of Glass Surface Conductivity Disruption", Master of Science in Technology Thesis, Arizona State University, Dec. 2012, 110 pages.

Xiu, et al., "Fabrication of Surface Micro-And Nanostructures for Superhydrophobic Surfaces in Electric and Electronic Applications", In Partial Fulfillment of the Requirements for the Degree Doctor of Philosophy in the School of Chemical and Biomolecular Engineering, Georgia Institute of Technology, Dec. 2008, 287 Pages.

Xu, et al., "Comparative study on hydrophobic anti-reflective films from three kinds of methyl-modified silica sols", Journal of Non-Crystalline Solids, vol. 351, 2005, pp. 258-266.

Xu, et al., "Durable solgel antireflective films with high laser-induced damage thresholds for inertial confinement fusion", J. Opt. Soc. Am. B, vol. 22, No. 4, Apr. 2005, pp. 905-912.

Yan, et al., "SiO2 As Barrier Layer for Na Out-Diffusion from Soda-Lime Glass", 35th IEEE Photovoltaic Specialists Conference (PVSC), Jun. 20-25, 2010, Honolulu, HI, 2010, pp. 002519-002521.

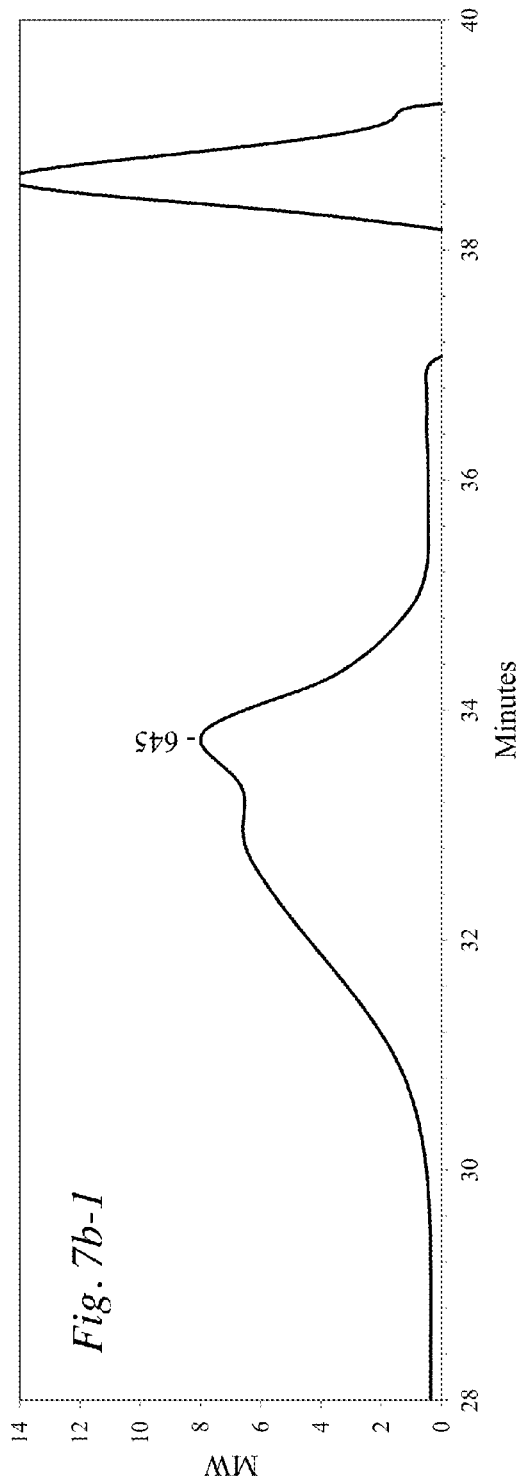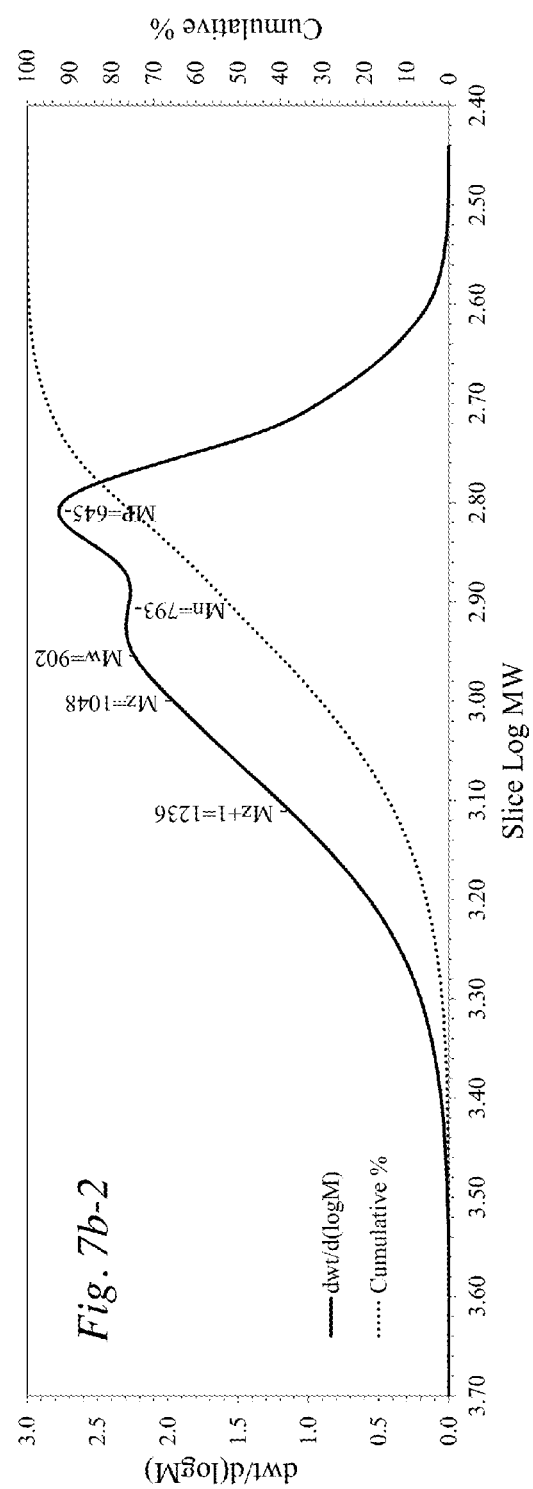
Fig. 7b-1
Fig. 7b-2

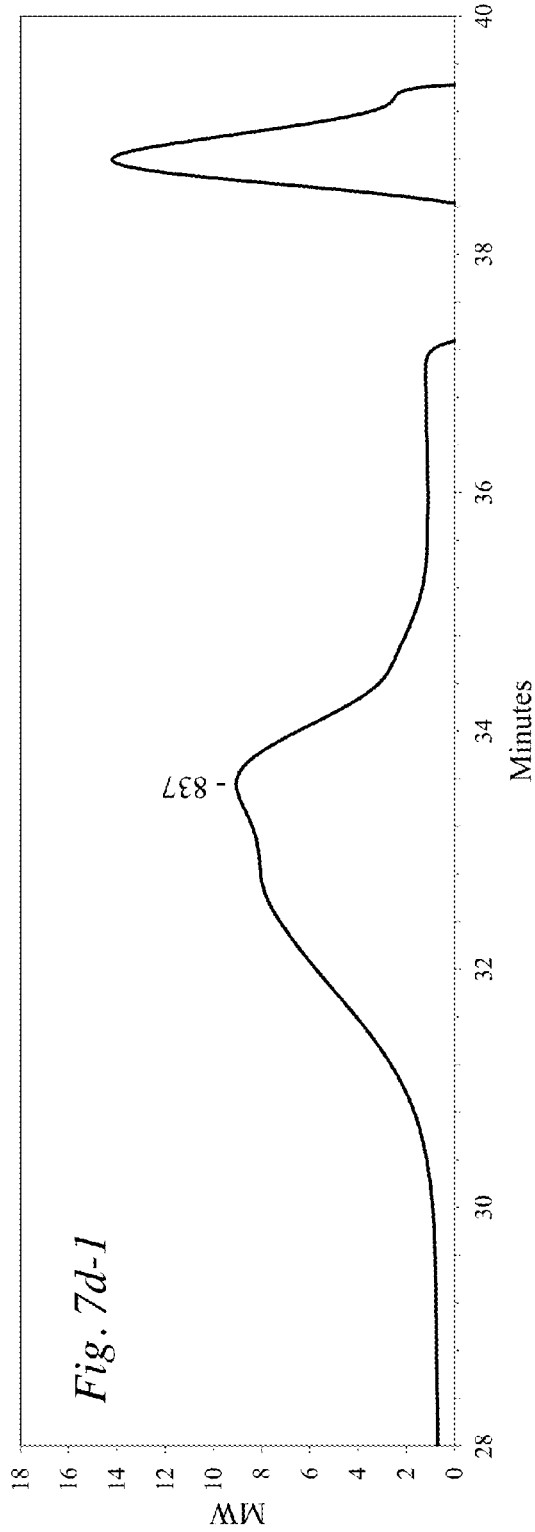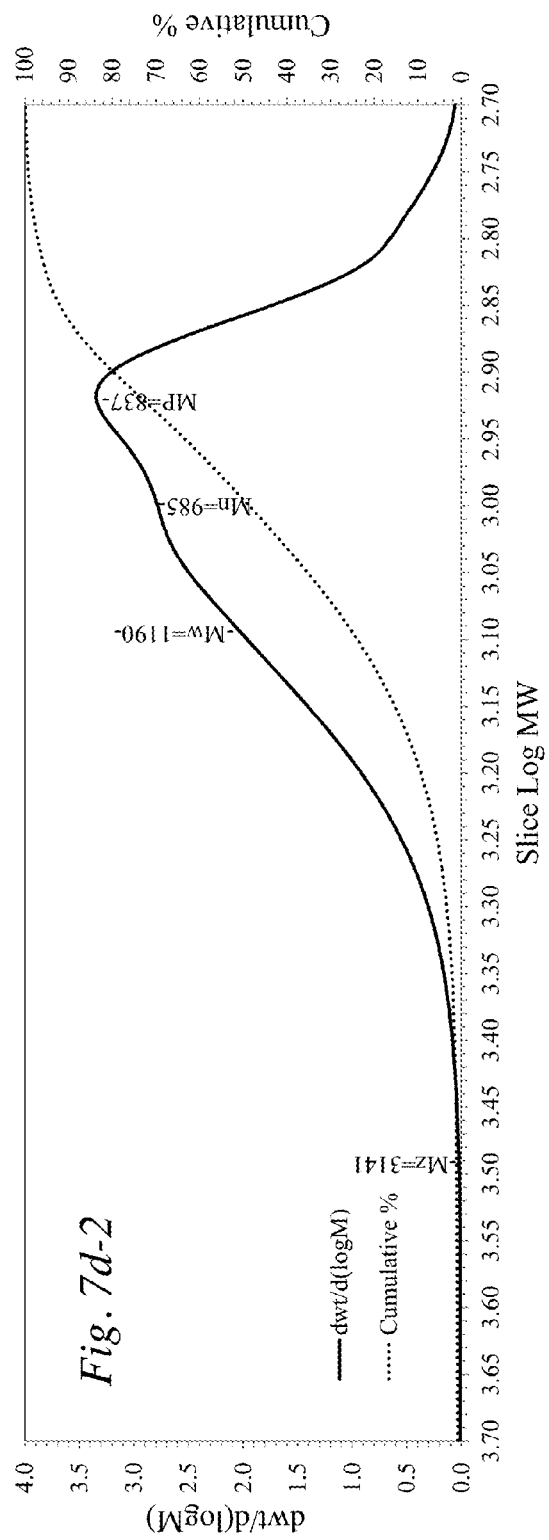
Fig. 7d-1
Fig. 7d-2

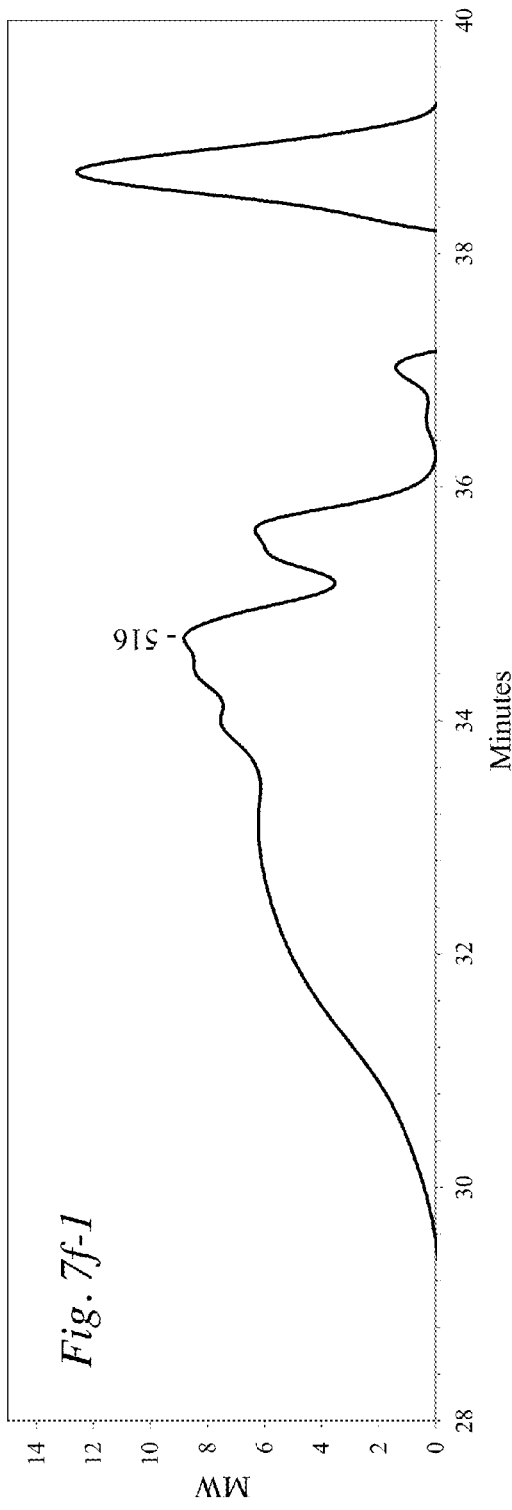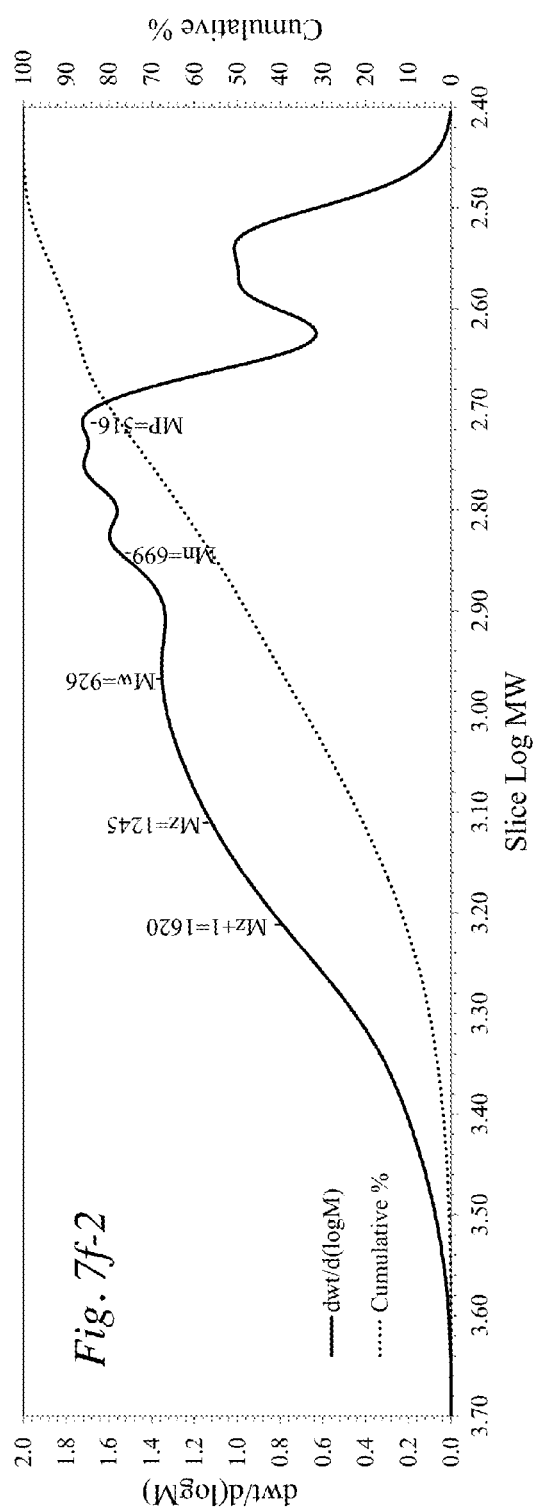
Fig. 7f-1
Fig. 7f-2

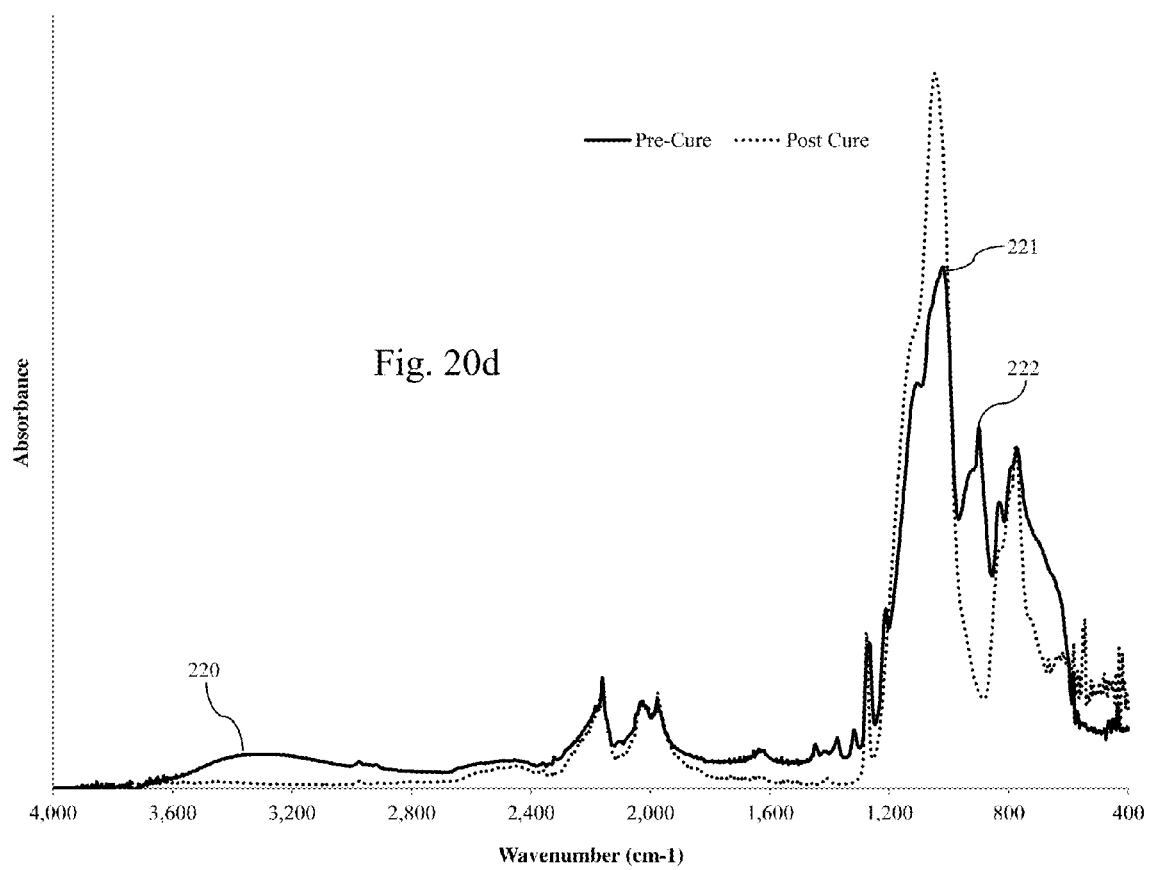

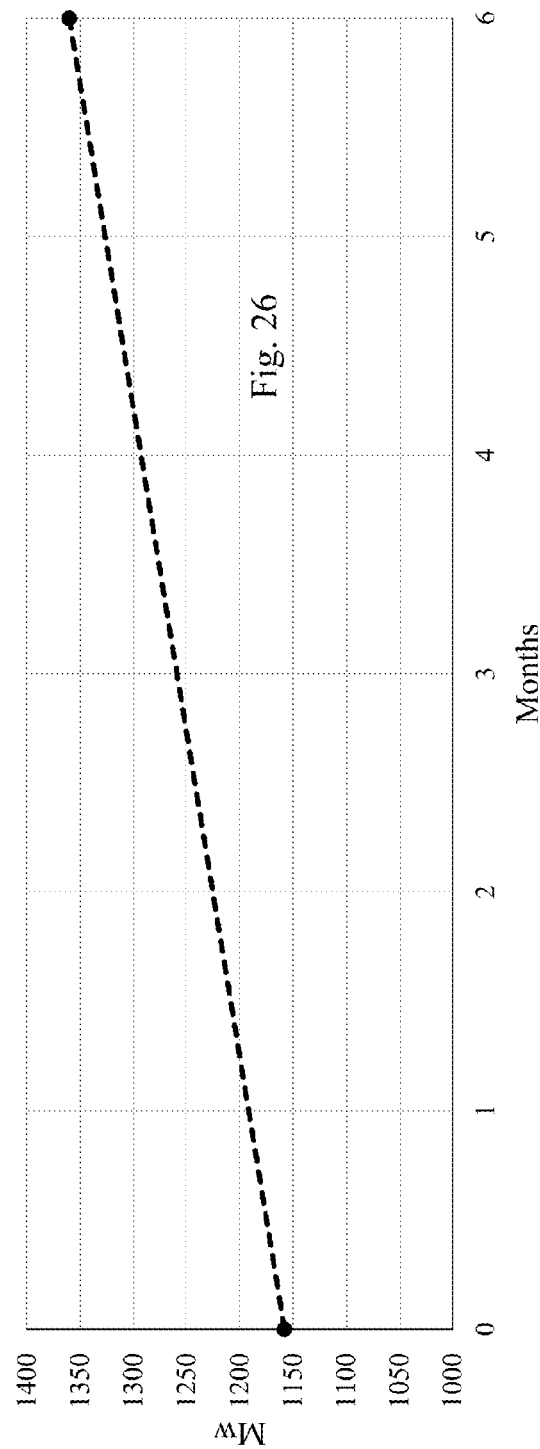
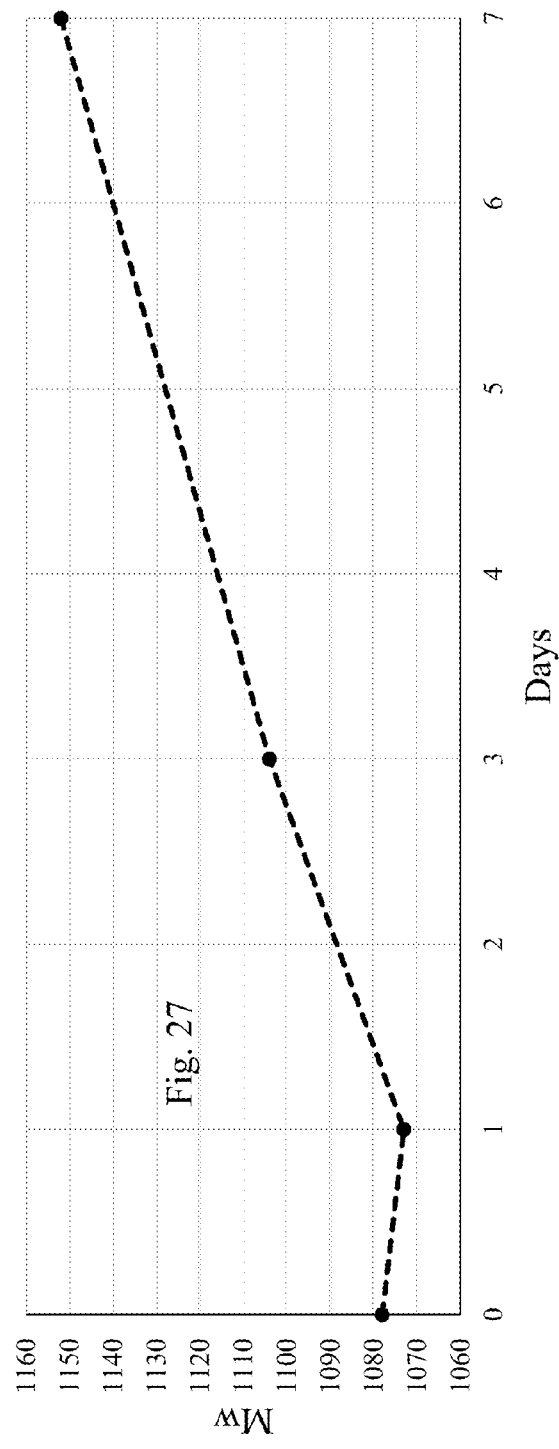

μ = 139 nm
σ = 28 nm

μ = 387 nm
σ = 32 nm

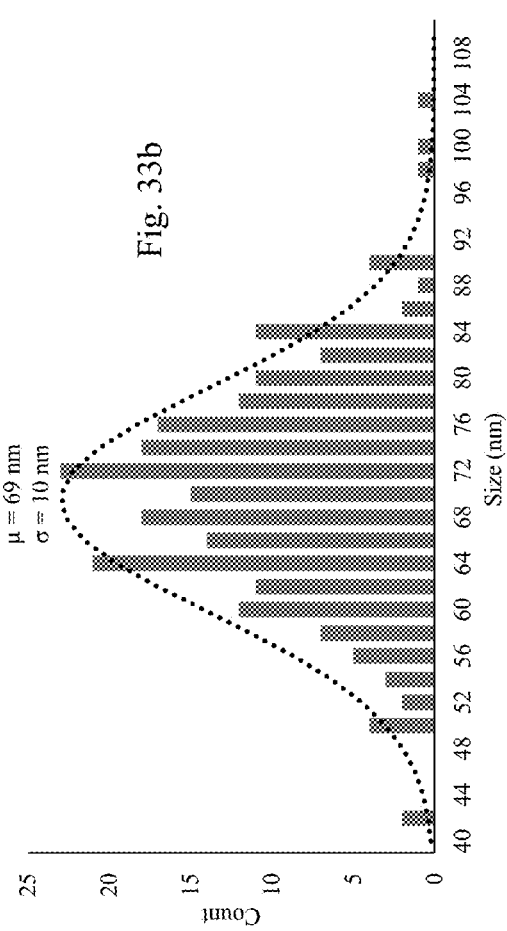
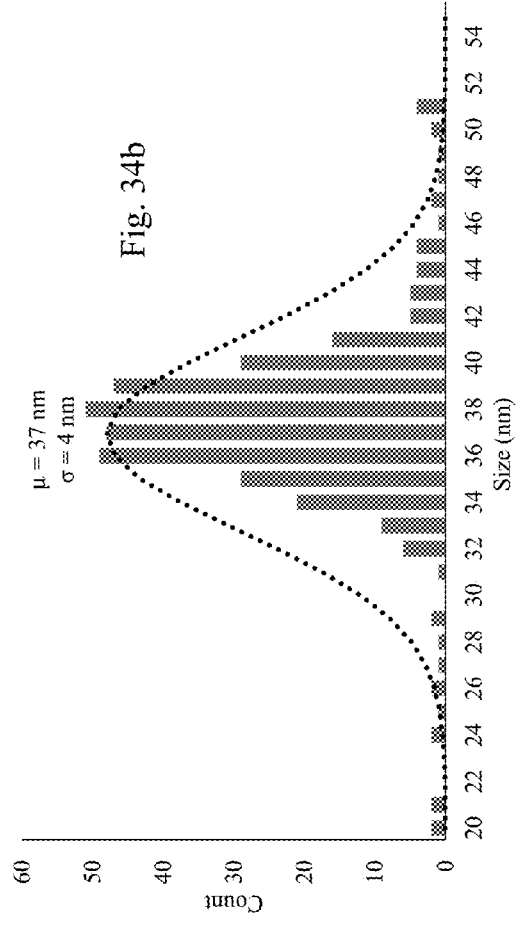
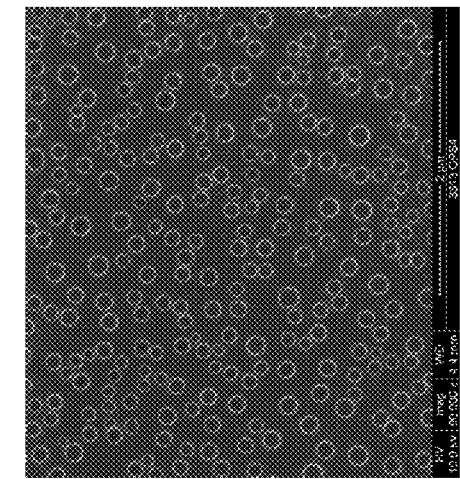
Fig. 33a
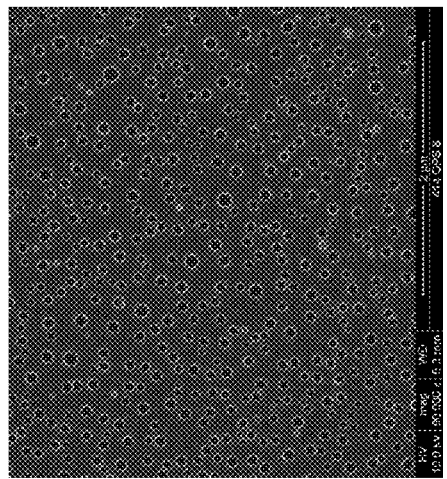
Fig. 34a

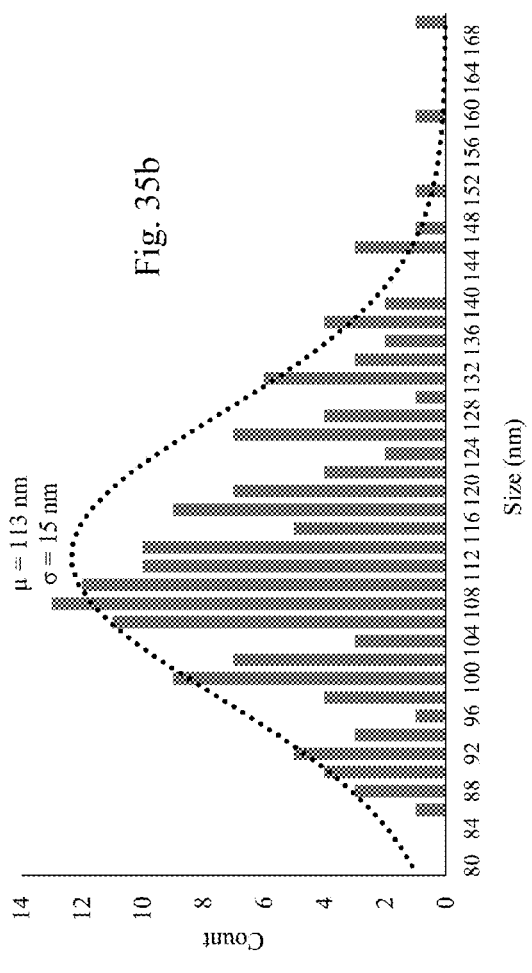
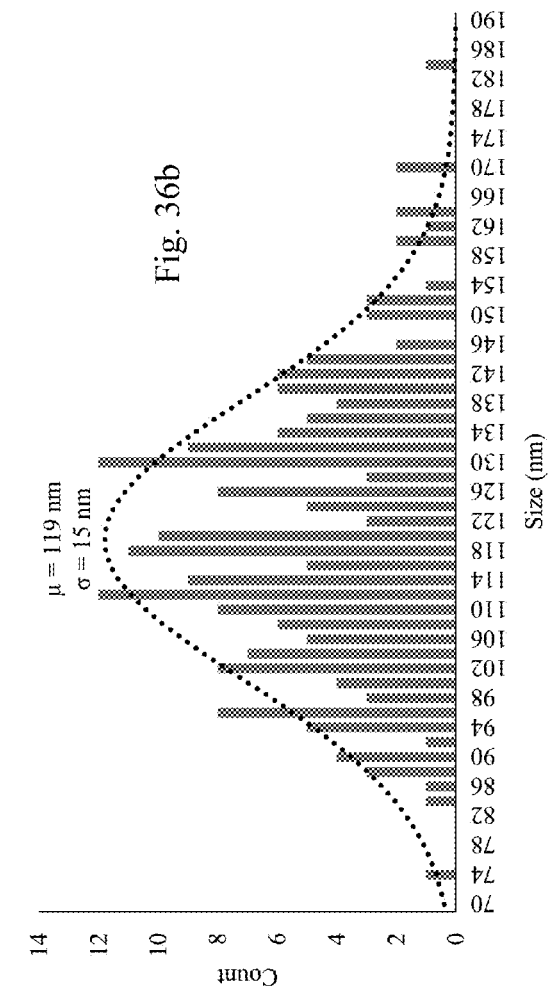
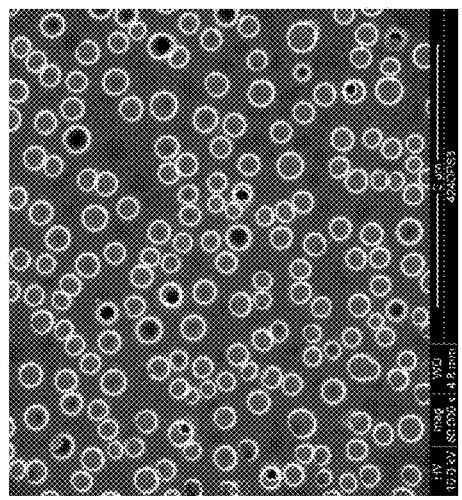
Fig. 35a
Fig. 35b
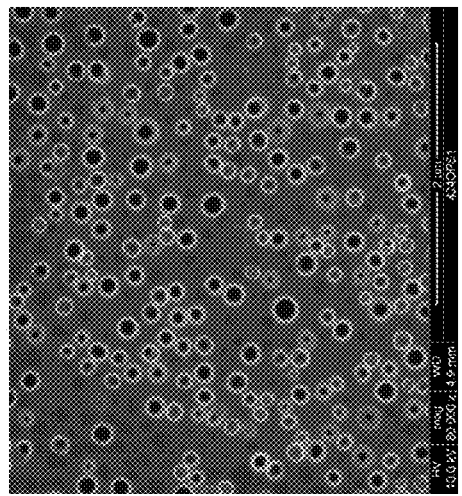
Fig. 36a
Fig. 36b

HIGH GAIN DURABLE ANTI-REFLECTIVE COATING

CROSS-REFERENCE TO RELATED APPLICATIONS

This application is a continuation of the following U.S. patent application, which is incorporated by reference in its entirety: U.S. patent application Ser. No. 14/799,507, filed Jul. 14, 2015, entitled High Gain Durable Anti-Reflective Coating, which is hereby incorporated by reference in its entirety.

U.S. patent application Ser. No. 14/799,507 is a continuation of the following U.S. patent applications, each of which is incorporated by reference in its entirety: U.S. patent application Ser. No. 14/799,479, filed Jul. 14, 2015, entitled High Gain Durable Anti-Reflective Coating, which is hereby incorporated by reference in its entirety.

U.S. patent application Ser. No. 14/799,479 claims the benefit of the following provisional application, which is hereby incorporated by reference in its entirety: U.S. Provisional Appl. 62/024,440, entitled Coating Materials And Methods For Enhanced Reliability, filed Jul. 14, 2014. U.S. patent application Ser. No. 14/799,479 is a continuation-in-part of U.S. patent application Ser. No. 14/491,259, filed Sep. 19, 2014, entitled Optical Enhancing Durable Anti-reflective Coating, which is hereby incorporated by reference in its entirety. U.S. patent application Ser. No. 14/799,479 is a continuation-in-part of U.S. patent application Ser. No. 14/799,223, filed Jul. 14, 2015, entitled Coating Materials And Methods For Enhanced Reliability, which is hereby incorporated by reference in its entirety.

STATEMENT REGARDING GOVERNMENT FUNDING

This invention was made with government support under Contract DE-EE0006810 awarded by the U.S. Department of Energy. The government has certain rights in the invention.

BACKGROUND OF THE INVENTION

Field

The present disclosure relates generally to the field of anti-reflective, anti-glare, barrier coatings applied to glass, metals and plastics in surfaces, windows, windshields, screens, displays, architecture, goggles, eyeglasses, etc., in particular to glass used as the front cover of solar modules, high-transparency glass used for display purposes such as protective covers for works of art, museum display glass, commercial display glass, front glass of electronic screens or instrument panels that need anti-glare properties and automotive glass. Specifically, it relates to soluble high silanol containing silsesquioxane compositions and methods for their preparation for use as thin-film coatings.

Description of Related Art

The interface between air and the surface of typical glass such as soda-lime glass will reflect about 4% of normally incident light. This reflection is caused by the difference in refractive index of the glass, approximately 1.52 and the air approximately 1.0. In order reduce the reflection, the glass maybe coated with an anti-reflective coating that has an intermediate refractive index between about 1.25 and about 1.45.

Several methods exist to create single-layer anti-reflection coatings using sol-gel chemistry. Commonly used methods can be broadly sorted into five groups. The first group: using solid silica nanoparticles have been known for a long time, for example U.S. Pat. No. 2,432,484 filed in 1943 teaches using a solution containing colloidal silica nanoparticles to create an anti-reflective coating on glass. Another more recent example is U.S. Pat. No. 7,128,944 which teaches a porous $SiO_2$ layer created by depositing an aqueous solution containing silica particles that is then sintered at temperatures of at least 600° C. The second group teaches using porogenic materials to increase the porosity of sol-gel derived thin-films. As porosity increases, refractive index is reduced. In general, porogenic materials are high molecular weight organic compounds that create networks of small pores when they are removed by thermal processing at high temperatures. For example, European patent application no. EP1329433 teaches using Polyethyleneglycol tert-octyl phenyl ether (Triton) in high concentrations as a porogen with subsequent thermal sintering that causes combustion of the porogen to increase porosity. A major drawback of this approach is that the small pores created adsorb water, which can greatly diminish the performance of the anti-reflective coating. It has been recognized that one method of mitigating this problem is to create coatings with relatively large pores. While the inner surface of the pore may adsorb water, the main void remains empty. The third group teaches creating large pores using solid or liquid templates around which the film is formed after which high temperature processing burns away the template or a solvent dissolves away the template leaving a void. For example, U.S. patent application Ser. No. 12/514,361 teaches using particulate (quasi)spherical nano-particles composed of polymethyl methacrylate (PMMA) or nano-droplets of an oil as a pore forming agent that templates a large pore and that are removed either by washing with a solvent such as THF at low temperature or are preferably burned away at high temperature. The fourth group is a variant of the third, in that a solid polymer nano-particle is used to template a void. However, in this case, sometimes referred to as core/shell, the nano-particle is coated in a shell of, for example, silica before being embedded in a matrix material. High temperature is again used to burn out the nano-particle polymer core or template to leave a void behind. For example, U.S. patent application Ser. No. 12/438,596 teaches coating a substrate using hollow particles in a binder and then curing to create an anti-reflective coating. The last group is again a variant of the template method, however in this case hollow silica particles are formed that already have an internal void, that are then embedded in a matrix to form a porous coating. For example, PCT patent application no. PCT/JP2013/001114 teaches a method of producing hollow particles with little or no aggregation and then producing an anti-reflection coating using those particles.

Many commercially available anti-reflective coating materials for the glass and photovoltaic solar module industries utilize these or similar methods. Notwithstanding that some art teaches using a solvent to remove pore-forming agents at low temperatures, this is not generally a practical method at industrial scale as it is slow and requires large quantities of organic solvents. It is therefore common in industrial scale applications of these coating technologies to use a high temperature sintering or curing step at between 400° C. and 750° C. As this processing step is also commonly used as a tempering step to mechanically strengthen the glass, both processes are accomplished at the same time.

Anti-reflective coatings that are cured during the glass tempering process or by other similar high temperature processing share a number of common features. First, they are hydrophilic or super-hydrophilic with water contact angles as measured by a goniometer of less than 60° and less than 20° respectively. The high temperature oxidizes all organic components of the coating, leaving behind almost pure silica. Second, they are frequently quite brittle. Their mechanical strength is derived to some extent by sintering of the coating, too much sintering reduces the coating's porosity and, hence, optical performance. Therefore, a balance must be achieved between optical and mechanical performance that frequently leaves the mechanical performance at less than ideal. In general, these brittle hydrophilic coatings are prone to degradation caused by soiling and abrasion when subject to long-term exposure to many outdoor environments.

It would be desirable to make coatings with large pores and high optical performance and abrasion resistance at a practical, low temperature process at industrial scale that does not require solvent removal and yet still imparts good mechanical properties while preserving organic elements and properties in the coating such as hydrophobicity or oleophobicity.

SUMMARY OF THE INVENTION

An object of this disclosure is to provide a coating composition wherein the cured film has high light transparency, low light reflection, good mechanical properties, and sufficient weather resistance and durability to withstand prolonged outdoor exposure. Another object is to provide an article coated with said composition.

Aspects of the disclosure provide a method for synthesizing a siloxane polymer with a composition having the following formula, the composition having the following a formula, and coatings made from dried gels of the following formula: $[RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y$ $[Si(OH)_3O_{0.5}]_z$ where R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof; R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0≤m,n,p<0.9$, and $a+b+c+m+n+p+w+x+y+z=1$.

In some embodiments the siloxane polymer is formed from acid hydrolyzed alkoxysilanes, organosilanes and optionally organofluorosilanes, wherein the organosilane and the organofluorosilanes are each separately prepared by hydrolyzing in the presence of a hydrolysis acid catalyst and a solvent, such as a polar organic solvent, in a first step before combining with an alkoxysilane in a second step.

In some embodiments, the siloxane polymer A is formed from acid hydrolyzed alkoxysilanes, organosilane, and organofluorosilane, wherein the hydrolyzed organosilane and the hydrolyzed organofluorosilane are each separately prepared before combining with each other and with alkoxysilane or with another reagent.

In an embodiment, the siloxane polymer is formed by hydrolyzing at least one organotrialkoxysilane or tetraalkoxysilane in the presence of acid catalyst in a polar solvent followed by reacting the resulting highly branched high silanol containing siloxane polymer with tetraalkoxysilane or organotrialkoxysilane.

The siloxane polymer may have a relative weight percent ratio of tetraalkoxysilane to a total of organosilane and organofluorosilane of about 0.2 to about 2.

The alkoxysilane may be selected from a group consisting of tetramethoxysilane and tetraethoxysilane.

The organosilane may be selected from a group consisting of trimethoxysilane, triethoxysilane, methyltrimethoxysilane, methyltriethoxysilane, n-propyltrimethoxysilane, n-propyltriethoxysilane, iso-propyltrimethoxysilane, iso-propyltriethoxysilane, n-butyltrimethoxysilane, n-butyltriethoxysilane, iso-butyltrimethoxysilane, iso-butyltriethoxysilane, 3,3-dimethylbutyltrimethoxysilane, 3,3-dimethylbutyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, n-decyltrimethoxysilane, n-decyltriethoxysilane, dodecyltrimethoxysilane, dodecyltriethoxysilane, cyclopentyltrimethoxysilane, cyclopentyltriethoxysilane, cyclohexyltrimethoxysilane, cyclohexyltriethoxysilane, phenyltrimethoxysilane, phenyltriethoxysilane, vinyltrimethoxysilane, vinyltriethoxysilane, allyltrimethoxysilane, allyltriethoxysilane, acetoxymethyltrimethoxysilane, acetoxymethyltriethoxysilane, acetoxyethyltrimethoxysilane, acetoxyethyltriethoxysilane, (3-acetoxypropyl)trimethoxysilane, (3-acetoxypropyl)triethoxysilane, acryloxymethyltrimethoxysilane, acryloxymethyltriethoxysilane, (3-acryloxypropyl)trimethoxysilane, (3-acryloxypropyl)triethoxysilane, methacryloxymethyltrimethoxysilane, methacryloxymethyltriethoxysilane, (3-methacryloxypropyl)trimethoxysilane, (3-methacryloxypropyl)triethoxysilane, (3-glycidylpropyl)trimethoxysilane, (3-glycidylpropyl)triethoxysilane.

The organofluorosilane may be selected from a group consisting of (3,3,3-trifluoropropyl)trimethoxysilane, (3,3,3-trifluoropropyl)triethoxysilane, dodecyafluorodec-9-ene-1-yltrimethoxysilane, dodecyafluorodec-9-ene-1-yltriethoxysilane, (heptadecafluoro-1,1,2,2-tetrahydrodecyl)trimethoxysilane, (heptadecafluoro-1,1,2,2-tetrahydrodecyl)triethoxysilane, 3-(heptafluoroisopropoxy)propyltrimethoxysilane, 3-(heptafluoroisopropoxy)propyltriethoxysilane, hexadecafluorododec-11-en-1-yltrimethoxysilane, hexadecafluorododec-11-en-1-yltriethoxysilane, nonafluorohexyltrimethoxysilane, nonafluorohexyltriethoxysilane, pentafluorophenoxyundecyltrimethoxysilane, pentafluorophenoxyundecyltriethoxysilane, pentafluorophenyltrimethoxysilane, pentafluorophenyltriethoxysilane, (tridecafluoro-1,1,2,2-tetrahydrooctyl)trimethoxysilane, (tridecafluoro-1,1,2,2-tetrahydrooctyl)triethoxysilane, perfluorooctylphenyltrimethoxysilane, perfluorooctylphenyltriethoxysilne, heptadecafluorodecyltrimethoxysilane, heptadecafluorodecyltriethoxysilane, (1H,1H,2H,2H-tridecafluoro-n-octyl)trimethoxysilane, (1H,1H,2H,2H-tridecafluoro-n-octyl)triethoxysilane, (1H,1H,2H,2H-nonafluorohexyl)trimethoxysilane, (1H,1H,2H,2H-nonafluorohexyl)

triethoxysilane, 3-(pentafluorophenyl)propyltrimethoxysilane, 3-(pentafluorophenyl)propyltriethoxysilane.

In an aspect, the alkoxysilane may be tetramethoxysilane, the organosilane may be methyltrimethoxysilane, and the organofluorosilane may be trifluoropropyltrimethoxysilane.

In an aspect, the alkoxysilane may be tetraethoxysilane, the organosilane may be methyltrimethoxysilane, and the organofluorosilane may be trifluoropropyltrimethoxysilane.

In an aspect, the alkoxysilane may be tetramethoxysilane, the organosilane may be methyltrimethoxysilane, and the organofluorosilane may be (tridecafluoro-1,1,2,2-tetrahydrooctyl)trimethoxysilane.

In an aspect, the alkoxysilane may be tetraethoxysilane, the organosilane may be methyltrimethoxysilane, and the organofluorosilane may be (tridecafluoro-1,1,2,2-tetrahydrooctyl)trimethoxysilane.

The siloxane polymer may be 0.1% to 10% by weight of the total coating composition. The siloxane polymer may have a weight average molecular weight (Mw) of 600 to 10,000 Daltons. The siloxane polymer may include 10 to 60 mol % Si—OH groups as established by Si-NMR.

The hydrolysis acid catalyst may be selected from a group consisting of hydrochloric acid, nitric acid, sulfuric acid, phosphoric acid, methanesulfonic acid or acetic acid in amount of 0.01% to 1.0% by weight of the total coating composition.

The solvent may include water and at least one other organic solvent selected from a group consisting of alcohols, esters, ethers, aldehydes, and ketones such as methanol, ethanol, 1-propanol, 2-propanol, 1-butanol, ethylene glycol, propylene glycol, ethyl acetate, ethylene glycol, foramide, dimethylformamide, N-methylpyrrolidinone, propylene glycol methyl ether, 1-methoxy-2-propanol, propylene glycol, propylene glycol methyletheracetate, acetone, cyclohexanone, methylethylkeone, N,N-dimethyl acetamide, dimethylether, diethylether, 2-butanol, 2-butanone, tetrahydrofurane, 1,2-diethoxyethane, diethyleneglycol, triethyleneglycol, 1,2 dimethoxymethane dipropylene glycol monomethyl ether acetate, propylene glycol, diamyl ether, diethyl oxalate, lactic acid butyl ester, dibutyl ether, 1-pentanol, dimethoxy ethane, 1-hexanol, 1-heptanol, ethylene glycol, gamma-butyrolactone, triethylene glycol and methyl t-butyl ether, wherein the amount of solvent is from about 50% to about 99.5% by weight of the total coating composition.

In embodiments the ratio of organic solvent to water is between about 1 to about 50 or between about 5 to about 10.

In some embodiments, additives such as high-boiling-point porogens, nano-fillers, adhesion promoters, base condensation catalysts (also known as Si—OH condensation catalysts), thermal radical initiators, photo radical initiators, cross-linkers and surfactants and others may be used in the coating composition.

The high-boiling-point porogen or template may be selected from the group consisting of ethylene oxide, propylene oxide, polyethylene oxides, polypropylene oxides, ethylene oxide/propylene oxide block co-polymers, polyoxyethylated polyoxypropylated glycols, fatty acid ethoxylates, ethylene glycol esters, glycerol esters, mono-di-glycerides, glycerylesters, polyethylene glycolesters, polyglycerol esters, polyglyceryl esters, polyol monoesters, polypropylene glycol esters, polyoxyalkylene glycol esters, polyoxyalkylene propylene glycol esters, polyoxyalkylene polyol esters, polyoxyalkylene glyceride esters, polyoxyalkylene fatty acid, sorbitan esters, sorbitan fatty acid esters, sorbitan esters, polyoxyalkylene sorbitan esters, polyoxyethylene sorbitan monolaurate, polyoxyethylene sorbitan monostearate, polyoxyethylene sorbitan tristearate, and sorbitan ester ethoxylates such as TWEEN 80, TWEEN 20, PEG 600, PEG 400, PEG 300, or PEG-b-PPG-b-PEG in an amount of 0.0% to 5% by weight of total coating composition.

The nano-filler may be selected from the group consisting of colloidal silica, hollow silica nano-spheres, polymer beads, polylactic acid, polyvinylpyrrolidone, polymethylmethactrylates and polyacrylates, carbon nanotubes, or Buckminsterfullerene $C_{60}$-$C_{70}$ in an amount of 0.0% to 5.0% by weight of the total coating composition.

The adhesion promoter may be selected from the group consisting of (meth)acryloxypropyl trimethoxysilane, (meth)acryloxypropyl triethoxysilane, (meth)acryloxypropyl dimethylmethoxysilane, (meth)acryloxypropyl methyldimethoxysilane, 3-glycidylpropyl trimethoxysilane, 3-glycidylpropyl triethoxysilane, 3-glycidylpropyl dimethylmethoxysilane, or 3-glycidylpropyl methyldimethoxysilane in an amount of 0.0% to 5.0% by weight of the total coating composition.

The base condensation catalyst may be selected from the group consisting of alkali metal hydroxide, amide, amines, imidazolines, potassium hydroxide (KOH), sodium hydroxide (NaOH), cesium hydroxide (CsOH), ammonium hydroxide ($NH_4OH$), tetramethyl ammonium hydroxide (TMAH), formamide (FA), triethyl amine, trimethyl amine, dimethylformamide (DMF), N-methylpyrrolidinone (NMP), N,N-dimethyl acetamide (DMA), thermal base generator (TBG) or tetramethoxymethyl glycoluril (PowderLink 1174) in an amount of 0.0% to 1.0% by weight of the total coating composition.

The thermal radical initiators may be selected from the group consisting of azo compounds and peroxides such as 4,4'-Azobis(4-cyanovaleric acid), 4,4'-Azobis(4-cyanovaleric acid) >75%,1,1'-Azobis(cyclohexanecarbonitrile) 98%, Azobisisobutyronitrile, 2,2'-Azobis(2-methylpropionamidine) dihydrochloride, 2,2'-Azobis(2-methylpropionitrile), 2,2'-Azobis(2-methylpropionitrile), tert-Butyl hydroperoxide, tert-Butyl peracetate, cumene hydroperoxide, 2,5-Di(tert-butylperoxy)-2,5-dimethyl-3-hexyne, 2,5-Di(tert-butylperoxy)-2,5-dimethyl-3-hexyne, Dicumyl peroxide, 2,5-Bis(tert-butylperoxy)-2,5-dimethylhexane, 2,4-Pentanedione peroxide, 1,1-Bis(tert-butylperoxy)-3,3,5-trimethylcyclohexane, 1,1-Bis(tert-butylperoxy)cyclohexane, 1,1-Bis(tert-amylperoxy)cyclohexane, Benzoyl peroxide, 2-Butanone peroxide, tert-Butyl peroxide, Lauroyl peroxide, tert-Butyl peroxybenzoate, tert-Butylperoxy 2-ethylhexyl carbonate, tert-Butyl hydroperoxide, in an amount of 0.0% to 5.0% by weight of the total coating composition.

The photo radical initiators may be selected from the group consisting of Acetophenone, Anisoin, Anthraquinone, Anthraquinone-2-sulfonic acid, sodium salt monohydrate, (Benzene) tricarbonylchromium, Benzil, Benzoin, Benzoin ethyl ether, Benzoin isobutyl ether, Benzoin methyl ether, Benzophenone, Benzophenone/1-Hydroxycyclohexyl phenyl ketone, 3,3',4,4'-Benzophenonetetracarboxylic dianhydride, 4-Benzoylbiphenyl, 2-B enzyl-2-(dimethylamino)-4'-morpholinobutyrophenone, 4,4'-Bis(diethylamino) benzophenone, 4,4'-Bi s(dimethylamino)benzophenone, Camphorquinone, 2-Chlorothioxanthen-9-one, (Cumene) cyclopentadienyliron(II) hexafluorophosphate, Dibenzosuberenone, 2,2-Diethoxyacetophenone, 4,4'-Dihydroxybenzophenone, 2,2-Dimethoxy-2-phenylacetophenone, 4-(Dimethylamino)benzophenone, 4,4'-Dimethylbenzil, 2,5-Dimethylbenzophenone, 3,4-Dimethylbenzophenone, Diphenyl(2,4,6-trimethylbenzoyl)phosphine oxide/2-Hydroxy-2-methylpropiophenone, 4'-Ethoxyacetophenone, 2-Ethylanthraquinone, Ferrocene, 3 3'-Hydroxyacetophenone, 4'-Hydroxyacetophenone, 3-Hydroxybenzophenone, 4-Hydroxybenzophenone, 1-Hydroxycyclohexyl phenyl ketone, 2-Hydroxy-2-methylpropiophenone, 2-Methylbenzophenone, 3-Methylbenzophenone, Methybenzoylformate, 2-Methyl-4'-(methylthio)-2-morpholinopropiophenone, Phenanthrenequinone, 4'-Phenoxyacetophenone, Thioxanthen-9-one, Triarylsulfonium hexafluoroantimonate salts, Triarylsulfonium hexafluorophosphate salts, in an amount of 0.0% to 5.0% by weight of the total coating composition.

The cross-linker may be selected from the group consisting of glycerol, glyoxal, methylglyoxal, dulcitol, 1,5-pentanediol, 1,3-propanediol, 1,2,4-butanetriol, 1,4-butanediol, 1,1-bis(trichlorosilylmethyl)ethylene, 1,10-bis(trichlorosilyl)decane, 1,10-bis(triethoxysilyl)decane, 1,12-bis(methyldichlorosilyl)ethane, 1,2-bis(methyldiethoxysilyl)ethane, 1,2-bis(methyldiethoxysilyl)ethylene, 1,2-bis(methyldimethoxysilyl)ethane, 1,2-bis(methyldimethoxysilyl)ethylene, 1,2-bis(trichlorosilyl)decane, 1,2-bis(trichlorosilyl)ethane, 1,2-bis(triethoxysilyl)ethane, 1,2-bis(triethoxysilyl)ethylene, 1,4-bis(trimethoxysilyl)benzene, 1,4-bis(triethoxysilyl)benzene,1,4-bis(trichlorosilyl)benzene, 1,4-bis(triethoxysilylethyl)benzene, 1,4-bis(trichlorosilylethyl)benzene, 1,4-bis(trimethoxysilylmethyl)benzene, 1,4-bis(triethoxysilylmethyl)benzene, 1,4-bis(trichlorosilylmethyl)benzene, 1,4-bis(trimethoxysilylpropyl)benzene, 1,4-bis(triethoxysilylpropyl)benzene, 1,4-bis(trichlorosilylpropyl)benzene in an amount of 0.0% to 5.0% by weight of the total coating composition.

The surfactant may be selected from the group consisting of nonionic surfactants, polyoxyethylene glycol alkyl ethers (Brij 58), polyoxyethylene octyl phenyl ether, polyoxyethylene glycol sorbitan alkyl esters (polysorbate), ionic surfactants, cetyltrimethylammonium bromide and other tetraalkylammonium halides in an amount of 0.0% to 5.0% by weight of the total coating composition.

In some embodiments other heteroatom containing additive(s) such as boron or aluminum selected from a group consisting of $B(OH)_3$, $BI_3$, $B(OCH_3)_3$, $B(OC_2H_5)_3$, $BCl_3$, Al $(acac)_3$ or $AlCl_3$ may be added during synthesis of the siloxane polymer or during final formulation in an amount of 0% to 1.0% by weight of the total coating composition.

In an aspect, a siloxane polymer solution composition may include (i) a siloxane polymer A formed from acid hydrolyzed alkoxysilanes, organosilane, and organofluorosilane, wherein the siloxane polymer A has the following formula: $[RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y [Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group , a fluorine substituted glycidylether group, or a combination thereof, $0<a,b,c,w,x,y,z<0.9$, $0\leq m,n,p<0.9$, and $a+b+c+m+n+p+w+x+y+z=1$, (ii) a hydrolysis acid catalyst, (iii) a polar organic solvent, and (iv) at least one additive selected from the group consisting of: a thermal radical initiator, a photo radical initiator and a crosslinker. In some embodiments, the hydrolyzed organosilane and the hydrolyzed organofluorosilane are each separately prepared before combining with each other and with alkoxysilane or with another reagent. Some embodiments may also include one or more of a porogen, a template, a nano-filler, an adhesion promoter, a Si—OH condensation catalyst and a surfactant.

The siloxane polymer solution may be prepared in a two-step process including preparing hydrolyzed organosilane before combining with an alkoxysilane, or preparing hydrolyzed alkoxysilane before combining with organosilane and fluorosilane, or preparing the hydrolyzed alkoxysilane before combining with organosilane.

In an aspect, a method of forming a coating on a substrate, such as a glass or other substrate, may include preparing a siloxane polymer solution composition including: a siloxane polymer A formed from acid hydrolyzed alkoxysilanes, organosilane, and organofluorosilane, wherein the siloxane polymer A has the following formula: $[RSi(OH)_2O_{0.5}]_a$ $[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y$ $[Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group , a fluorine substituted glycidylether group, or a combination thereof, $0<a,b,c,w,x,y,z<0.9$, $0\leq m,n,p<0.9$, and $a+b+c+m+n+p+w+x+y+z=1$, a hydrolysis acid catalyst, a polar organic solvent, and at least one additive selected from the group consisting of: a porogen or template, a thermal radical initiator, a photo radical initiator and a crosslinker. The method also includes coating the substrate with the siloxane polymer solution, and curing the coating to form a thin film. Some embodiments of the coating may also include one or more of a porogen, a template, a nano-filler, an adhesion promoter, a Si—OH condensation catalyst and a surfactant. A coated glass substrate may be formed by the method. In some embodiments, the hydrolyzed organosilane and the hydrolyzed organofluorosilane are each separately prepared before combining with each other and with alkoxysilane or with another reagent. The substrate may be coated by solution coating, by roller coating or by another method.

The coating composition of the present invention may be applied to a substrate by first ensuring the surface is clean and activated such that it exhibits a high surface energy, for example exhibiting a water contact angle of less than 60°.

Then by applying the coating composition to the surface by dip-coating, flow-coating, spray-coating, roll-coating, slot-die coating and the like and thereafter allowed it to dry to form a dried gel coating on the surface. The coating is then cured by heating to about 120° C. to about 800° C. The coating may be thermally cured at about 120° C. to about 800° C. The coating may be thermally cured at less than about 350° C.

After curing the coating may have a thickness of about 100 nm to about 500 nm or between about 60 nm and 150 nm. In aspects, the coating has a thickness of about 80 nm to about 500 nm after curing, or 80 nm to about 160 nm after curing.

In an aspect, a coating may include a dried gel prepared from: a siloxane polymer A formed from acid hydrolyzed alkoxysilanes, organosilane, and organofluorosilane, wherein the siloxane polymer A has the following formula: $[RSi(OH)_2O_{0.5}]_a[RSiO_{1.5}]_b[RSi(OH)O]_c[R'Si(OH)_2O_{0.5}]_m$ $[R'SiO_{1.5}]_n[R'Si(OH)O]_p[SiO_2]_w[Si(OH)O_{1.5}]_x[Si(OH)_2O]_y$ $[Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth) acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group , a fluorine substituted glycidylether group, or a combination thereof, $0<a,b,c,w,x,y,z<0.9$, $0 \leq m,n,p<0.9$, and $a+b+c+m+n+p+w+x+y+z=1$, a hydrolysis acid catalyst, a polar organic solvent, and at least one additive selected from the group consisting of: a thermal radical initiator, a photo radical initiator and a crosslinker. In some embodiments, the coating may also include one or more of a porogen, a template, a nano-filler, an adhesion promoter, a Si—OH condensation catalyst and a surfactant. In some embodiments, the hydrolyzed organosilane and the hydrolyzed organofluorosilane are each separately prepared before combining with each other and with alkoxysilane or with another reagent, In an embodiment wherein the coating is applied to a soda-lime glass substrate the absolute reflection from the surface may exhibit a reduction in reflection of about 1.0% to about 3.5% as compared to an uncoated surface. In some embodiments the coating exhibits excellent abrasion resistance and adhesion to glass, for example the ability to pass abrasion testing to standard EN1096-2 with an absolute change in reflection of no more than 0.5% as measured after 1,000 abrasion strokes or even after 2,000 abrasion strokes. In an embodiment wherein the coating is applied to a solar module, the coating may improve the peak power output of the solar module by about 1.0% to about 3.5% relative to an uncoated solar module.

In embodiments, the coated substrate may be a window or architectural glass, or an LED or a semi-conductor or an exposed photovoltaic element or a lens or a diffuser or a mirror or a windshield or automotive glass or a screen or a display or goggles or eyeglasses or sunglasses or greenhouse glass or a hybrid solar surface or a marine glass or aviation glass or glass used in transportation or a mobile device screen. In some embodiments, the substrate may be a semiconductor and the coating may be used as a planarization, dielectric or gap-filling layer.

In an aspect, a single layer transparent coating may include an anti-reflective property and a hydrophobic property that is highly abrasion resistant and, wherein the single layer transparent coating contains a plurality of oblate voids and, wherein at least 1% of the oblate voids are open to a surface of the single layer transparent coating. The thickness of the single layer transparent coating may be between 10 nm and 5 um. A refractive index of the single layer transparent coating may be less than 1.45. An average reflection of visible light from a surface of glass coated with the single layer transparent coating may be less than 3%. A $T_4$ of a coated glass substrate is at least 1% greater than a $T_{AM}$ of a same type of uncoated glass substrate. A water contact angle in a test for the hydrophobic property may be greater than 70° . A reduction in optical transmission of the single layer transparent coating as measured by $T_{AM}$ after performance of 1000 strokes of abrasion testing according to the procedure in standard EN1096.2 may be less than 1.0%. A distribution of a void diameter of the oblate voids may include a Gaussian distribution with a mean of between 10 nm and 150 nm with a standard deviation between 2 nm and 40 nm. A distribution of void diameter of the oblate voids may be bi-modal with a first group having a Gaussian distribution with a mean between 25 nm and 150 nm and a standard deviation between 5 nm and 40 nm and a second group having a Gaussian distribution with a mean between 150 nm and 500 nm and a standard deviation between 25 nm and 50 nm. At least 1% of the oblate voids may extend through a full thickness of the single layer transparent coating. All of the oblate voids may be contained within a full thickness of the single layer transparent coating. The surface of the single layer transparent coating may have a percentage of visible voids between 1% and 50%. A porosity of the single layer transparent coating may be between 50% and 2%. The major axis of the oblate voids in the single layer transparent coating may be between 5 nm and 500 nm and the minor axis of the oblate voids is between 3 nm and 150 nm. The flattening of the oblate voids may be between 0.0 to 0.8. The single layer transparent coating may be cured at a temperature of less than 400° C. The coating may further include a glass substrate having a surface on which said coating is applied. The coating may further include a solar module having a surface on which said coating is applied.

BRIEF DESCRIPTION OF THE DRAWINGS

The disclosure and the following detailed description of certain embodiments thereof may be understood by reference to the following figures:

FIG. 7a-2 shows the spread of the molecular weights for sols made from Example 2;

FIG. 7b-1 is a GPC of sol made from Example 3;

FIG. 7b-2 shows the spread of the molecular weights for sols made from Example 3;

FIG. 7c-1 is a GPC of sol made from Example 4;

FIG. 7c-2 shows the spread of the molecular weights for sols made from Example 4;

FIG. 7d-1 is a GPC of sol made from Example 5;

FIG. 7d-2 shows the spread of the molecular weights for sols made from Example 5;

FIG. 7e-1 is a GPC of sol made from Example 6;

FIG. 7e-2 shows the spread of the molecular weights for sols made from Example 6;

FIG. 7f-1 is a GPC of sol made from Example 7;

FIG. 7f-2 shows the spread of the molecular weights for sols made from Example 7;

FIG. 7g-1 is a GPC of sol made from Example 8;

FIG. 7g-2 shows the spread of the molecular weights for sols made from Example 8;

FIG. 7h-1 is a GPC of sol made from Example 9;

FIG. 7h-2 shows the spread of the molecular weights for sols made from Example 9;

FIG. 7k-1 is a GPC of sol made from Example 10;

FIG. 7k-2 show the spread of the molecular weights for sols made from Example 10;

FIGS. 20d and 20e depict examples of FT-IR analysis of representative samples of coating material before and after the curing process;

FIG. 26 is a graph depicting the GPC-based shelf life of sol from Example 8 at 20° C.;

FIG. 27 is a graph depicting the GPC-based shelf life of sol from Example 8 at 40° C.;

FIG. 30b is a histogram of void diameter derived from the image in FIG. 30a;

FIGS. 31a-36a depicts top-down SEM micrographs of roll-coated and cured samples;

FIGS. 31b-36b are histograms of void diameter derived from the images in FIG. 31a-36a showing various distributions of void size;

DETAILED DESCRIPTION

Figure 1A:
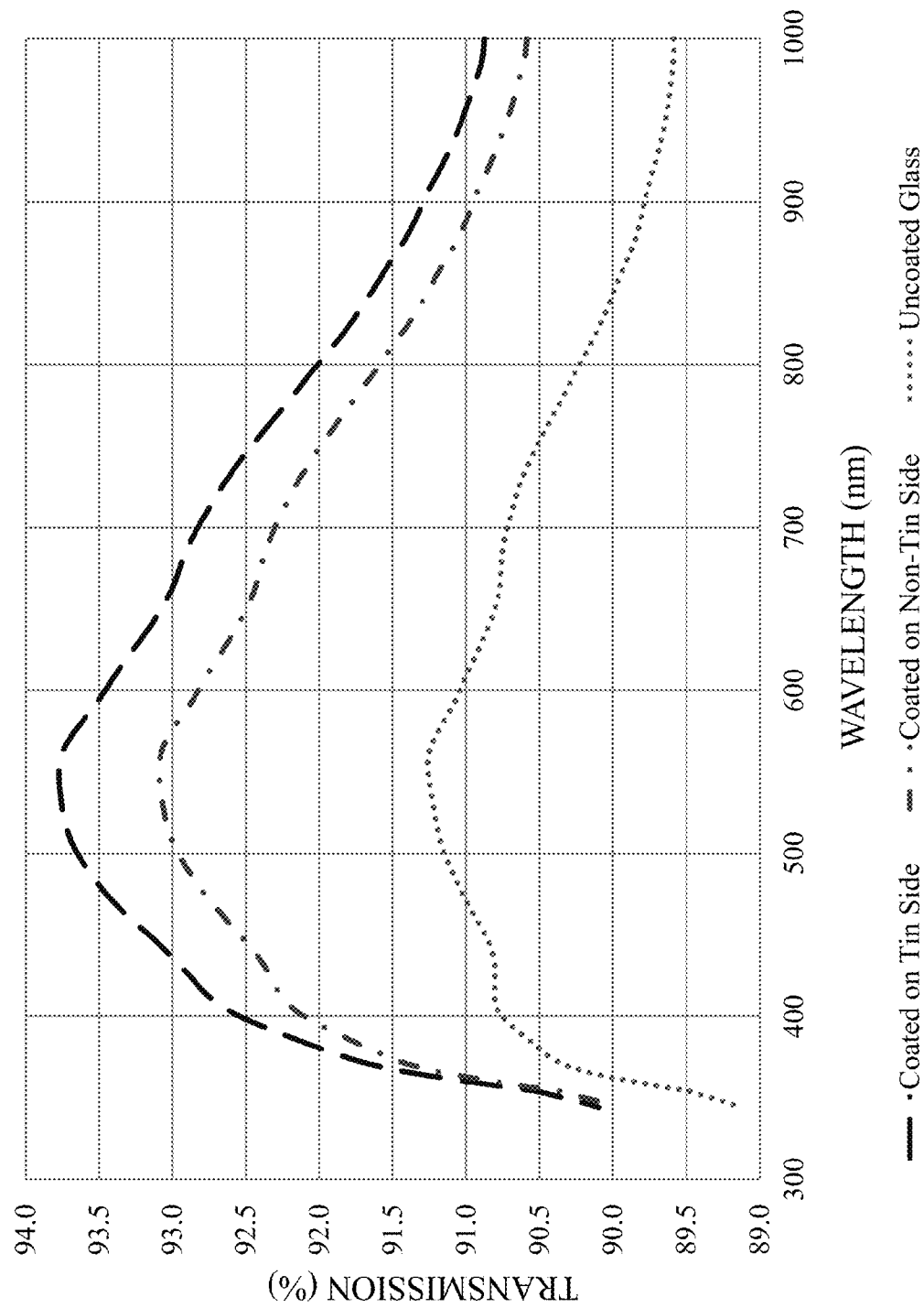
FIG. 1a illustrates the UV-vis transmittance spectra comparing the transmission gains of a coating made from the composition given in Example 2 on tin vs the non-tin side of float glass on a 30×30 cm substrate.

Various embodiments of the disclosure are described below in conjunction with the Figures; however, this description should not be viewed as limiting the scope of the present disclosure. Rather, it should be considered as exemplary of various embodiments that fall within the scope of the present disclosure as defined by the claims. Further, it should also be appreciated that references to "the disclosure" or "the present disclosure" should not be construed as meaning that the description is directed to only one embodiment or that every embodiment must contain a given feature described in connection with a particular embodiment or described in connection with the use of such phrases. In fact, various embodiments with common and differing features are described herein.

The present disclosure is generally directed to coatings that provide a noticeable improvement in anti-reflective properties. It is the combination of the improved anti-reflective properties with the anti-soiling properties, self-cleaning properties and manufacturing flexibility as well as other benefits that further enhances the utility of the coating. Accordingly, the coatings of the present disclosure may be used on substrates, such as transparent substrates, to increase the light transmittance through the substrates. In particular, the coatings may be used on transparent substrates such as glass or the front cover glass of solar modules.

Throughout this disclosure, solar modules are used as the exemplary embodiment, but it should be understood that any optical element may be utilized with the system and methods described herein, such as windows, architectural glass, LEDs, semi-conductors, exposed photovoltaic elements, lenses, diffusers, mirrors, windshields, automotive glass, screens/displays, goggles, eyeglasses, sunglasses, greenhouse glass, hybrid solar surfaces, marine glass, aviation glass, glass used in transportation, mobile device screen, and the like.

The present disclosure is particularly well suited for use with glass used in solar energy generation ("solar glass"). It should be understood that solar energy generation includes solar photovoltaic and solar thermal, wherein solar insolation is used to produce heat either as an end-point or as an intermediate step to generate electricity. Furthermore it should be understood that solar glass may be used in any application where maximal transmission of solar energy through the glass is desired such as for example in greenhouses or building environments where warm temperatures are desired. Typically solar glass is high transmission low iron glass. It may be either float glass, that is, flat glass sheets formed on a molten tin bath or patterned glass wherein the flat glass is formed by the action of rollers. Float glass is often characterized by the presence of tin contamination on the bottom ("tin side") of the glass. Patterned glass is typically textured on one side to improve its performance in solar modules. It may also be formed into tubes such as those used as receivers in solar thermal energy generation or in some non-planar forms of solar photovoltaic generation. Embodiments of the present disclosure may also be applied to glass surfaces used as mirrors in solar energy generation such as parabolic trough systems or in heliostats. It may also be used to coat various glass lenses such as Fresnel lenses used in solar thermal generation.

Additionally, solar glass may have various coatings applied. For example a common coating is a transparent conductive oxide (TCO) such as fluorine doped tin oxide (FTO) or indium tin oxide (ITO) on one side of the glass. This coating is used to provide the front electrode for many thin film solar module technologies. Other coatings may be present such as coatings to seal in alkali ions such as Na+ and Ca++ that are used in the manufacturer of the glass but that cause long term reliability problems when leached out by water. Other techniques to solve this problem are to deplete these ions in thin layers of the glass surface. Solar glass may also be coated with a reflective surface to form a mirror. Solar glass may be tempered, annealed or un-tempered. Tempered glass is significantly stronger and solar modules manufactured using it typically only use one sheet of glass. If very thin tempered glass is used, then a second thin sheet of glass may be used as a back sheet for the solar module. Solar modules manufactured with un-tempered front glass typically use a back sheet of tempered glass to meet strength and safety requirements. Many thin-film solar photovoltaic technologies also use the front glass as a substrate upon which they deposit materials that comprise the solar cell. The processes used during the manufacturer of the solar cell may adversely affect the properties of any existing coatings on the glass or existing coatings may interfere with the solar cell manufacturing process. Embodiments of the present disclosure are completely tolerant of type of glass selected by the solar module manufacturer. It works well on float or patterned glass.

One critical issue for solar module manufacturers that use TCO (or similar) coated glass is tempering. It is very difficult to achieve low-cost, high quality TCO coated tempered glass. Therefore solar module manufacturers that require TCO coated glass use untempered glass. Additionally, even if suitable TCO coated tempered glass is available, some thin-film solar manufacturing processes heat the glass during manufacturer to the extent that the temper is lost. Much of the anti-reflective coated glass on the market is tempered. Tempering is the process by which the glass is heated to 600° C. to 700° C., then quickly cooled. This high tempering temperature sinters the anti-reflective coating providing it with its final mechanical strength. Thus, solar module manufacturers that cannot use tempered glass typically cannot use anti-reflective coated glass. In addition, some module manufacturers, especially thin film module manufacturers who might need to apply anti-reflective coatings on finished or substantially finished modules are unable to use currently available anti-reflective coatings because the coating materials need to be cured at temperatures greater than 300° C., exposed to a corrosive ammonia atmosphere, or exposed to highly toxic acids like hydrofluoric acid. Exposing finished or substantially finished solar modules to temperatures >300° C. or exposing them to a corrosive ammonia atmosphere is likely to damage their performance and/or long term reliability. Exposing finished modules to acids or other strong etchants to create a graded refractive index layer is equally challenging and poses an additional safety risk due to managing and disposing large quantities of a highly dangerous chemical like hydrofluoric acid. One of the embodiments of the disclosure may be applied and cured at a low temperature of between 20° C. and 300° C. and between 20° C. and 130° C. and further between 80° C. and 250° C. This low temperature facilitates the coating of completed solar panels without damage to the panel. Thus, it is an anti-reflective solution for users of un-tempered solar glass and for users of anti-reflective coatings on finished or substantially finished solar modules.

The low temperature curing of one of the embodiments of the disclosure also provides substantial benefits to solar module manufacturers beyond enabling un-tempered anti-reflective glass. By making possible the coating of the glass without the need for the tempering step, solar module manufacturers are enabled to apply their own anti-reflective coating. Currently the requirement for a large tempering oven means that solar modules manufacturers are restricted to buying anti-reflective glass from glass manufacturers. This means that they must maintain inventory of both anti-reflective coated and non-coated glass. As these cannot be used interchangeably, inventory flexibility is reduced, necessitating keeping larger amounts of inventory on hand. The ability for solar module manufacturers to apply their own coating means that they can just hold a smaller inventory of non-coated glass and then apply the anti-reflective coating to that as needed.

In addition, conventional anti-reflective coatings are prone to scratching during the solar module manufacturing process. Typically solar module manufacturers must use a plastic or paper sheet to protect the coating. As the coatings disclosed herein can be applied to fully manufactured solar modules, it can be applied at the end of the manufacturing process, thus removing the need for the protection sheet and the opportunity for damage to the coating during manufacture.

Conventional anti-reflective coatings from different manufacturers tend to have subtle color, texture and optical differences. This presents problems to solar module manufacturers who desire their products to have a completely consistent cosmetic finish. If they manufacture large numbers of solar modules it is almost inevitable that they will have to order anti-reflective glass from different suppliers causing slight differences in the appearance of the final products. However, the coatings disclosed herein enable solar module manufacturers to apply their own coating and so enables cosmetic consistency over an unlimited number of solar modules.

For anti-reflective coatings on solar modules, it is also important to tune and optimize the thickness of the antireflective coating on glass depending upon the type of solar cell that is used by a solar module manufacturer. This is because the spectral responses for crystalline silicon, amorphous silicon, CdTe, CIGS, and other solar cell absorber materials have slight differences and it would be beneficial for the thickness of an antireflective coating to be optimized such that the maximum transmission for the antireflective coating occurs at wavelengths that are well matched to that of the underlying solar cell material.

In addition, to their anti-reflective properties, the coatings described herein can exhibit anti-soiling and/or self-cleaning properties, as they are resistant to the adhesion of dirt and promote the removal of any adhered dirt by the action of water. More specifically, some embodiments of the coatings described herein can be characterized by extremely fine porosity that minimizes the deposition of dirt by physical means. Further, some embodiments of the coatings are characterized by a low energy surface that resists chemical and physical interactions and makes it easy to dislodge the particles, thereby making the surfaces essentially anti-soiling. The reduced physical and/or chemical interactions with the environment, such as dirt, make the exposed surface of these coating less susceptible to binding of dirt and also make it easier to clean with a minimal expenditure of force or energy.

Typically in order to completely clean ordinary glass a mechanical action, for example using brushes or high-pressure jets, is required to dislodge dirt that is strongly adhered to the surface. However, some embodiments of the coatings described herein present a surface such that dirt is more attracted to water than to the surface. Thus, in the presence of water, any dirt resting on the surface may be efficiently removed without the need for mechanical action. This means that coated glass may achieve a high level of cleanliness in the presence of natural or artificial rain without human or mechanical intervention. In addition, the amount of water required to clean the glass is reduced. This is of special significance given that the most effective locations for solar energy generation tend to be sunny, warm and arid, and water may be a particularly expensive and scarce resource in the very locations where solar energy is most effective.

Embodiments of the disclosure enable a reduction in the Levelized Cost of Energy (LCOE) to the operator of a solar energy generating system. First, the anti-reflective property increases the efficiency of the solar modules. Increased efficiency enables a reduction of cost in the Balance of System (BOS) costs in construction of the solar energy generation system. Thus for a given size of system the capital costs and construction labor costs are lower. Second, the anti-soiling property increases the energy output of the solar modules by reducing the losses due to soiling. Third the Operating and Maintenance (O&M) costs are reduced because fewer or no washings are needed reducing labor and water cost associated with washing.

In some embodiments described herein, the coating may also contain water- and oil-resistant hydro/fluoro-carbon groups that make them chemically less reactive and less interacting. When used in combination with a glass substrate, the coatings may bind to the glass surface using siloxane linkages that make them adhere strongly and makes them strong, durable, and abrasion and scratch resistant. These coatings may be physically and chemically less reactive, mechanically and structurally stable, hydrophobic, oleophobic, stable and resistant to degradation by solar ultra-violet (UV) light. Accordingly, it should be appreciated that the coatings described herein have particular application to transparent substrates that are exposed to the environment, such as exterior windows and glass used by solar modules.

Generally, the coatings described herein are prepared by a sol-gel process. The coating composition includes a hydrolysate of organoalkoxysilane or a combination of organoalkoxysilanes and tetraalkoxysilane in a form of a homogenous gel-free solution of sol. This sol can be coated onto a substrate using coating techniques known in the art, dried to form a gel, and cured to form a hard layer or coating having the properties noted above. The process of curing the dried gel further densifies the coating.

Generally, the resulting properties of the coating described above are provided by using a particular combination of components in the formation of the final coating. In particular, the selection of a particular organosilane precursor or mixture of organosilane precursors in combination with other components in the coating mixture may be important in providing a coating with the desired properties. In embodiments, the coatings may be made from a mixture of precursors including tetraalkoxysilane, organosilane, and organofluorosilanes. In embodiments, the coatings may be made from a mixture of precursors including tetraalkoxysilane and organosilane. In some embodiments, separate coating mixtures or mixtures of organosilane precursors may be used to form separate sols that may then be combined to form a final sol that is applied to a substrate to be coated. Further, a single sol, or separately prepared sols that are combined together, may be combined with another organosilane precursor to form a final sol that is applied to a substrate to be coated.

In an embodiment, acid-catalyzed hydrolysis of tetraalkoxysilane forms an extensively cross-linked structure due to the formation of four Si—O—Si linkages around each silicon atom. These structures are characterized by mechanical stability and abrasion resistance. To impart hydrophobicity and anti-soiling to the ultimate coating, organoalkoxysilane(s) may be used in addition to the tetraalkoxysilane. In embodiments, fluorine-containing organoalkoxysilane(s) may be used to impart oleophobicity in addition to the tetralkoxysilane.

In some embodiments the siloxane polymer is formed from acid hydrolyzed alkoxysilanes, organosilanes and optionally organofluorosilanes, wherein the organosilane and the optional organofluorosilanes are each separately prepared by hydrolyzing in the presence of a hydrolysis acid catalyst and a solvent in a first step before combining with an alkoxysilane in a second step.

In some embodiments the siloxane polymer is formed by hydrolyzing at least one organotrialkoxysilane or tetraalkoxysilane in the presence of acid catalyst in a solvent followed by reacting the resulting highly branched high silanol containing siloxane polymer with tetraalkoxysilane or organotrialkoxysilane.

The siloxane polymer may have a relative weight percent ratio of tetraalkoxysilane to a total of organosilane and organofluorosilane of about 0.2 to about 2.

The alkoxysilane may be selected from the group consisting of tetramethoxysilane and tetraethoxysilane.

The organosilane may be selected from the group consisting of trimethoxysilane, triethoxysilane, methyltrimethoxysilane, methyltriethoxysilane, n-propyltrimethoxysilane, n-propyltriethoxysilane, iso-propyltrimethoxysilane, iso-propyltriethoxysilane, n-butyltrimethoxysilane, n-butyltriethoxysilane, iso-butyltrimethoxysilane, iso-butyltriethoxysilane, 3,3-dimethylbutyltrimethoxysilane, 3,3-dimethylbutyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, n-decyltrimethoxysilane, n-decyltriethoxysilane, dodecyltrimethoxysilane, dodecyltriethoxysilane, cyclopentyltrimethoxysilane, cyclopentyltriethoxysilane, cyclohexyltrimethoxysilane, cyclohexyltriethoxysilane, phenyltrimethoxysilane, phenyltriethoxysilane, vinyltrimethoxysilane, vinyltriethoxysilane, allyltrimethoxysilane, allyltriethoxysilane, acetoxymethyltrimethoxysilane, acetoxymethyltriethoxysilane, acetoxyethyltrimethoxysilane, acetoxyethyltriethoxysilane, (3-acetoxypropyl)trimethoxysilane, (3-acetoxypropyl)triethoxysilane, acryloxymethyltrimethoxysilane, acryloxymethyltriethoxysilane, (3-acryloxypropyl)trimethoxysilane, (3-acryloxypropyl)triethoxysilane, methacryloxymethyltrimethoxysilane, methacryloxymethyltriethoxysilane, (3-methacryloxypropyl)trimethoxysilane, (3-methacryloxypropyl)triethoxysilane, (3-glycidylpropyl)trimethoxysilane, (3-glycidylpropyl)triethoxysilane.

The organofluorosilane can be selected from a group consisting of (3,3,3-trifluoropropyl)triemthoxysilane, (3,3,3-trifluoropropyl)triethoxysilane, dodecyafluorodec-9-ene-1-yltrimethoxysilane, dodecyafluorodec-9-ene-1-yltriethoxysilane, (heptadecafluoro-1,1,2,2-tetrahydrodecyl)trimethoxysilane, (heptadecafluoro-1,1,2,2-tetrahydrodecyl)triethoxysilane, 3-(heptafluoroisopropoxy)propyltrimethoxysilane, 3-(heptafluoroisopropoxy)propyltriethoxysilane, hexadecafluorododec-11-en-1-yltrimethoxysilane, hexadecafluorododec-11-en-1-yltriethoxysilane, nonafluorohexyltrimethoxysilane, nonafluorohexyltriethoxysilane, pentafluorophenoxyundecyltrimethoxysilane, pentafluorophenoxyundecyltriethoxysilane, pentafluorophenyltrimethoxysilane, pentafluorophenyltriethoxysilane, (tridecafluoro-1,1,2,2-tetrahydrooctyl)trimethoxysilane, (tridecafluoro-1,1,2,2-tetrahydrooctyl)triethoxysilane, perfluorooctylphenyltrimethoxysilane, perfluorooctylphenyltriethoxysilne, heptadecafluorodecyltrimethoxysilane, heptadecafluorodecyltriethoxysilane, (1H,1H,2H,2H-tridecafluoro-n-octyl)trimethoxysilane, (1H,1H,2H,2H-tridecafluoro-n-octyl)triethoxysilane, (1H,1H,2H,2H-nonafluorohexyl)trimethoxysilane, (1H,1H,2H,2H-nonafluorohexyl)triethoxysilane, 3-(pentafluorophenyl)propyltrimethoxysilane, 3-(pentafluorophenyl)propyltriethoxysilane.

The siloxane polymer may be 0.1% to 10% by weight of the total coating composition. The siloxane polymer may have a weight average molecular weight (Mw) of 600 to 10,000 Daltons. The siloxane polymer may include 10 to 60 mol % Si—OH groups as established by Si-NMR.

The hydrolysis acid catalyst may be selected from the group consisting of hydrochloric acid, nitric acid, sulfuric acid, phosphoric acid, methanesulfonic acid or acetic acid in amount of 0.01% to 1.0% by weight of the total coating composition.

The solvent may consist of water and at least one other organic solvent selected from the group consisting of alcohols, esters, ethers, aldehydes, and ketones such as methanol, ethanol, 1-propanol, 2-propanol, 1-butanol, ethyl acetate, ethylene glycol, foramide, dimethylformamide, N-methylpyrrolidinone, propylene glycol methyl ether, 1-methoxy-2-propanol, propylene glycol, propylene glycol methyletheracetate, acetone, cyclohexanone, methylethylkeone, N,N-dimethyl acetamide, dimethylether, diethylether, 2-butanol, 2-butanone, tetrahydrofurane, 1,2-diethoxyethane, diethyleneglycol, 1,2 dimethoxyethane, dipropylene glycol monomethyl ether acetate, propylene glycol, diamyl ether, diethyl oxalate, lactic acid butyl ester, dibutyl ether, 1-pentanol, dimethoxy ethane, 1-hexanol, 1-heptanol, ethylene glycol, gamma-butyrolactone, triethylene glycol and methyl t-butyl ether, wherein the amount of solvent is from about 50% to about 99.5% by weight of the total coating composition.

In embodiments, the ratio of organic solvent to water may be between about 1 to about 50 or between about 5 to about 10.

In some embodiments, additives such as high-boiling-point porogens, templates, nano-fillers, adhesion promoters, base condensation catalysts, thermal radical initiators, photo radical initiators, cross-linkers and surfactants and others may be used in the coating composition.

In some embodiments, a combination of organoalkoxysilane and tetraalkoxysilane precursors with nano-fillers such as colloidal silica (NALCO, NISSAN, EVONIK, LUDOX, BAXTER, CLAMANT), hollow silica nano-spheres, polymer beads, polylactic acid, polyvinylpyrrolidone, polymethylmethactrylates and polyacrylates, carbon nanotubes, Buckminsterfullerene $C_{60}$ and $C_{70}$ in an amount of 0.0% to 5% by weight of the total coating composition could provide a sol with a long shelf-life, and superior optical and mechanical performance.

In some embodiments, high-boiling-point porogen(s) selected from the group consisting of ethylene oxide, propylene oxide, polyethylene oxides, polypropylene oxides, ethylene oxide/propylene oxide block co-polymers, polyoxyethylated polyoxypropylated glycols, fatty acid ethoxylates, ethylene glycol esters, glycerol esters, mono-di-glycerides, glycerylesters, polyethylene glycolesters, polyglycerol esters, polyglyceryl esters, polyol monoesters, polypropylene glycol esters, polyoxyalkylene glycol esters, polyoxyalkylene propylene glycol esters, polyoxyalkylene polyol esters, polyoxyalkylene glyceride esters, polyoxyalkylene fatty acid, sorbitan esters, sorbitan fatty acid esters, sorbitan esters, polyoxyalkylene sorbitan esters, polyoxyethylene sorbitan monolaurate, polyoxyethylene sorbitan monostearate, polyoxyethylene sorbitan tristearate, sorbitan ester ethoxylates such as TWEEN 80, TWEEN 20, PEG 600, PEG 400, PEG 300, or PEG-b-PPG-b-PEG may be added in the amount of 0.0% to 5% by weight of the total coating composition to generate porosity in the final films that results in lowering refractive index (RI) and increasing optical performance. After gelation of the coating, the high-boiling-point porogen may remain homogenously dispersed in the gel. During thermal curing, the gel forms a stronger network of crosslinked Si—O—Si bonding around high-boiling-point porogens. The network structure may be hard enough to keep its shape at higher temperature when the porogens evaporate or burn off. The loss of porogens may result in pores or voids which reduce the refractive index of the coating.

In some embodiments, a stable sol may be synthesized with initial template(s) selected from the group consisting of ethylene oxide, propylene oxide, polyethylene oxides, polypropylene oxides, ethylene oxide/propylene oxide block co-polymers, polyoxyethylated polyoxypropylated glycols, fatty acid ethoxylates, ethylene glycol esters, glycerol esters, mono-di-glycerides, glycerylesters, polyethylene glycolesters, polyglycerol esters, polyglyceryl esters, polyol monoesters, polypropylene glycol esters, polyoxyalkylene glycol esters, polyoxyalkylene propylene glycol esters, polyoxyalkylene polyol esters, polyoxyalkylene glyceride esters, polyoxyalkylene fatty acid, sorbitan esters, sorbitan fatty acid esters, sorbitan esters, polyoxyalkylene sorbitan esters, polyoxyethylene sorbitan monolaurate, polyoxyethylene sorbitan monostearate, polyoxyethylene sorbitan tri stearate, sorbitan ester ethoxylates such as TWEEN 80, TWEEN 20, PEG 600, PEG 400, PEG 300, or PEG-b-PPG-b-PEG in an amount of 5% by weight of the total coating composition. Coating and curing of the sol from this method produces high performance anti-reflective coatings.

In some embodiments, surfactant(s) may be selected from the group consisting of nonionic surfactants, polyoxyethylene glycol alkyl ethers (Brij 58), polyoxyethylene octyl phenyl ether, polyoxyethylene glycol sorbitan alkyl esters (polysorbate), ionic surfactants, cetyltrimethylammonium bromide and other tetraalkylammonium halides may be added to the formulation in an amount of 0.0% to 5.0% by weight of total coating composition.

To enhance silanol condensation, increase cross-link density and lower cure temperature, a base condensation catalyst selected from the group consisting of alkali metal hydroxide, amide, amines, imidazolines, such as; potassium hydroxide (KOH), sodium hydroxide (NaOH), cesium hydroxide (CsOH), ammonium hydroxide ($NH_4OH$), tetramethyl ammonium hydroxide (TMAH), formamide (FA), dimethylformamide (DMF), N-methylpyrrolidinone (NMP), N,N-dimethyl acetamide (DMA), thermal base generator (TBG) or tetramethoxymethyl glycoluril (Powder-Link 1174) may be added in an amount of 0.0% to 1.0% by weight of the total coating composition.

In some embodiments, adhesion promoter(s) suitable for the disclosed compositions may be selected from the group consisting of organosilane compounds such as (meth)acryloxypropyl trimethoxysilane, (meth)acryloxypropyl triethoxysilane, (meth)acryloxypropyl dimethylmethoxysilane, (meth)acryloxypropyl methyldimethoxysilane, 3-glycidylpropyl trimethoxysilane, 3-glycidylpropyl triethoxysilane, 3-glycidylpropyl dimethylmethoxysilane, 3-glycidylpropyl methyldimethoxysilane and may be used in the amount of 0.0% to 5.0% by weight of the total coating composition.

In some embodiments, the composition may include a thermal radical initiator(s) selected from the group consisting of azo-compounds and peroxides. These compounds include 4,4'-Azobis(4-cyanovaleric acid), 4,4'-Azobis(4-cyanovaleric acid) >75%,1,1'-Azobis(cyclohexanecarbonitrile) 98%, Azobisisobutyronitrile, 2,2'-Azobis(2-methylpropionamidine) dihydrochloride, 2,2'-Azobis(2-methylpropionitrile), 2,2'-Azobis(2-methylpropionitrile), tert-Butyl hydroperoxide, tert-Butyl peracetate, cumene hydroperoxide, 2,5-Di(tert-butylperoxy)-2,5-dimethyl-3-hexyne, 2,5-Di(tert-butylperoxy)-2,5-dimethyl-3-hexyne, Dicumyl peroxide, 2,5-Bis(tert-butylperoxy)-2,5-dimethyl-hexane, 2,4-Pentanedione peroxide, 1,1-Bis(tert-butylperoxy)-3,3,5-trimethylcyclohexane, 1,1-Bis(tert-butylperoxy)cyclohexane, 1,1-Bis(tert-amylperoxy)cyclohexane, Benzoyl peroxide, 2-Butanone peroxide, tert-Butyl peroxide, Lauroyl peroxide, tert-Butyl peroxybenzoate, tert-Butylperoxy 2-ethylhexyl carbonate, tert-Butyl hydroperoxide may be added to the formulation in an amount of 0.0% to 5.0% by weight of the total coating composition.

In some embodiments, the composition may include a photo radical initiator(s) selected from the group consisting of Acetophenone, Anisoin, Anthraquinone, Anthraquinone-2-sulfonic acid, sodium salt monohydrate, (Benzene) tricarbonylchromium, Benzil, Benzoin, Benzoin ethyl ether, Benzoin isobutyl ether, Benzoin methyl ether, Benzophenone, Benzophenone/1-Hydroxycyclohexyl phenyl ketone, 3,3',4,4'-Benzophenonetetracarboxylic dianhydride, 4-Benzoylbiphenyl, 2-Benzyl-2-(dimethylamino)-4'-morpholinobutyrophenone, 4,4'-Bi s(diethylamino)benzophenone, 4,4'-Bis(dimethylamino)benzophenone, Camphorquinone, 2-Chlorothioxanthen-9-one, (Cumene)cyclopentadienyliron (II) hexafluorophosphate, Dibenzosuberenone, 2,2-Diethoxyacetophenone, 4,4'-Dihydroxybenzophenone, 2,2-Dimethoxy-2-phenylacetophenone, 4-(Dimethylamino)benzophenone, 4,4'-Dimethylbenzil, 2,5-Dimethylbenzophenone, 3,4-Dimethylbenzophenone, Diphenyl(2,4,6-trimethylbenzoyl)phosphine oxide/2-Hydroxy-2-methylpropiophenone, 4'-Ethoxyacetophenone, 2-Ethylanthraquinone, Ferrocene, 3 3'-Hydroxyacetophenone, 4'-Hydroxyacetophonone, 3-Hydroxybenzophenone, 4-Hydroxybenzophenone, 1-Hydroxycyclohexyl phenyl ketone, 2-Hydroxy-2-methylpropiophenone, 2-Methylbenzophenone, 3-Methylbenzophenone, Methybenzoylformate, 2-Methyl-4'-(methylthio)-2-morpholinopropiophenone, Phenanthrenequinone, 4'-Phenoxyacetophenone, Thioxanthen-9-one, Triarylsulfonium hexafluoroantimonate salts, Triarylsulfonium hexafluorophosphate salts may be added to the formulation in an amount of 0.0% to 5.0% by weight of the total coating composition.

In some embodiments, the composition may include a cross-linker(s) selected from the group consisting of glycerol, glyoxal, methylglyoxal, dulcitol, 1,5-pentanediol, 1,3-propanediol, 1,2,4-butanetriol, 1,4-butanediol, 1,1-bis(trichlorosilylmethyl)ethylene, 1,10-bis(trichlorosilyl)decane, 1,10-bis(triethoxysilyl)decane, 1,12-bis(methyldichlorosilyl)ethane, 1,2-bis(methyldiethoxysilyl)ethane, 1,2-bis(methyldiethoxysilyl)ethylene, 1,2-bis(methyldimethoxysilyl)ethane, 1,2-bis(methyldimethoxysilyl)ethylene, 1,2-bis(trichlorosilyl)decane, 1,2-bis(trichlorosilyl)ethane, 1,2-bis(triethoxysilyl)ethane, 1,2-bis(triethoxysilyl)ethylene, 1,4-bis(trimethoxysilyl)benzene, 1,4-bis(triethoxysilyl)benzene, 1,4-bis(trichlorosilyl)benzene, 1,4-bis(triethoxysilylethyl)benzene, 1,4-bis(trichlorosilylethyl)benzene, 1,4-bis(trimethoxysilylmethyl)benzene, 1,4-bis(triethoxysilylmethyl)benzene, 1,4-bis(trichlorosilylmethyl)benzene, 1,4-bis(trimethoxysilylpropyl)benzene, 1,4-bis(triethoxysilylpropyl)benzene, 1,4-bis(trichlorosilylpropyl)benzene may be added in an amount of 0.0% to 5.0% by weight of the total coating composition.

In some embodiments, to enhance silanol condensation and increase densification of the film, other heteroatom containing additive(s) such as boron or aluminum selected from the group consisting of $B(OH)_3$, $BI_3$, $B(OCH_3)_3$, $B(OC_2HO_3$, $BCl_3$, Al $(acac)_3$ or $AlCl_3$ may be added during synthesis of the siloxane polymer or during final formulation in an amount of 0% to 1.0% by weight of the total coating composition.

It should be appreciated that the coating material and process by which it is applied to the substrate can comprise a larger coating system. The coating material may be optimized for a particular coating method and vice versa. Thus, the optimized coating process may be performed by a tool optimized to ensure consistency and quality. Therefore, this tool coupled with the coating materials may comprise the coating system. Given that the benefits of the current disclosure are particularly well suited to solar module manufacturers, who may not themselves manufacture tools, it may be desirable to offer a complete solution consisting of the coating material, the coating process knowledge and the associated coating tool. In the following paragraphs describing the coating process, it should be appreciated that these steps could be executed manually, automatically using a coating tool or in any combination of both. It should also be appreciated that there are several possible coating systems wherein different coating materials, coating processes and coating tools are used in combination.

The tool may be a large stand-alone unit intended for operation in a factory setting; it could be a sub-tool, such that it comprises a process module that performs the coating process but that is integrated into another machine that performs other steps in the larger solar module manufacturing process. For example, it could be a module attached to an existing glass washing machine or a module attached to a solar module assembly machine. Alternatively, the tool could be portable or semi-portable, for example mounted on a truck or inside a tractor trailer such that it could be transported to a worksite and used to coat solar modules during the construction of a large solar installation. Alternatively, it could be designed such that the coating could be applied to installed solar modules in situ.

In general, three steps may be used to apply the sol to a given substrate. First, the substrate is cleaned and pretreated. Second, the substrate is coated with the sol or mixture of sols. Third, the final coating is formed on the substrate. It should be understood that additional or fewer steps may be used to apply the sol.

As an initial step, the substrate is pretreated or pre-cleaned to remove surface impurities and to activate the surface by generating a fresh surface or new binding sites on the surface.

It is desirable to increase the surface energy of the substrate through pretreatment or cleaning of the substrate surface to form an "activated" surface. For example an activated surface may be one with many exposed Si—OH moieties. An activated surface reduces the contact angle the sol and enables effective wetting of the sol on the surface. In some embodiments, a combination of physical polishing or cleaning and/or chemical etching is sufficient to provide even wetting of the sol. In cases, where the surface tension would need to be further lowered, the substrate, such as glass, may be pretreated with a dilute surfactant solution (low molecular weight surfactants such as surfynol, long chain alcohols such as hexanol or octanol, low molecular weight ethylene oxide or propylene oxide, or a commercial dishwasher detergent such as CASCADE®, FINISH®, or ELECTRASOL® to further help the sol spread better on the glass surface.

Accordingly, surface pretreatment can involve a combination of chemical and physical treatment of the surface. The chemical treatment steps can include (1) cleaning the surface with a solvent or combination of solvents, detergents, mild bases like sodium carbonate or ammonium carbonate and/or (2) cleaning the surface with a solvent along with an abrasive pad, (3) optionally chemically etching the surface, and/or (4) washing the surface with water. The physical treatment steps can include (1) cleaning the surface with a solvent or combination of solvents, (2) cleaning the surface with a solvent along with particulate abrasives, and (3) washing the surface with water. It should be appreciated that a substrate can be pretreated by using only the chemical treatment steps or only the physical treatment steps. Alternatively, both chemical and physical treatment steps could be used in any combination. It should be further appreciated that the physical cleaning action of friction between a cleaning brush or pad and the surface is an important aspect of the surface preparation.

In the first chemical treatment step, the surface is treated with a solvent or combination of solvents with variable hydrophobicity. Typical solvents used are water, ethanol, isopropanol, acetone, and methyl ethyl ketone. A commercial glass cleaner (e.g., WINDEX®) can also be employed for this purposes. The surface may be treated with an individual solvent separately or by using a mixture of solvents. In the second step, an abrasive pad (e.g., SCOTCHBRITE®) is rubbed over the surface with the use of a solvent, noting that this may be performed in conjunction with the first step or separately after the first step. In the last step, the surface is washed or rinsed with water.

One example of substrate preparation by this method involves cleaning the surface with an organic solvent such as ethanol, isopropanol, or acetone to remove organic surface impurities, dirt, dust, and/or grease (with or without an abrasive pad) followed by cleaning the surface with water. Another example involves cleaning the surface with methyl ethyl ketone (with or without an abrasive pad) followed by washing the surface with water. Another example is based on using a 1:1 mixture of ethanol and acetone to remove organic impurities followed by washing the surface with water.

In some instances an additional, optional step may be included, chemically etching the surface by means of concentrated nitric acid, sulfuric acid, or piranha solution (1:1 mixture of 96% sulfuric acid and 30% $H_2O_2$) may be necessary to make the surface suitable for bonding to the deposited sol. Typically this step would be performed prior to the last step of rinsing the surface with water. In one embodiment, the substrate may be placed in piranha solution for 20 minutes followed by soaking in deionized water for 5 minutes. The substrate may then be transferred to another container holding fresh deionized water and soaked for another 5 minutes. Finally, the substrate is rinsed with deionized water and air-dried.

The substrate may alternatively or additionally prepared by physical treatment. In the physical treatment case, for one embodiment the surface is simply cleaned with a solvent and the mechanical action of a cleaning brush or pad, optionally a surfactant or detergent can be added to the solvent, after which the substrate is rinsed with water and air dried. In another embodiment the surface is first cleaned with water followed by addition of powdered abrasive particles such as ceria, titania, zirconia, alumina, aluminum silicate, silica, magnesium hydroxide, aluminum hydroxide particles, silicon carbide, or combinations thereof onto the surface of the substrate to form a slurry or paste on the surface. The abrasive media can be in the form a powder or it can be in the form of slurry, dispersion, suspension, emulsion, or paste. The particle size of the abrasives can vary from 0.1 to 10 microns and in some embodiments from 1 to 5 microns. The substrate may be polished with the abrasive slurry via rubbing with a pad (e.g., a SCOTCHBRITE® pad), a cloth, a foam, or paper pad. Alternatively, the substrate may be polished by placement on the rotating disc of a polisher followed by application of abrasive slurry on the surface and rubbing with a pad as the substrate rotates on the disc. Another alternative method involves use of an electric polisher that can be used as a rubbing pad in combination with abrasive slurry to polish the surface. The substrates polished with the slurry are cleaned by water and air-dried.

After pretreating the surface, the coating is deposited on a substrate by techniques known in the art, including dip coating, spray, drop rolling, flow coating or roll coating to form a uniform coating on the substrate. Other methods for deposition that can be used include spin-coating; aerosol deposition; ultrasound, heat, or electrical deposition means; micro-deposition techniques such as ink-jet, spay-jet, xerography; or commercial printing techniques such as silk printing, dot matrix printing, etc. Deposition of the sol is may be done under ambient conditions or under controlled temperature and humidity conditions. In some embodiments the temperature is controlled between 20° C. and 35° C. and/or the relative humidity is controlled between 20% and 60% or more preferably between 25% and 35%.

In some embodiments, the method of deposition is performed via the drop rolling method on small surfaces wherein the sol composition is placed onto the surface of a substrate followed by tilting the substrate to enable the liquid to roll across the entire surface. For larger surfaces, the sol may be deposited by flow coating wherein the sol is dispensed from a single nozzle onto a moving substrate at a rate such that the flowing sol leads to a uniform deposition onto a surface or from multiple nozzles onto a stationary surface or from a slot onto a stationary surface. Flow coating is described in greater detail elsewhere herein. Another method of deposition is via depositing the liquid sol onto a substrate followed by use of a mechanical dispersant to spread the liquid evenly onto a substrate. For example, a squeegee or other mechanical device having a sharp, well-defined, uniform edge may be used to spread the sol such as roll coating which is described in greater detail herein.

Several variations for depositing the final sol exist. In some embodiments, the final sol is simply deposited on the substrate in one layer. In some embodiments, a single sol or multiple sols may be deposited to form multiple layers, thereby forming a multilayered coating. In an embodiment, a coating of a sol containing high-silanol terminal groups can be formed as an underlayer for better adhesion to a glass substrate followed by a topcoat of a tetraalkoxysilane to obtain better abrasion resistance for the outer surface. In an embodiment, an underlayer of an organosilane may be deposited followed by the deposition of a topcoat of a mixture of an organofluoroalkoxysilane and a tetraalkoxysilane. In an embodiment, an underlayer of a tetraalkoxysilane may be deposited followed by the deposition of a top layer using a sol mixture of an organoalkoxysilane and an organofluoroalkoxysilane. In an embodiment, an underlayer of a sol made from a mixture of an organoalkoxysilane and an organofluoroalkoxysilane may be deposited followed by vapor deposition of a top layer by exposing the layer to vapors of a tetraalkoxysilane. In an embodiment, an underlayer of a sol made from a mixture of an organoalkoxysilane and an organofluoroalkoxysilane may be deposited followed by deposition of a top layer by immersing the substrate in a solution of a tetraalkoxysilane in isopropanol.

In embodiments in which multiple layers are deposited, each layer may be deposited shortly after deposition of the first layer, for example, within or after 30 seconds of deposition of the prior layer. In embodiments, sols may be deposited on top of one another, or different mixtures of sols may be deposited on top of one another or a single sol may be deposited in multiple layers or the same sol mixture may be deposited in multiple layers. In embodiments, a given sol may be deposited as one layer and a different sol mixture may be used as another layers. Any combination of sols may be deposited in any order, thereby constructing a variety of multi-layered coatings.

The sols for each layer may be deposited using either similar or different coating techniques. The coating and curing process steps may be configured to create coatings of varying complexity and structure. In embodiments, any combination of coating technique and curing technique may be used to achieve a final coating for a substrate. Embodiments may include coating via a flow coating technique followed by a skin cure process or cure by conventional means, coating via a spin coating technique followed by a skin cure process or cure by conventional means, coating via a roll coating technique followed by a skin cure process or cure by conventional means, and the like. To generate multilayer coatings, any combination of coating and curing apparatus may be used sequentially to generate such a coating. The sequential use of such apparatus may be enabled by an arrangement that places multiple coating apparatus and curing apparatus in sequence. Alternatively, handling facilities may exist for handling the substrate between one or more coating and curing apparatus. For example, two roll-coaters may be placed in sequence with an optional flash-off heater in between. This facilitates coating of a first layer by the first roll-coater, drying of the layer by the flash-off station, then deposition of a second layer by the second roll-coater before curing in a skin-cure station or in a simple oven. Alternatively, a high temperature skin-cure step may be interposed between the roll-coaters to enable a high temperature heat treatment to the first layer before application of the second layer. It should be understood that this technique for multiple layer coatings may be extended to more than two layers. Multi-layer coatings manufactured by this technique may be high performance anti-reflective interference type coatings or multiple layers coatings could be used to modify the surface energy of the top surface coating by for example adding a fluorinated silane monolayer to an underlying layer to make the final coating hydrophobic and oleophobic on the environmentally exposed surface. The multi-layer coatings may be used to enhance single layer anti-reflective coatings by adding a lower refractive index material on the environmentally exposed surface to create a graded index coating between the environment and the underlying substrate. In embodiments, a second layer of coating may be applied to an existing base layer to provide a functional benefit of the multi-layer coating in combination with the base layer. For example, a mobile phone/touch screen glass may be coated with an inorganic coating that provides anti-scratch benefits, then a low-temperature anti-soiling coating may be on top of the anti-scratch coating.

The thickness of the coatings deposited can vary from about 10 nm to about 5 p.m. In some embodiments, the thickness of the coating varies from about 100 nm to about 1 micron, and in other embodiments it varies from about 100 nm to about 500 nm. In order to provide sufficient anti-reflective properties, a thickness of about 60 nm to about 150 nm is desired. The thickness of the coating mixture as deposited is affected by the coating method, as well as by the viscosity of the coating mixture. Accordingly, the coating method should be selected so that the desired coating thickness is achieved for any given coating mixture. Further, in those embodiments, in which multiple layers of sols are deposited, each layer should be deposited in a thickness such that the total thickness of the coating is appropriate to achieve the final desired transmission spectrum properties. Accordingly, in some embodiments in which multiple layers of sols are deposited, the overall coating thickness varies from about 100 nm to about 500 nm, and in order to provide sufficient anti-reflective properties, a total coating thickness of about 60 nm to about 150 nm is desired.

Once the final sol is deposited as described above, the deposited sol will dry to form a gel through the process of gelation after which the gel is cured further to remove residual solvent and facilitate further condensation of Si—OH and network formation via Si—O—Si linkage formation in the coating. In addition, the gel may be allowed to age to allow for the formation of additional linkages through continued—condensation reactions.

As described above, the sol-gel method used in preparing the coatings described herein utilizes a suitable molecular precursor that is acid hydrolyzed to generate a siloxane oligomers. Initial hydrolysis and partial condensation of the precursor monomers generates a liquid sol, which ultimately turns to a solid gel during drying. Drying of the gels under ambient conditions (or at elevated temperature) leads to evaporation of the solvent phase to form a cross-linked film. Accordingly, throughout the process, the coating mixture/sol/gel/dried/cured coating undergoes changes in physical, chemical, and structural parameters that intrinsically alter the material properties of the final coating. In general, the changes throughout the sol-gel transformation can be loosely divided into three interdependent aspects of physical, chemical, and structural changes that result in altered structural composition, morphology, and microstructure. The chemical composition, physical state, and overall molecular structure of the sol and the gel are significantly different such that the materials in the two states are intrinsically distinct.

Regarding physical differences, the sol is a collection of silanol-containing polysilsesquioxane oligomers (low Mw polymer) dissolved in a polar solvent. These silanol-containing polysilsesquioxane oligomers are dissolved in a solvent and do not interact with each other significantly. As such, the sol is stable and exists as a low viscosity transparent colorless liquid. In contrast, in a gel film the network formation has occurred to an advanced state such the siloxane polymers are interconnected to each other. The increased network formation and cross-linking makes the gel network rigid with a characteristic solid state. The ability of the material to exist in two different states is because of the chemical changes (condensation of Si—OH) that occur along the sol to gel transformation.

Regarding chemical changes, during the sol to gel transition, the sol molecules combine with each other via Si—OH condensation and formation of Si—O—Si linkages. As a result, the material exhibits network formation and strengthening. Overall, the sol contain reactive Si—OH silanol groups that can participate in formation of an Si—O—Si network while the gel structure has some of these Si—OH silanol groups converted into Si—O—Si groups.

Regarding structural differences, the sol contains few Si—O—Si linkages along with terminal Si—OH silanol as well as unhydrolyzed alkoxy ligands. As such, the sol state can be considered structurally different from the solidified films, which contain more Si—O—Si linkages and fewer silanols. As such, the liquid sol and the solid state polymeric networks are chemically and structurally distinct systems.

Some combination of organoalkoxysilane precursors could provide a sol with a long shelf-life, while some combination of organoalkoxysilane precursors could provide a sol that could gel into a coating with superior abrasion resistance, while some other combination of organoalkoxysilane precursors could gel into a coating with abrasion resistance and anti-soiling properties.

Regarding differences in properties, the origin of the physical and chemical properties of the sol and gel films depends upon their structure. The sol solution and the gel films differ in the chemical composition, makeup and functional groups and as a result exhibit different physical and chemical properties. The sol stage because of its particulate nature is characterized by high reactivity to form the network while the gel state is largely unreactive due to conversion of reactive Si—OH silanol groups to stable Si—O—Si linkages. Accordingly, it is the particular combination of organoalkoxysilane precursors and other chemicals added to the coating mixture that is hydrolyzed and condensed, gelled, dried and cured on a substrate surface that gives the final coatings of the present disclosure the desired properties described above.

There are several methods by which the gel is dried and cured and/or aged to form the final coating. In some embodiments the gel is dried and cured under ambient or room temperature conditions. In some embodiments, the gel is aged under ambient conditions for 30 minutes followed by drying for 3 hours in an oven kept at a variable relative humidity of (e.g., 20% to 50%). The temperature of the oven is then increased slowly at a rate of 5° C/min to a final temperature of 120° C. The slow heating rate along with the moisture slows the rate of the silanol condensation reaction to provide a more uniform and mechanically stable coating. This method provides reproducible results and is a reliable method of making the coating with the desired properties.

In another embodiment, the gel on the substrate is heated under an infrared emitter or array of infrared emitters. These emitters are placed close proximity to the substrate's coated surface such that the surface is evenly illuminated. The emitters are chosen for maximum emission in the mid-infrared region of 3-5 p.m wavelength. This region is desirable because it is adsorbed better by glass than shorter infrared wavelengths. The power output of the emitters may be closely controlled via a closed loop PID controller to achieve a precise and controllable temperature profile of the coated surface. In some embodiments this profile will start from ambient temperature and quickly rise 1° C. to 100° C. per second to a temperature of 120° C. or to a temperature of 275° C. or to 350° C., hold that temperature for a period of 30 to 300 seconds, then reduce temperature back to ambient, with or without the aid of cooling airflow.

For applications requiring high throughput and/or for applications wherein there is a process sensitivity around the maximum allowable temperature for the bottom surface of the coated glass when the glass is cured it would be preferred to cure the glass such that only the top surface of the glass is heated by impinging hot air on the coated surface or a xenon arc lamp using a pulsing method where the lamp is turned on and off multiple times during the cure cycle. One curing technique known as skin curing is described in greater detail elsewhere herein with reference to FIG. 17.

It is particularly noteworthy that some coatings of this disclosure may be prepared under temperatures not exceeding 120° C. in contrast to temperatures of 400° C. to 600° C. typically employed in curing silica-based anti-reflective coatings.

In another embodiment, the coating may be dried under ambient or room temperature conditions at variable relative humidity of (e.g., 20% to 50%). Finally, the coating may be cured at a temperature selected from 120° C. to 800° C. for periods of 0.5 min to 60 min.

In another embodiment, the coating may be dried under ambient or room temperature conditions at variable relative humidity of (e.g., 20% to 50%). Then the coating is cured at tempering conditions.

As described above and as illustrated further in the examples, the coatings made as described herein have several desirable properties. The coatings have anti-reflective properties that reduce the reflection of photons. The transmittance of a glass substrate coated with a coating composition made according to the present disclosure can be increased by about 1% to about 8%, from about 2% to about 6%, and from about 1% to about 4% relative to uncoated glass substrates The coatings also have anti-soiling properties, which are also important in maintaining sufficient transmittance when used in conjunction with a glass substrate. Soiling is due to adherence of particulate matter on surfaces exposed to environment. The deposition of the particles onto surfaces depends upon the surface microstructure as well as chemical composition. In general, rough surfaces can provide many sites for physical binding of particulate matter.

The chemical composition of the surfaces is reflected in the surface energy as measured by contact angles. Low energy surfaces (characterized by high water contact angles) are usually less susceptible to binding as compared to high energy surfaces with low water contact angles. Therefore, anti-soiling properties can be determined indirectly by measuring the coating's contact angle. The coatings herein provide contact angles ranging from about 10° to about 178°, or about 70° to about 110° or about 110° to about 155°, or about 125° to about 175°. The coatings of this disclosure minimize the photon flux losses due to soiling by about 50% relative to uncoated samples.

The coatings of the present disclosure also provide desirable abrasion resistance. Abrasion resistance can be defined as the ability of a material to withstand erosion due to frictional forces to preserve and maintain its original shape and appearance. Abrasion resistance relates to the strength of the intrinsic framework structure as well as to surface features. Materials that do not have sufficient strength due to lack of long range bonding interactions tend to abrade easily. Similarly, materials with uneven surfaces or coatings with surface inhomogeneities and asperities tend to wear due to frictional losses. Also, the leveling and smoothing of these asperities due to friction leads to changes in optical transmission of the coating as the material is abraded.

It is possible that the beneficial properties of the coating can also be tuned by changing the molecular weight of the sols that comprise the coating or changing the ratio of low and high molecular weight components in the sols that comprise the coating or by the changing the polydispersity of the sols that comprise the coating. Altering the pH and changing the catalysts used in the reaction could also be used to change the molecular weights and molecular weight distribution or polydispersity of the components in the sol. For example, changing the polydispersity of the sols could impact how the polymerized silane molecules pack together. This could have an impact on abrasion resistance of the cured coating. Another example is modifying the surface characteristics of the final coating by the presence of low molecular weight hydrolyzed organofluoroalkoxysilane molecules in the sol. As the coating dries, these low molecular weight species could rise to the coatings surface and modify the wettability of the coating and thereby alter its anti-soiling and/or self-cleaning properties.

Figures 1, 7A:
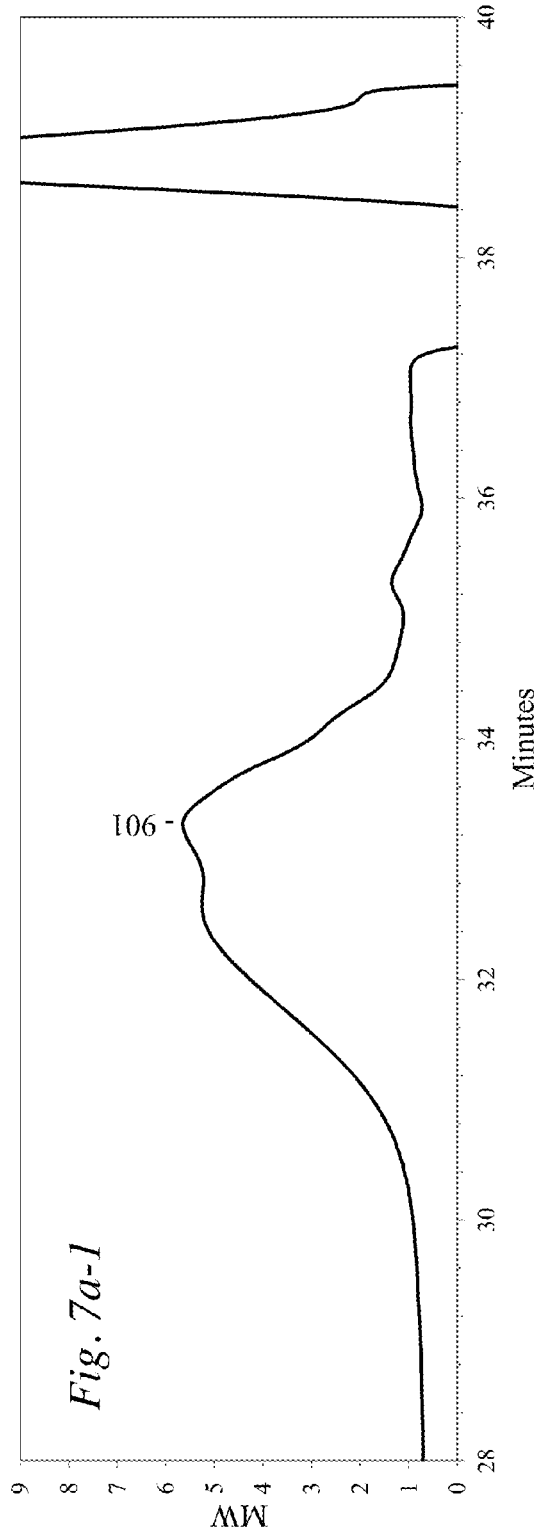
FIG. 7a-1 is a GPC of sol made from Example 2.

Gel Permeation Chromatography (GPC) is a technique that is used to characterize the molecular weight of polymers. We have used Waters GPC systems for molecular weight analysis. The method details are as follows HPLC system: a 1515 isocratic pump equipped with 2707 Autosampler and 50 uL loop, 2414 RI detector with column heater. Column and detector oven heated to 40° C. Flow used was 1.0 ml/min. Four 4.6×300 mm GPC Styrene divinylbenzene copolymer packed columns in-line for an effective MW range were used. The columns came pre-equilibrated in THF and THF was used as the eluent. Polystyrene narrow standards were used and the standard curve was fit to a 3rd-order polynomial. Nine polystyrene standards from approx. 530 MW to 50,000 were used. The Poly Styrene standards were prepared at 10 mg/ml each in THF and diluted their samples 1:10 in THF for injections. Results are shown in FIG. 7a and FIG. 7b for sol made from Example 2. It can be seen that some of the sols used for preparation of coatings in this disclosure can have a weight average Molecular Weight (Mw) of less than 1000 and number average molecular weight of (Mn) of less than 1000 with polydispersity (PD) of less than 1.2.

Yet another way to modulate the abrasion resistance of the coatings of the present disclosure is by changing the temperature at which the coatings are cured after drying. Similar films when cured at ambient temperature typically will have a lower abrasion resistance compared to films cured at 120° C. which can be lower than films cured at 200° C. or 300° C. in a conventional oven.

In general, the various coatings of the present disclosure provide a means of making a transparent substrate or glass transmit more photons without altering its intrinsic structure and other properties, along with passivating the surface so that it becomes resistant to the adhesion of water, dirt, soil, and other exogenous matter. Accordingly, the coating mixtures and resulting gels and coatings as described herein have numerous commercial applications.

Regarding the coating mixtures themselves, these may be packaged for commercial sale as a coating mixture or commercial coating formulation for others to use. For example, the coating mixtures may be provided as a liquid composition, for example, for subsequent small scale treatment of glass in a treatment separate from their usage as windows in solar or architectural systems. In this case the coating mixture may be packaged for sale as siloxane polymer mixture after the silane precursors have been hydrolyzed and partially condensed.

In addition, the coating mixtures may be deposited and allowed to cure on a particular substrate that is subsequently packaged for sale as a finished assembly. In particular, the coating compositions of the present disclosure can be coated onto any transparent substrate that has hydrogen bond donor or hydrogen bond acceptor groups on the surface. For example, the coating can be applied as a treatment for a given glass or other transparent substrate before or after it has been integrated into a device, such a solar cell, optical window or enclosure, for example, as part of a glass treatment process. In other embodiments, the disclosure provides for the use of the coating compositions as an efficiency enhancement aid in architectural windows in building and houses by the provision of anti-reflection benefits and/or by the provision of anti-soiling benefits to augment the anti-reflection benefits. In other embodiments, the disclosure provides for the use of the coating compositions as an efficiency enhancement aid in treatment of transparent surfaces that require regular cleaning to make them self-cleaning. For example, the coatings can be used in conjunction with glass used in windows, windshields, screens, architecture, goggles, eyeglasses, etc.

In other embodiments, the disclosure provides for the use of the coating compositions as an efficiency enhancement aid in photovoltaic solar module assemblies (e.g., the outer cover of solar modules) by the provision of anti-reflection benefits and/or by the provision of anti-soiling benefits to augment the anti-reflection benefits. These devices convert solar energy into electrical energy and rely upon efficient absorption of photons, and effects such as reflection, scattering, and loss of absorption due to adsorbed soil or dirt particles can lead to reduced power output. As noted, the coatings of this disclosure when coated onto a glass surface reduces reflection of photons (the so-called anti-reflective property) and also reduces adsorption and binding of dirt, soil, and other particulate matter from the environment to boost the transmission of photons through the glass as well as to prevent reduction in photons associated with deposition of particulate matter onto the surface.

The coatings for solar module applications provide unique challenges that are not present with coatings typically utilized in other common applications. The use of anti-reflective coating in solar modules necessitates long term exposure of solar radiation that usually results in extensive degradation of polymeric materials under prolonged UV exposure due to photolytic breakdown of bonds in these materials. The coating compositions of the present disclosure utilize silane precursors that when hydrolyzed, condensed and cured give rise to a network that is similar to glass with Si—O—Si bonds that are stable to radiative breakdown. An additional advantage of using silica based materials in solar applications is the intrinsic hardness of the material that makes the coating resistant to scratches, indentations, and abrasion. Further, the coatings of the present disclosure provide for enhanced light transmittance across the entire solar region from about 350 nm to about 1150 nm, which is desirable for solar applications.

Further, the siloxane polymer mixture resulting from the coating compositions of this disclosure do not need to be applied to the solar modules during manufacturing and may be applied after manufacturing to avoid any interference with the solar module manufacturing process. It is expected that the solar module maker themselves may be able to use the composition of this disclosure to coat the modules at appropriate points within their manufacturing process. In such instances, the provision of a stable siloxane polymer mixture, that can be used according to the methods described herein, provides a direct means for the applying the coating mixture after manufacture of the modules or even after final installation of the modules. This may streamline the manufacturing process and enhance the economic value of existing modules, either existing inventory or modules already installed and in use, to which the coatings can be applied.

In one embodiment, the process of coating the solar modules consists of preparing the module surface, coating the surface with the final siloxane polymer mixture made in accordance with the present disclosure, drying the coating under ambient conditions, and curing the dried modules at elevated temperature. The module surface is prepared by polishing the module with a cerium oxide slurry, followed by washing the module with water, and drying it under ambient temperature-pressure conditions for a period ranging from about 10 hours to about 12 hours.

Once the module surface is prepared, in one embodiment, the final siloxane polymer mixture of the present disclosure is deposited onto solar modules by means of a flow coater. The siloxane polymer mixture is deposited onto the modules via gravitational free flow of the liquid siloxane polymer mixture from top to bottom. The solar modules are placed on the mobile platform that moves at a rate that is optimal for the free flow of the siloxane polymer mixture without introducing break points in the liquid stream or introducing turbulent flow. The rate of liquid flow and the rate of movement of platform carrying the solar module are optimized for deposition of uniform, crack-free coatings that are homogenous, free of deformities, and characterized by uniform thickness.

More specifically, in one embodiment, the module is placed on a mobile stage that is connected to a computer and programmed to move at a speed ranging, in some embodiments, from about 0.05 cm/s to about 300 cm/s, in other embodiments from about 0.1 cm/s to about 10 cm/s, and in other embodiments from about 0.25 cm/s to about 0.5 cm/s. The siloxane polymer mixture is then deposited onto the module surface using a computer controlled nozzle dispensing unit such that the rate of flow of siloxane polymer mixture is, in some embodiments, from about 5 ml/min to about 50 ml/min, in other embodiments from about 5 ml/min to about 25 ml/min, and in other embodiments from about 10 ml/min to about 15 ml/min. The rate at which the siloxane polymer mixture is deposited is important for proper deposition of the coatings. Notably, the nozzle diameter of the sol can be adjusted to ensure appropriate flow rate, with diameters of the nozzle ranging from about 0.3 mm to about 0.9 mm.

A particularly advantageous aspect of using a siloxane polymer mixture is that it is in a liquid state but is also viscous enough to spread without breakdown of the stream. The uniformity of the coatings is further ensured by adjusting the flow rate and the rate of the movement of the platform containing the solar modules. For a given flow rate of the siloxane polymer mixture, if the rate of the movement of the platform is too fast then it leads to rupture of the siloxane polymer mixture stream causing uneven coatings. For a given flow rate of the siloxane polymer mixture, if the rate of the movement of the platform is too slow it results in excessive flow and material build up that deteriorates the uniformity of the films. Therefore, a specific optimum of siloxane polymer mixture flow rate and the platform movement are important to provide even, uniform, and homogenous coatings. The use of specific pH, solvent, and silane concentrations as outlined above provide the ideal viscosities.

The coating process is also facilitated by the evaporation of the solvent during the flow of the siloxane polymer mixture onto the panel, which also affects the development of uniform films or coatings on the module surface. The coatings are formed when the free flowing siloxane polymer mixture dries on the surface and forms a solid on the glass surface. More specifically, the bottom edge of the sol represents the leading wet line while drying occurs at the top edge. As the solvent evaporates, the siloxane polymer mixture becomes more viscous and finally sets at the top edge while the bottom edge is characterized by liquid edge spreading. The spreading liquid at the bottom edge enables the free flow of the siloxane polymer mixture while the setting siloxane polymer mixture at the top edge fixes the materials and prevents formation of lamellar structures. A balance of these factors is important for formation of uniform films.

The flow coating method does not allow seepage of the siloxane polymer mixture into the internal parts of the solar module assembly as the excess siloxane polymer mixture can be collected into a container at the bottom of the assembly and recycled. Similarly, it does not facilitate corrosion and/or leaching of the chemicals from the interior of the solar module assembly. The flow coater method exposes only the glass side to the siloxane polymer mixture while the other side of the module assembly, which may contain with electrical contacts and leads does not come into any contact with the liquid siloxane polymer mixture. As such, the flow coating process is particular beneficial to coating solar modules during either the assembly or the post-assembly stages.

The methods described here can be used to coat solar modules of variable sizes and in variable configurations. For example, typical modules have the dimensions of about 1 m×1.6 m, which can be coated either in portrait configuration or landscape configurations mode via appropriate placement in the mobile platform.

The flow coater can be used to coat the modules at the rate of about 15-60 modules per hour. The rate of coating of individual modules would depend upon the size of the modules and whether they are coated in the portrait mode or landscape orientation. Additionally, multiple coaters operating in parallel, or a single coater that runs along the entire length can be used in conjunction with the module assembly line to increase the production rate.

After depositing the coating, the module is dried for a period ranging from about 1 minute to about 20 minutes or longer under ambient conditions. The coated module is then cured using any of the techniques for curing described above, after which the coated module is ready for use.

The anti-reflecting coatings described herein increase the peak power of the solar cells by approximately 3% due to the anti-reflective property. In addition, it is estimated that the anti-soiling property would contribute to minimize transmissive losses associated with accumulation of dirt on the modules. Typical soiling losses are estimated at about 5% and use of these coatings is expected to reduce the losses in half.

EXAMPLES

The following describes various aspects of the coatings made according to certain embodiments of the disclosure in connection with the Figures. These examples should not be viewed as limiting. The general procedure used for the preparation of sol from a two-part process of acid catalyzed hydrolysis of organosilane, alkoxysilane and/or organofluorosilane is described as follows:

In Method I, in the first part of a two-part process, a first sol called Sol I is prepared by charging a 500 ml flask with deionized water (DIW), hydrochloric acid (HCl), optional additive(s) and IPA, then stirring at 100 rpm at room temperature for one minute followed by addition of methyltrialkoxysilane, then stirring at about 100 rpm at room temperature for 30 minutes. A second sol called Sol II is prepared by charging a 500 ml flask with DIW, HCl and IPA, then stirring at 100 rpm for one minute followed by addition of (3,3,3 trifluoropropyl)-trimethoxysilane, then stirring at about 100 rpm at room temperature for 30 minutes. In the second part of the two-part process, Sol I and Sol II are combined and tetraalkoxysilane is added to this mixture and stirred for 30 minutes at about 100 rpm at room temperature. The final sol mixture is aged for 48 hours at room temperature and then characterized by GPC and NMR.

In Method II, in the first part of a two-part process, a 500 ml flask is charged with DIW, HCl, optional additive(s), and IPA, then stirred at 100 rpm at room temperature for one minute followed by addition of methyltrialkoxysilane, then stirred at about 100 rpm at room temperature for 30 minutes. In the second part of the two-part process, tetraalkoxysilane is added to this mixture and stirred for 30 minutes at about 100 rpm at room temperature. The final sol mixture is aged for 48 hours at room temperature and then characterized by GPC and NMR.

In Method III, in the first part of a two-part process, a 500 ml flask is charged with DIW, HCl, optional additive(s), and IPA, then stirred at 100 rpm at room temperature for one minute followed by addition of tetraalkoxysilane, then stirred at about 100 rpm at room temperature for 30 minutes. In the second part of the two-part process, methyltrialkoxysilane is added to this mixture and stirred for 30 minutes at about 100 rpm at room temperature. The final sol mixture is aged for 48 hours at room temperature and then characterized by GPC and NMR.

In Method IV, in the first part of a two-part process, a 500 ml flask is charged with DIW, HCl, optional additive(s), and IPA, then stirred at 100 rpm at room temperature for one minute followed by addition of tetraalkoxysilane then stirred at about 100 rpm at room temperature for 30 minutes. In the second part of the two-part process, a mixture of (3,3,3 trifluoropropyl)-trimethoxysilane and methyltrialkoxysilane is added and stirred for 30 minutes at about 100 rpm at room temperature. The final sol mixture is aged for 48 hours at room temperature and then characterized by GPC and NMR.

In an embodiment referred to as Example 1, following Method I, Sol I is prepared by charging a 500 mL flask with 177 g of IPA and 25 g of 0.04 M HCl. After stirring at 100 rpm at room temperature for one minute, 2.87 g (0.021 moles) of methyltrimethoxysilane is added to the mixture. The mixture is stirred at room temperature for 30 minutes. Sol II is prepared by charging a 500 mL flask with 177 g of IPA and 25 g of 0.04 M HCl. After stirring at 100 rpm at room temperature for one minute, 3.71 g (0.021 moles) of (3,3,3-trifluoropropyl)-trimethoxysilane is added to the mixture. The mixture is stirred at room temperature for 30 minutes. Sol I and II are mixed together followed by addition of 6.39 g (0.042 moles) of tetramethoxysilane. The final mixture is stirred at room temperature for 30 minutes. This mixture is allowed to age under ambient conditions for 24 hours up to 120 hours. After aging the sol formulation, 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes.

Figure 4:
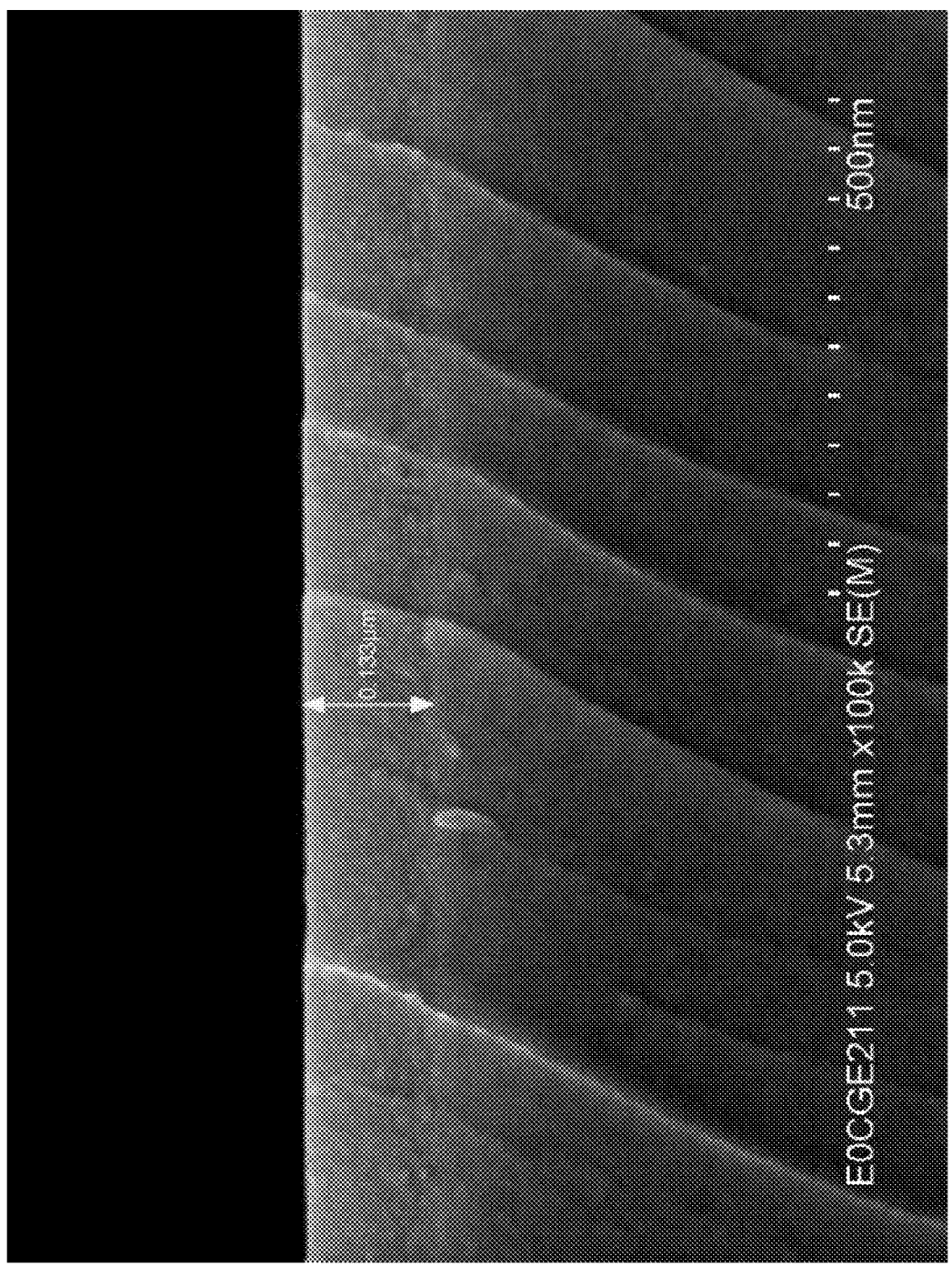
FIG. 4 is an SEM cross-sectional view of a coating made from the composition of Example 2 on a 30×30 cm glass substrate.
Figures 2, 7A:
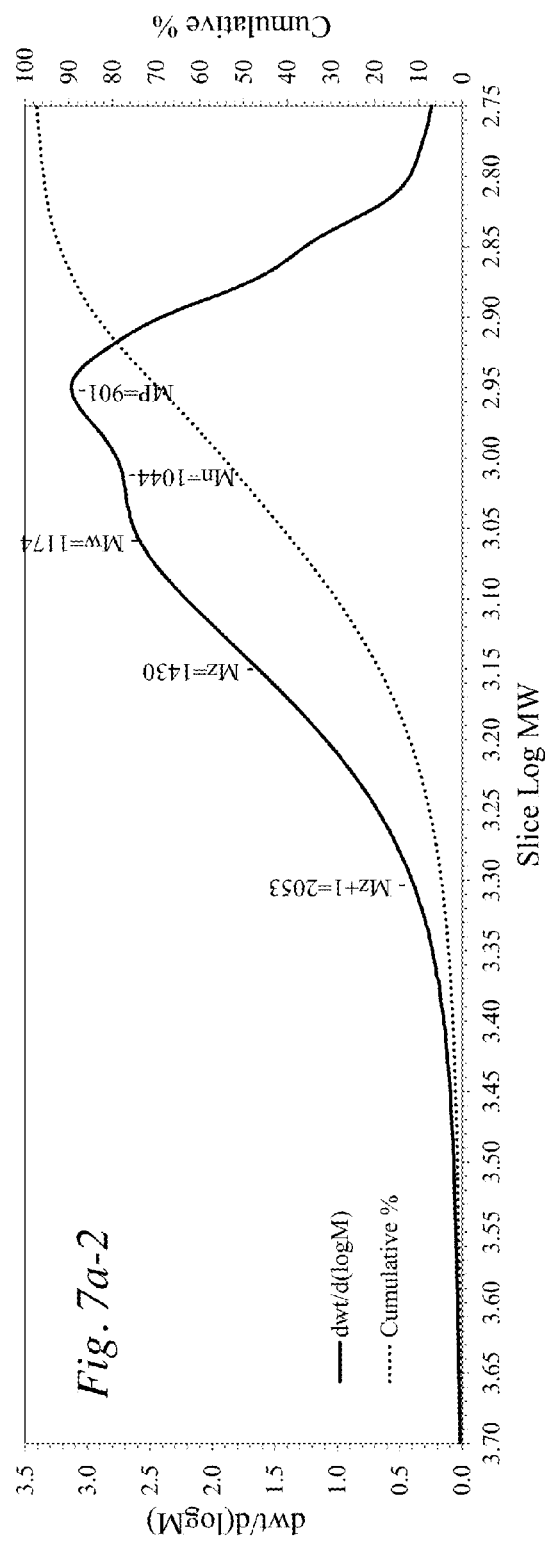
Figure 21:
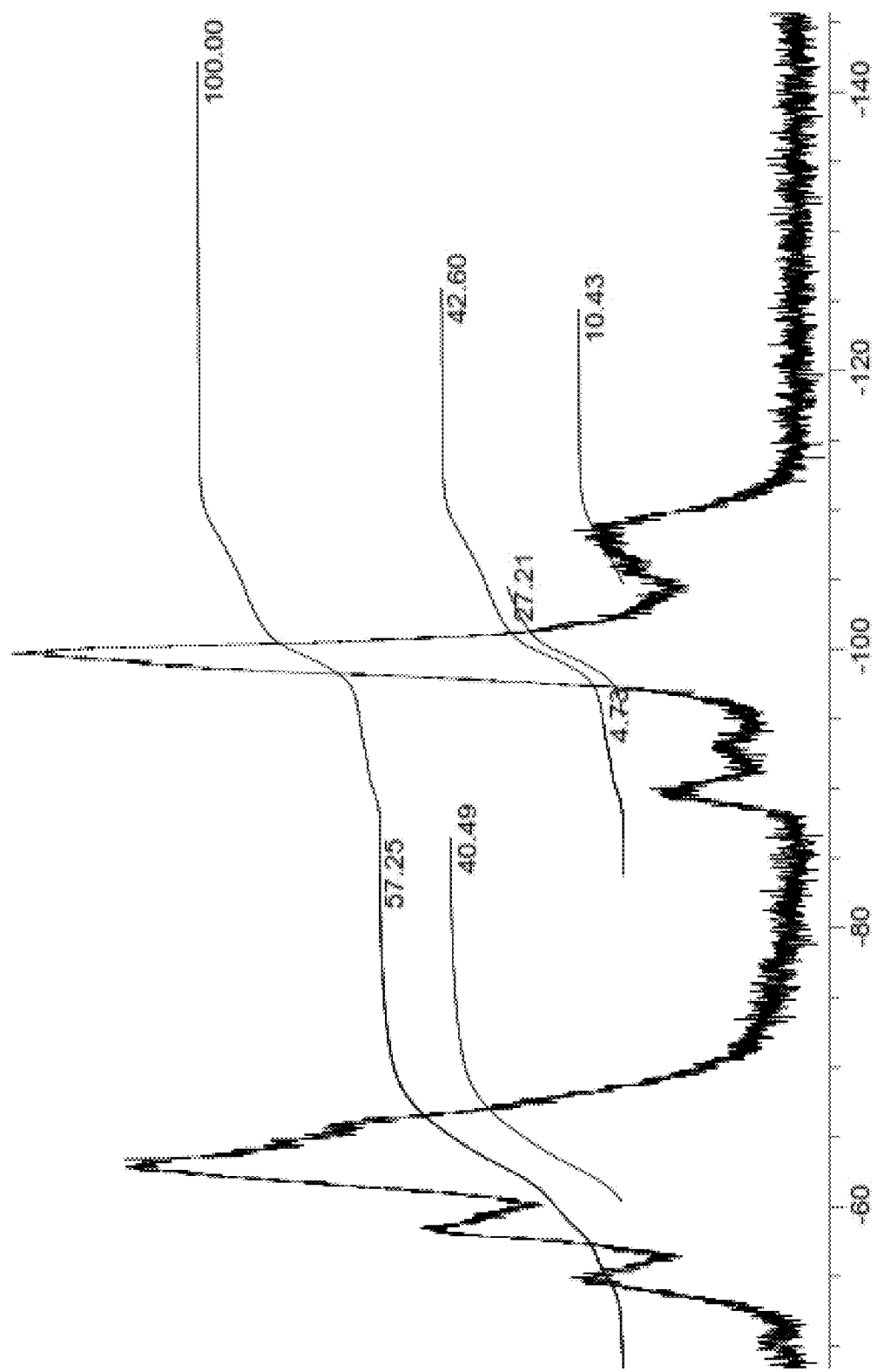
FIGS. 21 and 22 depicts Si-NMR spectra of example 2 and 3 respectively.

In an embodiment referred to as Example 2, following Method I, Sol I is prepared by charging a 500 mL flask with 177 g of IPA and 25 g of 0.04 M HCl. After stirring at 100 rpm at room temperature for one minute, 2.87 g (0.021 moles) of methyltrimethoxysilane is added to the mixture. The mixture is stirred at room temperature for 30 minutes. Sol II is prepared by charging a 500 mL flask with 177 g of IPA and 25 g of 0.04 M HCl. After stirring at 100 rpm at room temperature for one minute, 3.71 g (0.021 moles) of (3,3,3-trifluoropropyl)-trimethoxysilane is added to the mixture. The mixture is stirred at room temperature for 30 minutes. Sol I and II are mixed together followed by addition of 8.8 g (0.042 moles) of tetraethoxysilane. The final mixture is stirred at room temperature for 30 minutes. This mixture is allowed to age under ambient conditions for 48 hours. The GPC test of the final sol produced molecular weight of Mw=1,174 g/mol with polydispersity PD=1.13. After aging the sol formulation, 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. Typical GPC results are shown in FIGS. 7a-1 and 7a-2 and the Si-NMR results are shown in FIG. 21. An SEM cross-section of a representative sample of cured film from example 2 is shown in FIG. 4.

Figure 3A:
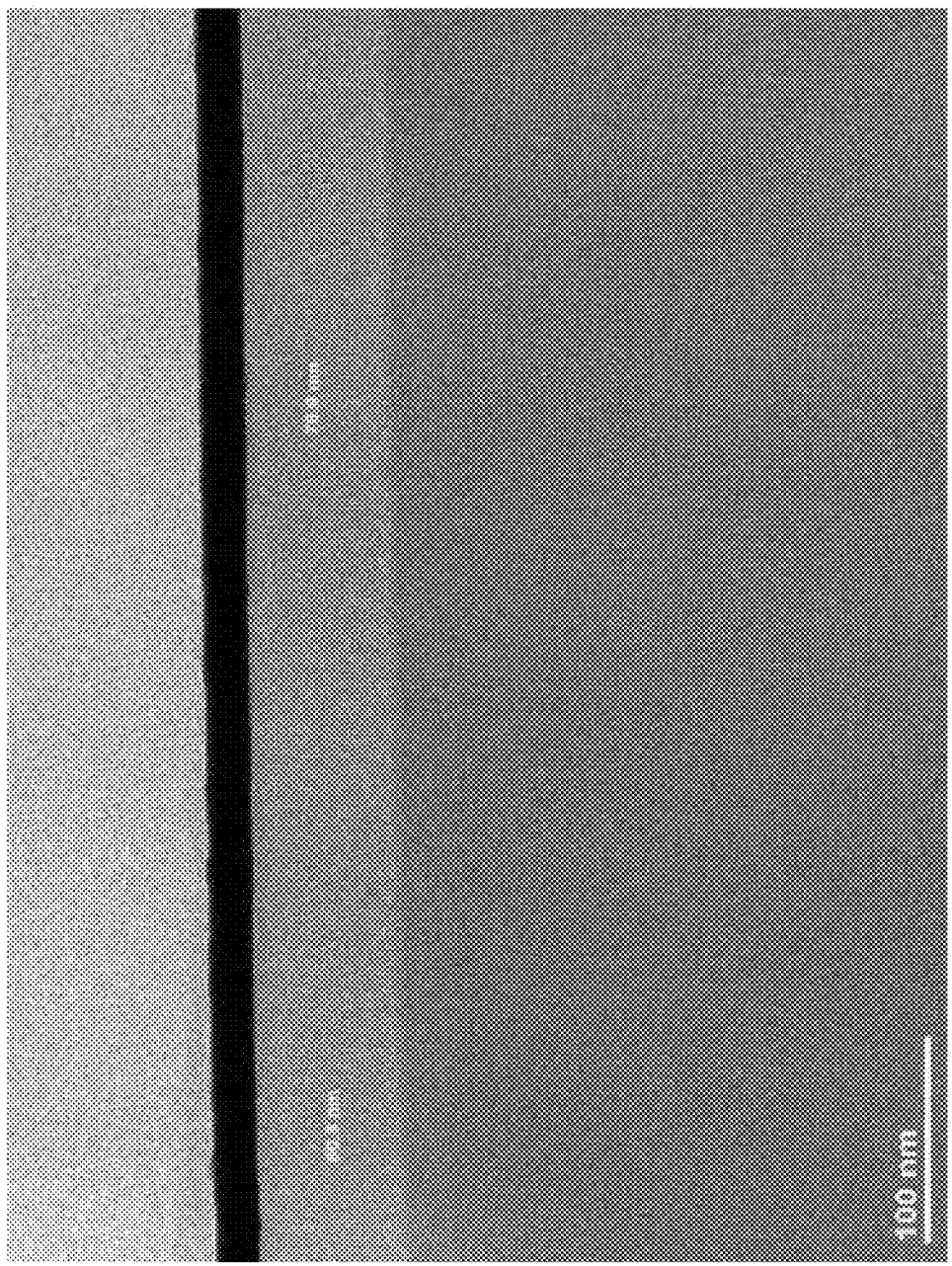
FIG. 3a is TEM cross-sectional view of a coating made from the composition of Example 2 on a glass slide substrate.

A TEM cross-section of a representative sample of the dried and cured film from Example 2 is shown in FIG. 3a. TEM cross-section and the High Resolution TEM of the film from Example 2 show no evidence of long range order within the film. The film morphology at a scale 5 nm shows little evidence of porosity.

Figure 5:
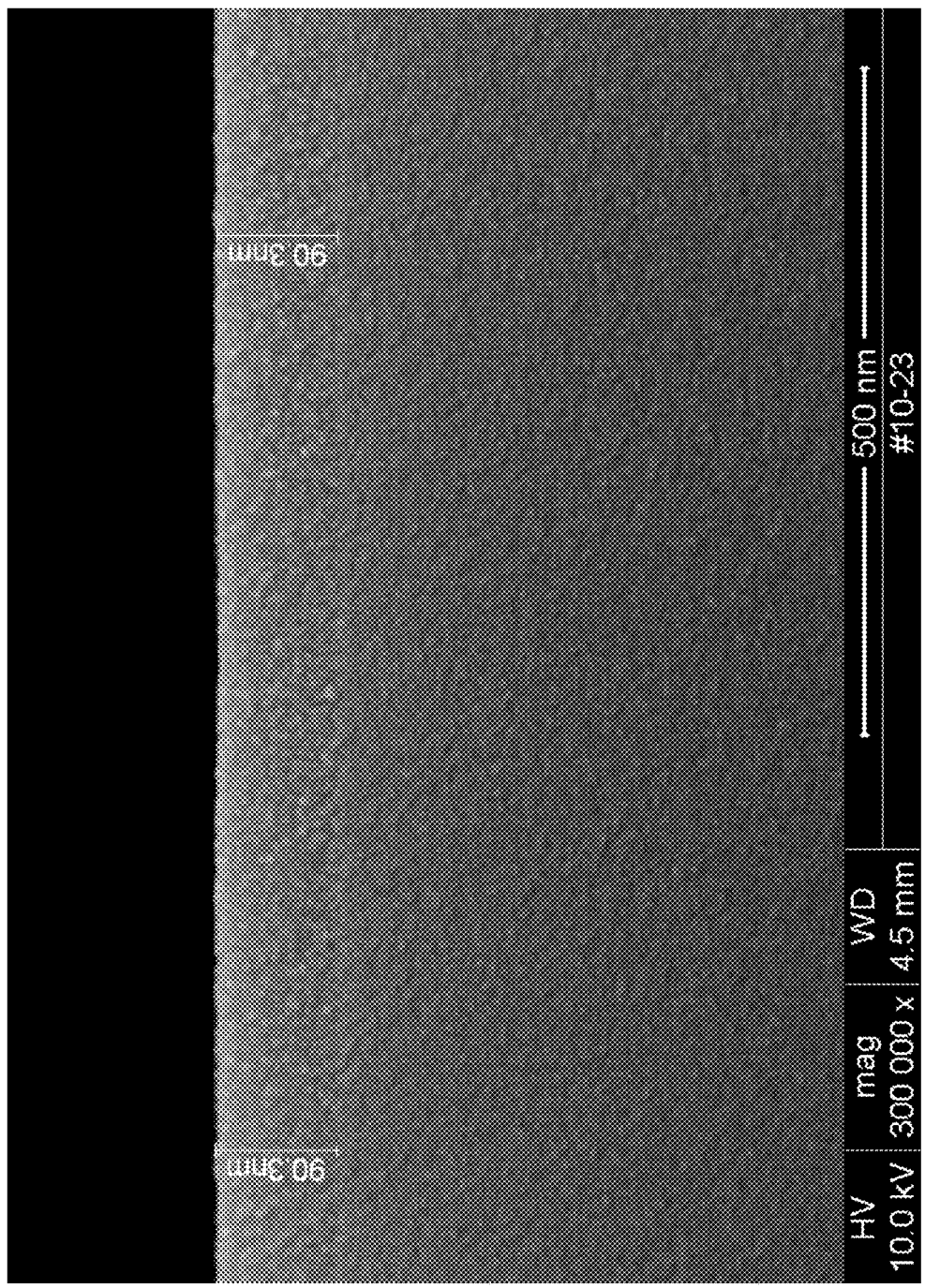
FIG. 5 is an SEM cross-sectional view of a coating made from the composition of Example 3 on a 30×30 cm glass substrate.
Figure 22:
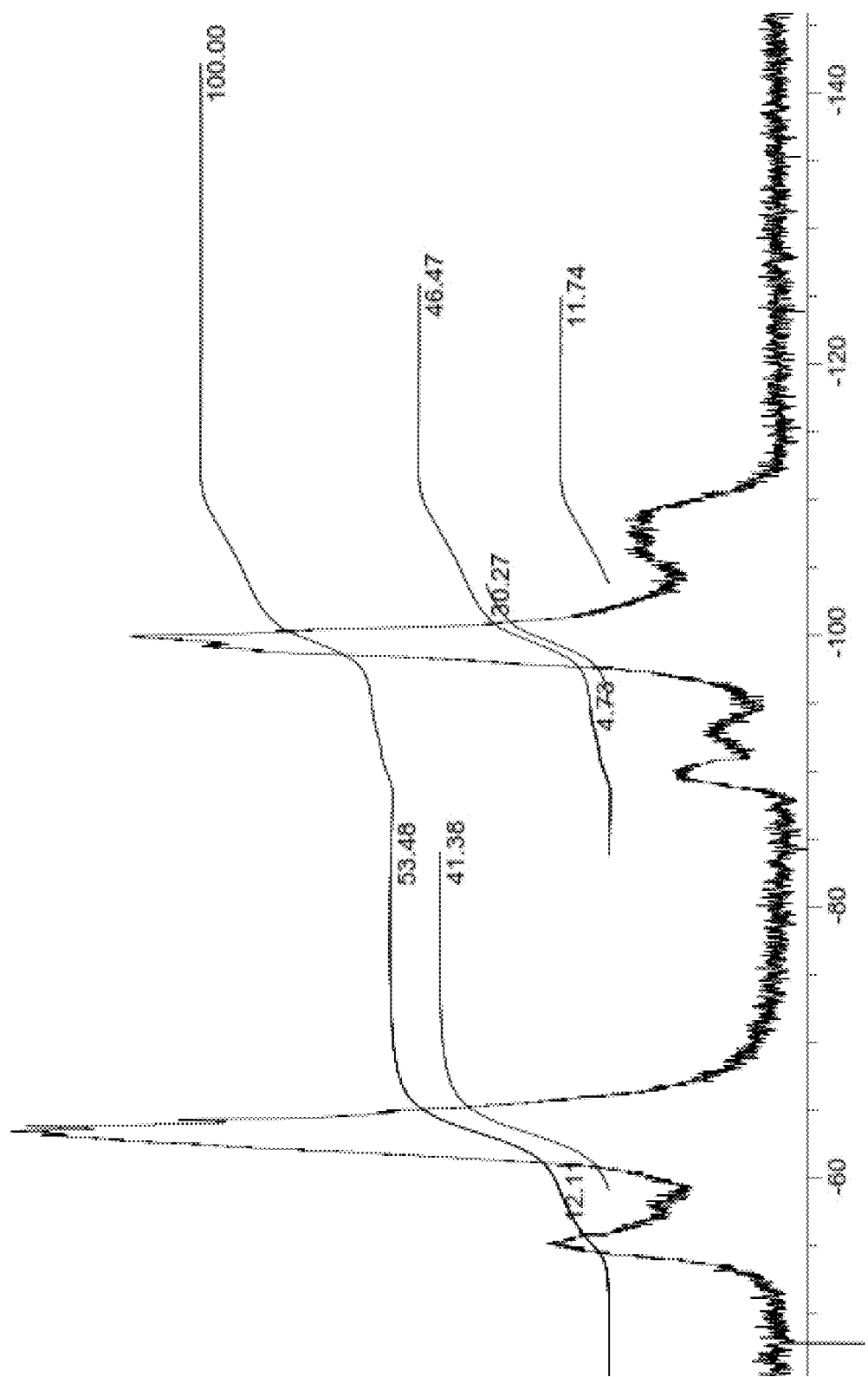

In an embodiment referred to as Example 3, following Method II the sol is prepared by charging a 500 mL flask with 354 g of IPA and 50 g of 0.04 M HCl. After stirring at 100 rpm at room temperature for one minute, 4.37 g (0.0321 moles) of methyltrimethoxysilane is added to the mixture. The mixture is stirred at room temperature for 30 minutes followed by addition of 7.08 g (0.034 moles) of tetraethoxysilane. The final mixture is stirred at room temperature for 30 minutes. This mixture is allowed to age under ambient conditions for 48 hours. The GPC test of the final sol produced molecular weight of Mw=902 g/mol with polydispersity PD=1.14. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7b-1 and 7b-2, and NMR results are shown in FIG. 22. SEM cross-section of a representative sample of cured film from Example 3 is shown in FIG. 5.

Figure 6:
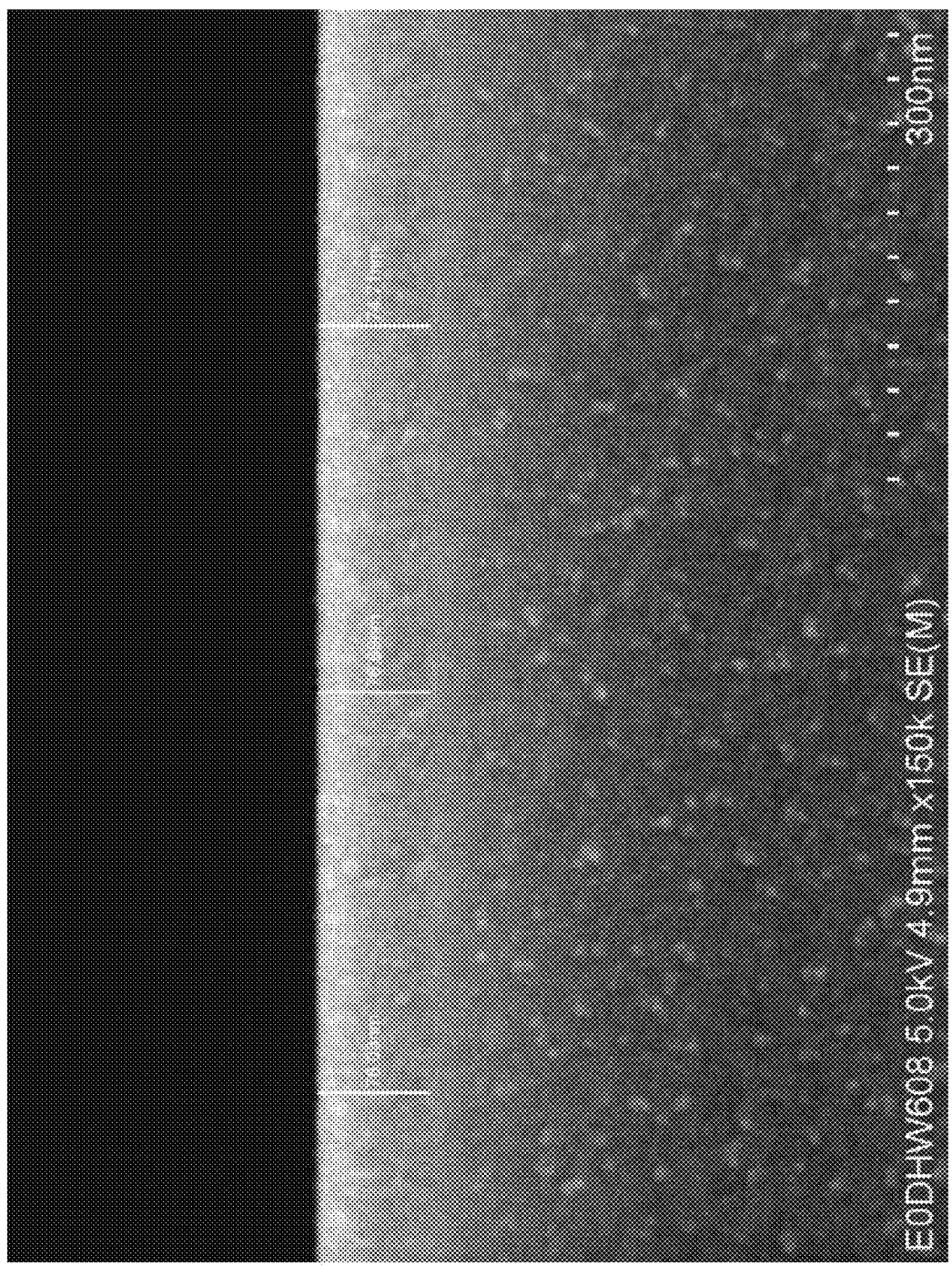
FIG. 6 is an SEM cross-sectional view of a coating made from the composition of Example 4 on a 30×30 cm glass substrate.
Figures 1, 7C:
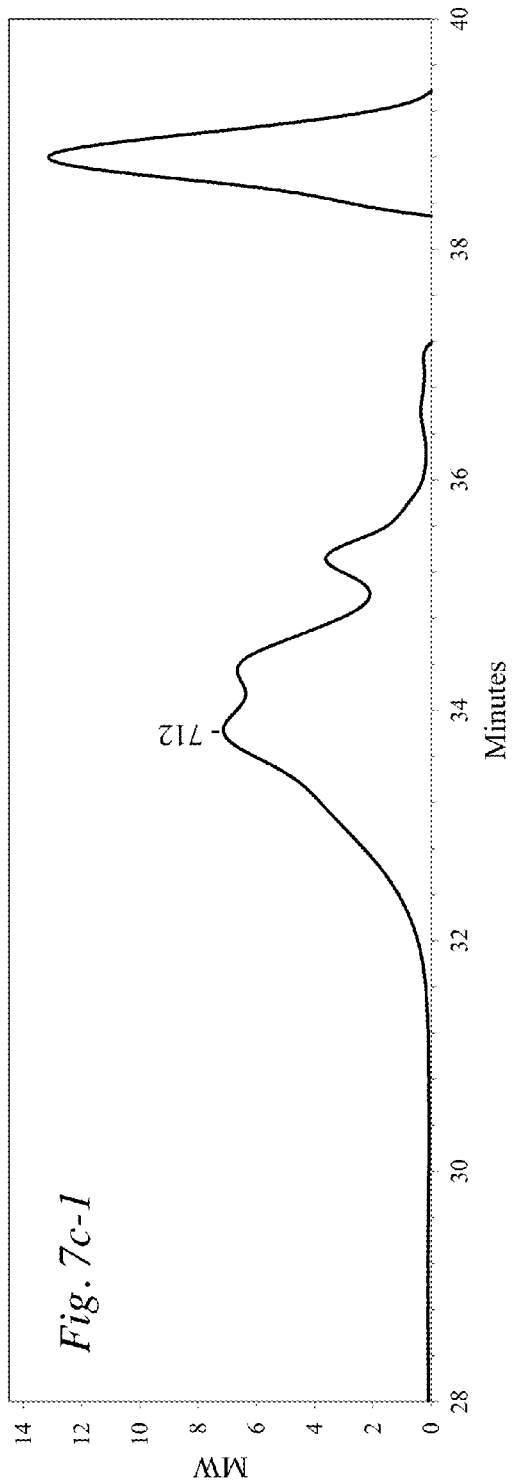
Figures 2, 7C:
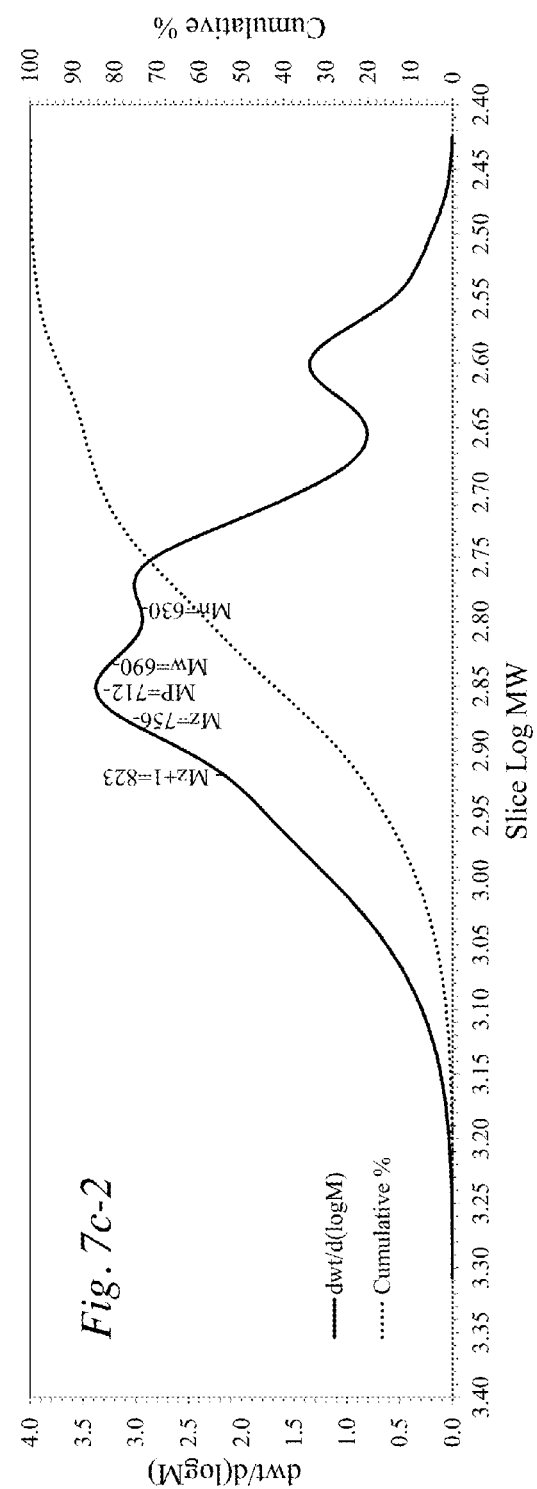

In an embodiment referred to as Example 4, following Method I, Sol I is prepared by charging a 500 mL flask with 177 g of IPA and 25 g of 0.04 M HCl. After stirring at 100 rpm at room temperature for one minute, 2.63 g (0.0193 moles) of methyltrimethoxysilane is added to the mixture. The mixture is stirred at room temperature for 30 minutes. Sol II is prepared by charging a 500 mL flask with 177 g of IPA and 25 g of 0.04 M HCl. After stirring at 100 rpm at room temperature for one minute, 0.284 g (0.0013 moles) of (3,3,3-trifluoropropyl)-trimethoxysilane is added to the mixture. The mixture is stirred at room temperature for 30 minutes. Sol I and II are mixed together followed by addition of 6.24 g (0.03 moles) of tetraethoxysilane. The final mixture is stirred at room temperature for 30 minutes. This mixture is allowed to age under ambient conditions for 48 hours. The GPC test of the final sol produced molecular weight of Mw=690 g/mol with polydispersity PD=1.10. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7c-1 and 7c-2. SEM cross-section of a representative sample of cured film from Example 4 is shown in FIG. 6.

In an embodiment referred to as Example 5, following Method I, Sol I is prepared by charging a 500 mL flask with 177 g of IPA and 25 g of 0.04 M HCl. After stirring at 100 rpm at room temperature for one minute, 2.39 g (0.01753 moles) of methyltrimethoxysilane is added to the mixture. The mixture is stirred at room temperature for 30 minutes. Sol II is prepared by charging a 500 mL flask with 177 g of IPA and 25 g of 0.04 M HCl. After stirring at 100 rpm at room temperature for one minute, 0.399 g (0.00262 moles) of (3,3,3-trifluoropropyl)-trimethoxysilane is added to the mixture. The mixture is stirred at room temperature for 30 minutes. Sol I and II are mixed together followed by addition of 6.24 g (0.03 moles) of tetraethoxysilane. The final mixture is stirred at room temperature for 30 minutes. This mixture is allowed to age under ambient conditions for 48 hours. The GPC test of the final sol produced molecular weight of Mw=1,190 g/mol with polydispersity PD=1.21. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7d-1 and 7d-2.

Figures 1, 7E:
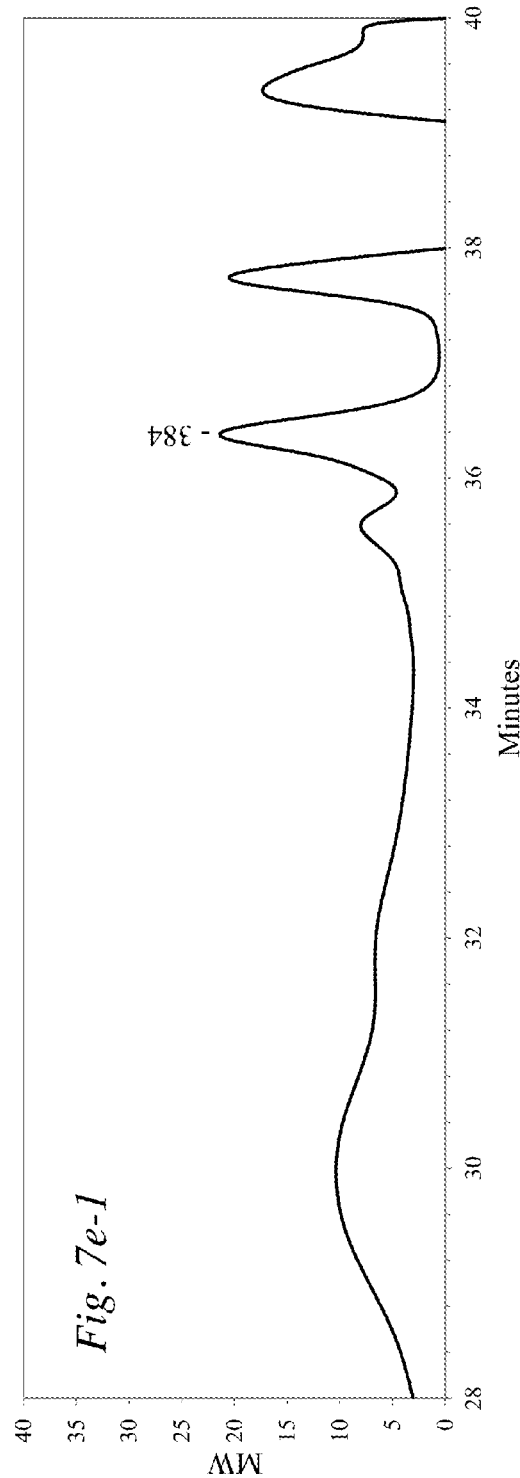
Figures 2, 7E:
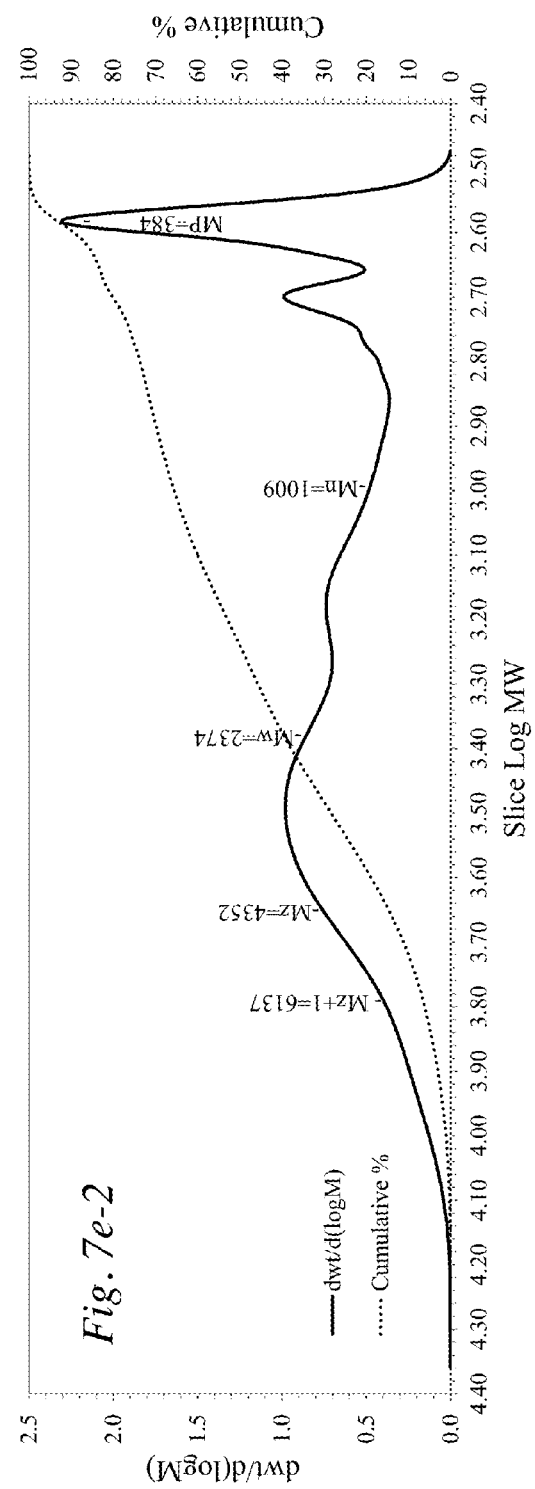

In an embodiment referred to as Example 6, following Method I, sol I is prepared by charging a 500 mL flask with 177 g of IPA and 25 g of 0.04 M AcOH (acetic acid). After stirring at 100 rpm at room temperature for one minute, 2.32 g (0.017 moles) of methyltrimethoxysilane is added to the mixture. The mixture is stirred at room temperature for 30 minutes. Sol II is prepared by charging a 500 mL flask with 177 g of IPA and 25 g of 0.08 M AcOH. After stirring at 100 rpm at room temperature for one minute, 3.71 g (0.017 moles) of (3,3,3-trifluoropropyl)-trimethoxysilane is added to the mixture. The mixture is stirred at room temperature for 30 minutes. Sol I and II are mixed together followed by addition of 7.08 g (0.034 moles) of tetraethoxysilane. The final mixture is stirred at room temperature for 30 minutes. This mixture is allowed to age under ambient conditions for 48 hours. The GPC test of the final sol produced molecular weight of Mw=2,374 g/mol with polydispersity PD=2.35. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7e-1 and 7e-2.

In an embodiment referred to as Example 7, following method II the sol is prepared by charging a 500 mL flask with 354 g of IPA and 50 g of 0.08 M AcOH. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=926 g/mol with polydispersity PD=1.32. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7f-1 and 7f-2.

Figures 1, 7G:
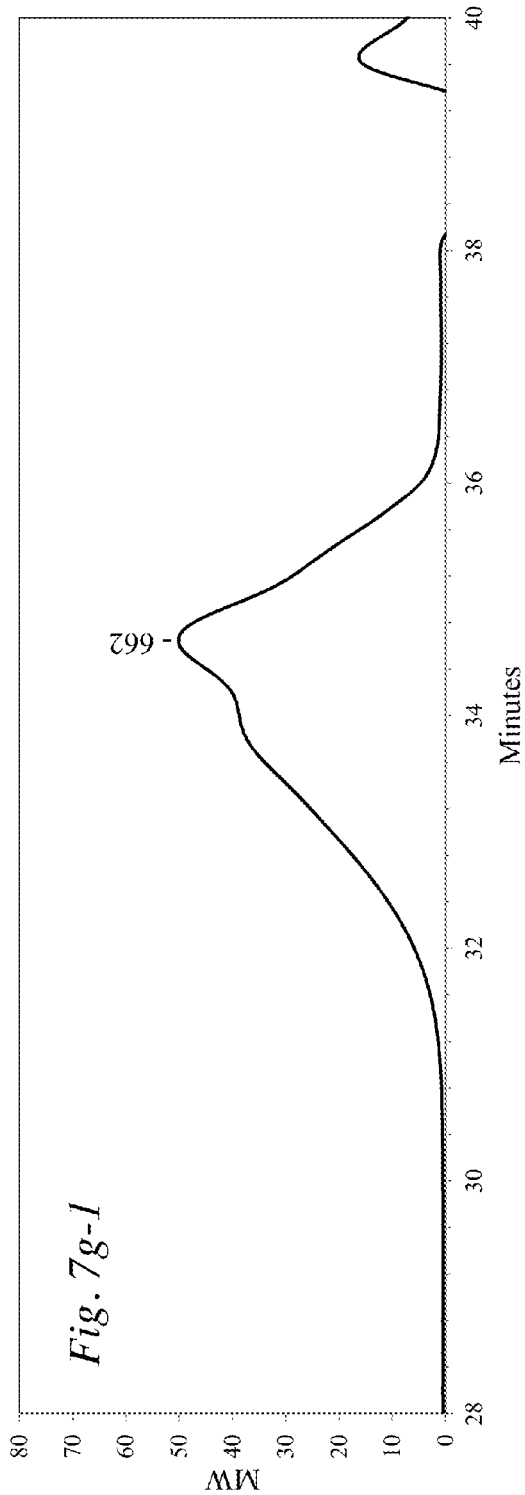
Figures 2, 7G:
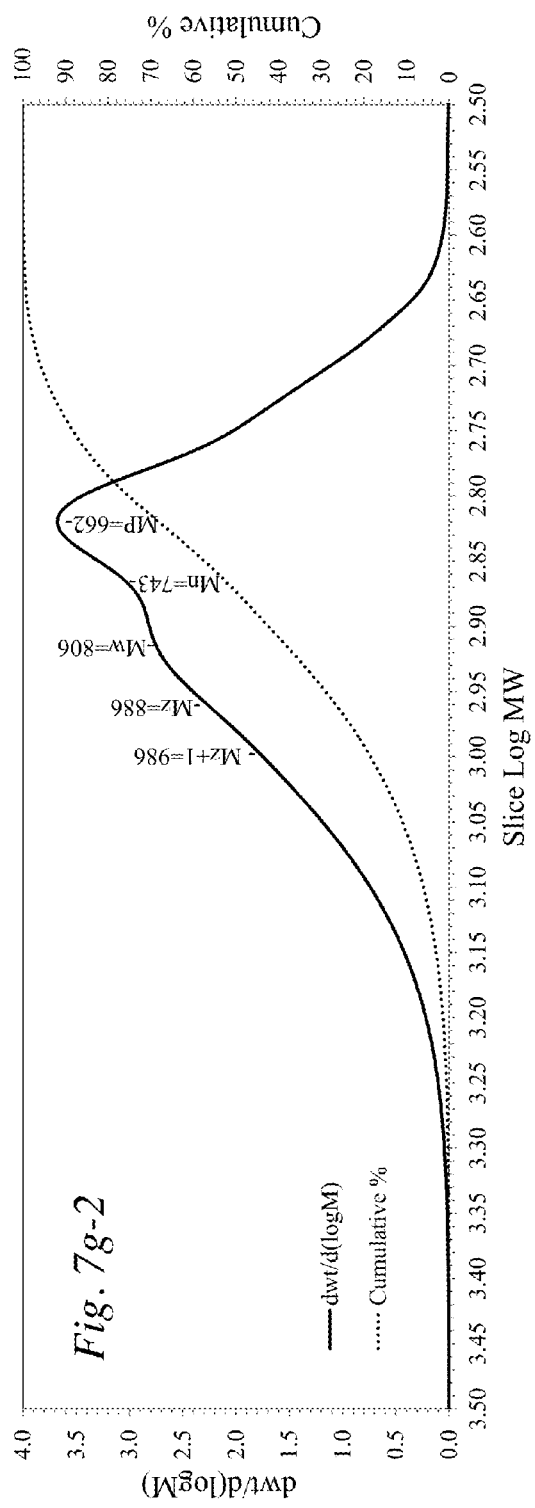

In an embodiment referred to as Example 8, following Method II the sol is prepared by charging a 500 mL flask with 354 g of IPA and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=806 g/mol with polydispersity PD=1.09. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7g-1 and 7g-2. FIG. 26 and FIG. 27 show the results of extended shelf life testing of 6 months aging at 20° C. and of 7 days aging at 40° C. respectively. The data shows this formulation has excellent shelf life stability.

Figures 1, 7H:
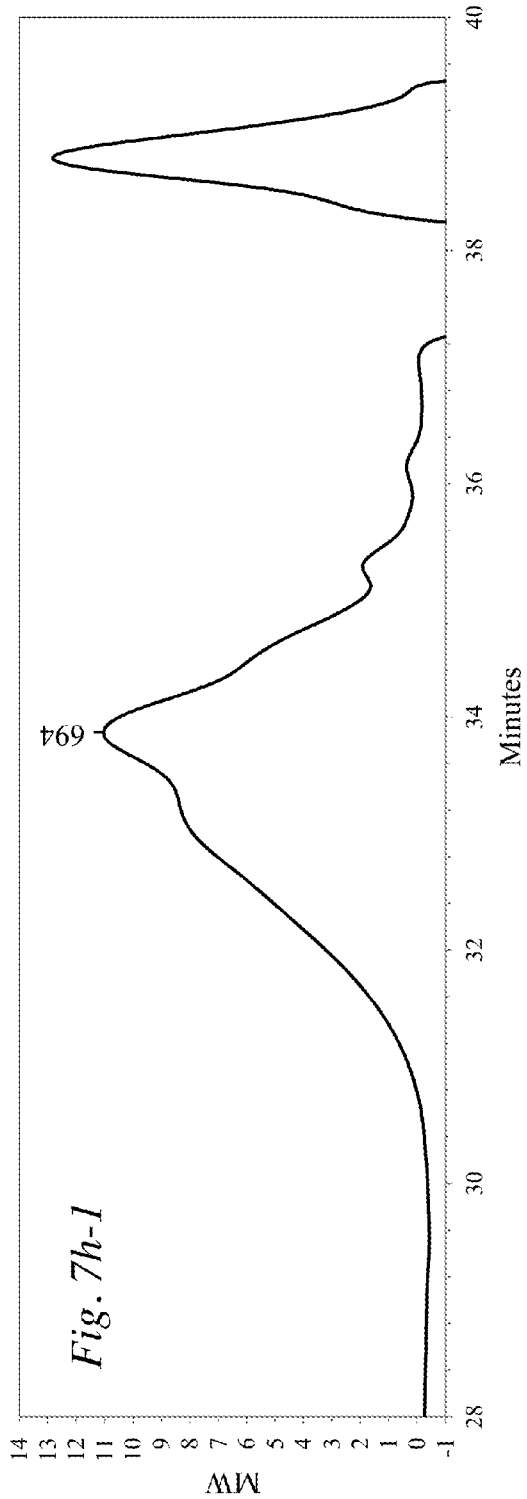
Figures 2, 7H:
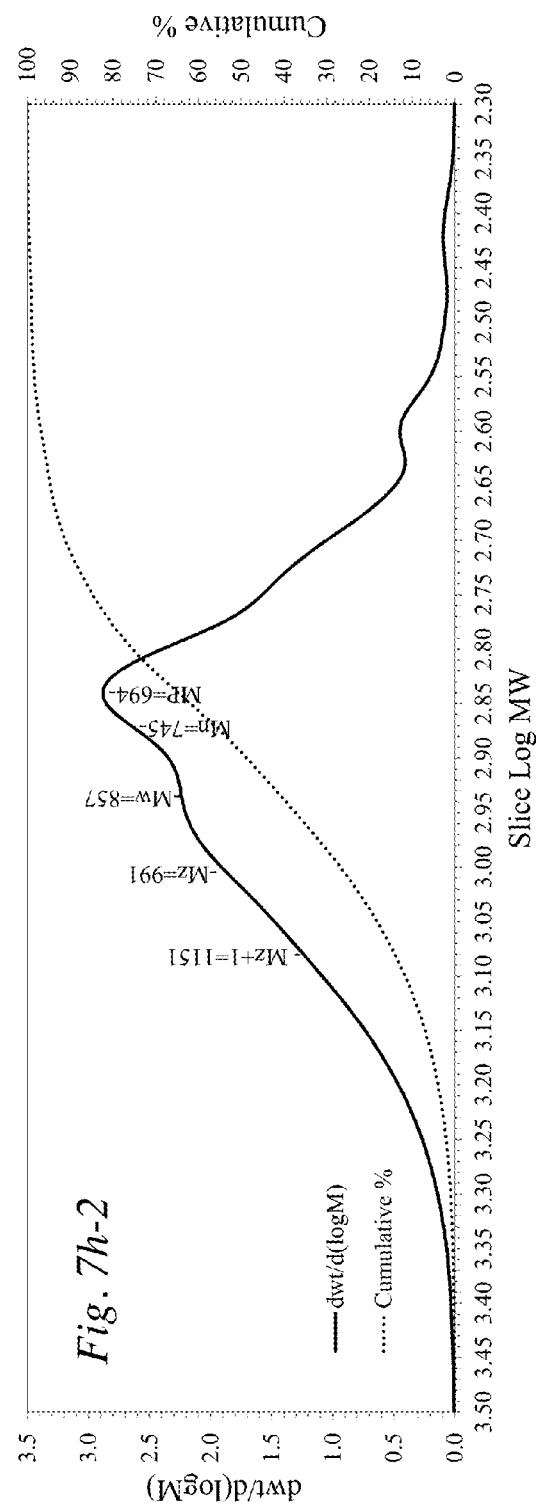

In an embodiment referred to as Example 9, following Method II the sol is prepared by charging a 500 mL flask with 354 g of IPA and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=857 g/mol with polydispersity PD=1.15. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7h-1 and 7h-2.

Figures 1, 7K:
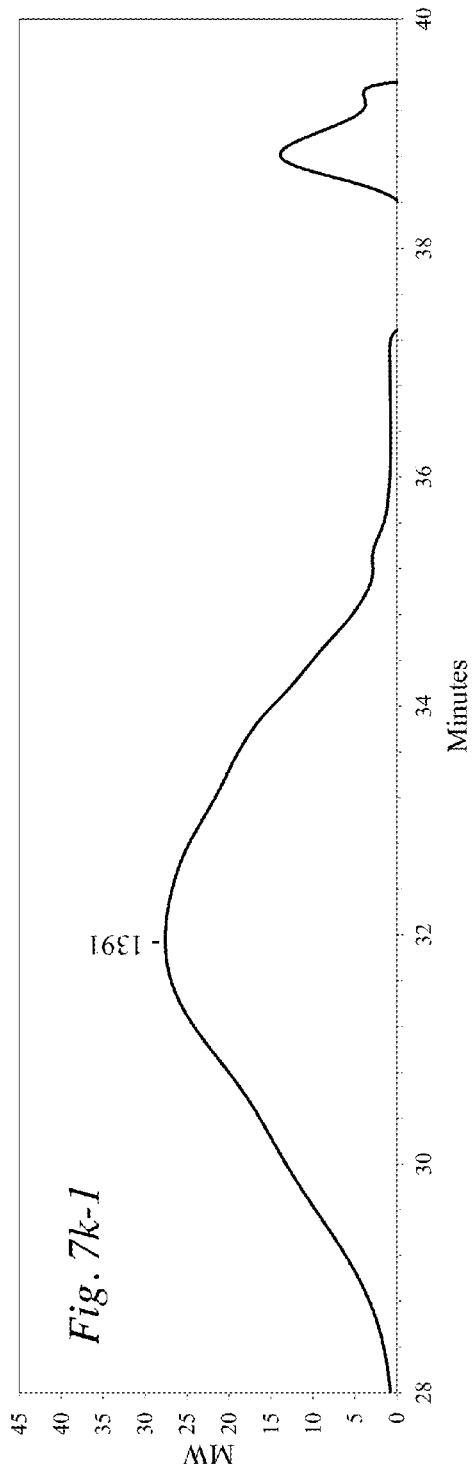
Figures 2, 7K:
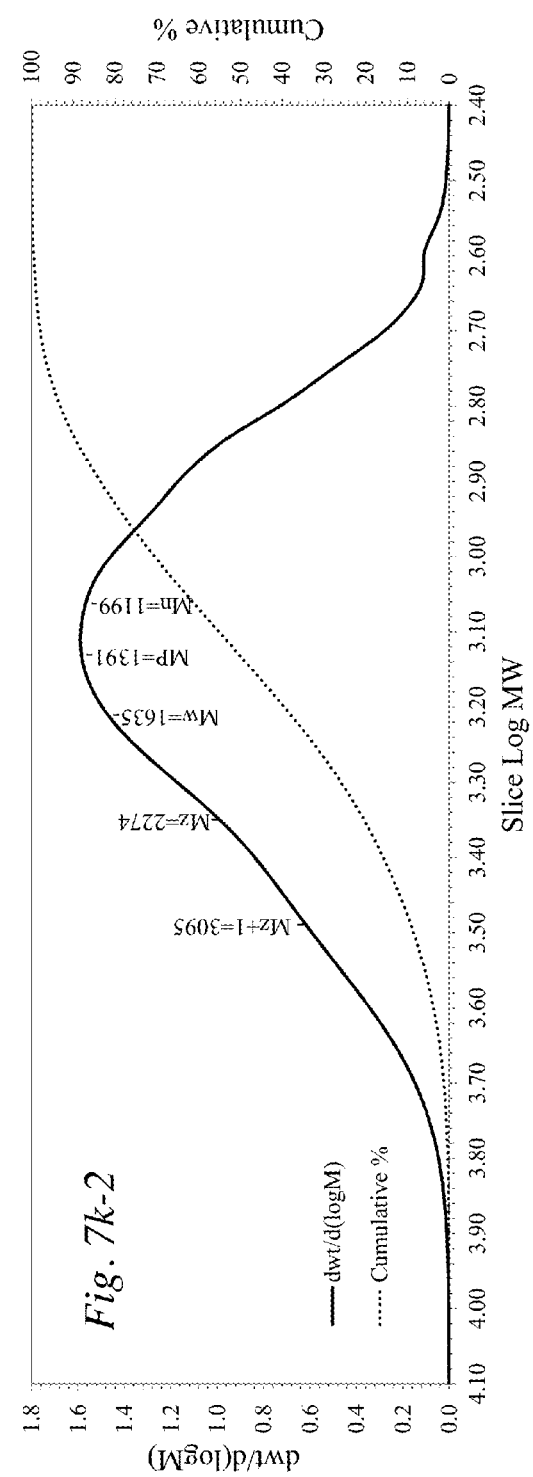
Figure 8A:
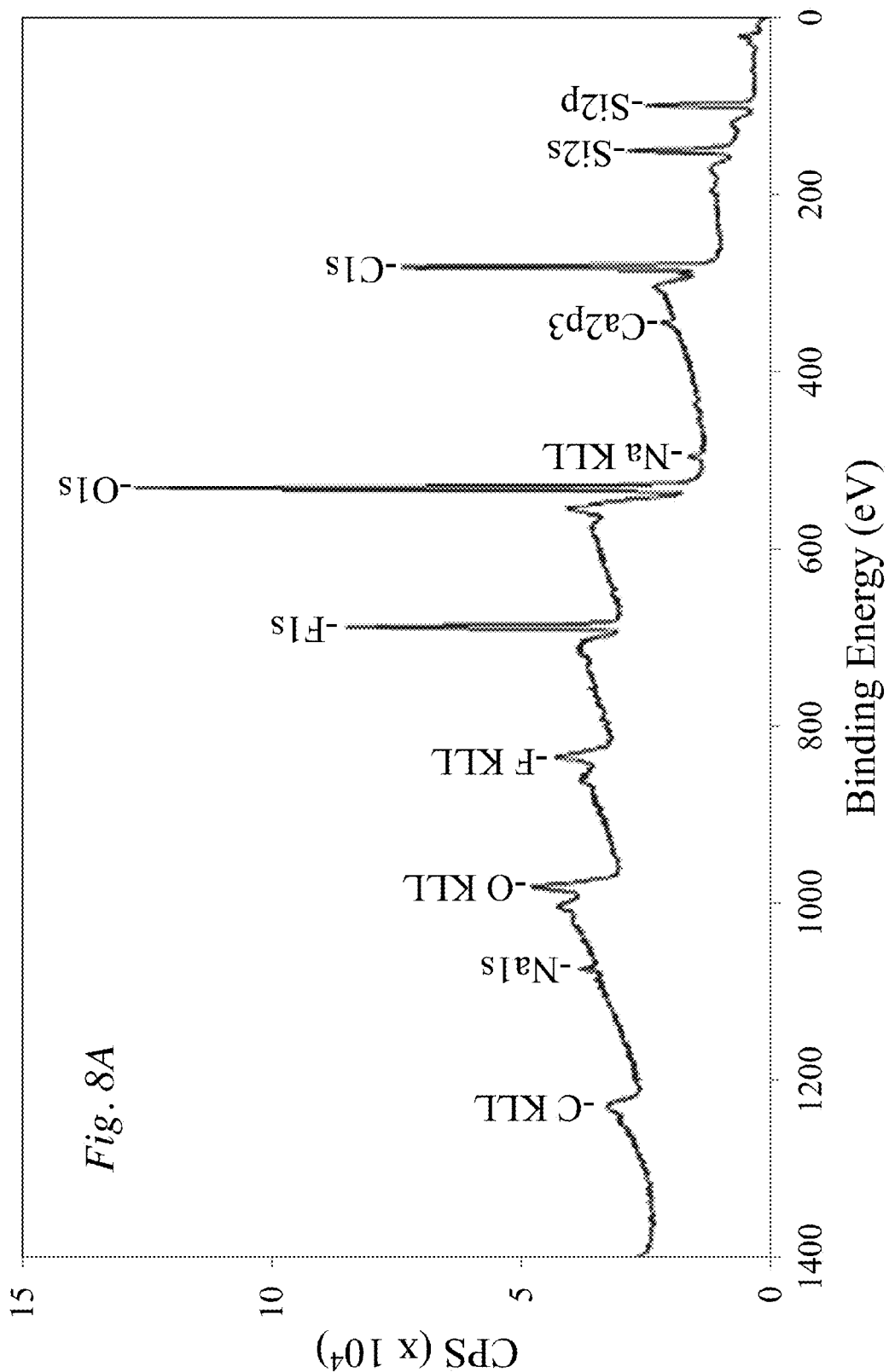
FIG. 8a is the XPS spectrum of coating from Example 2 on tin side of TC of TCO coated glass.
Figure 8B:
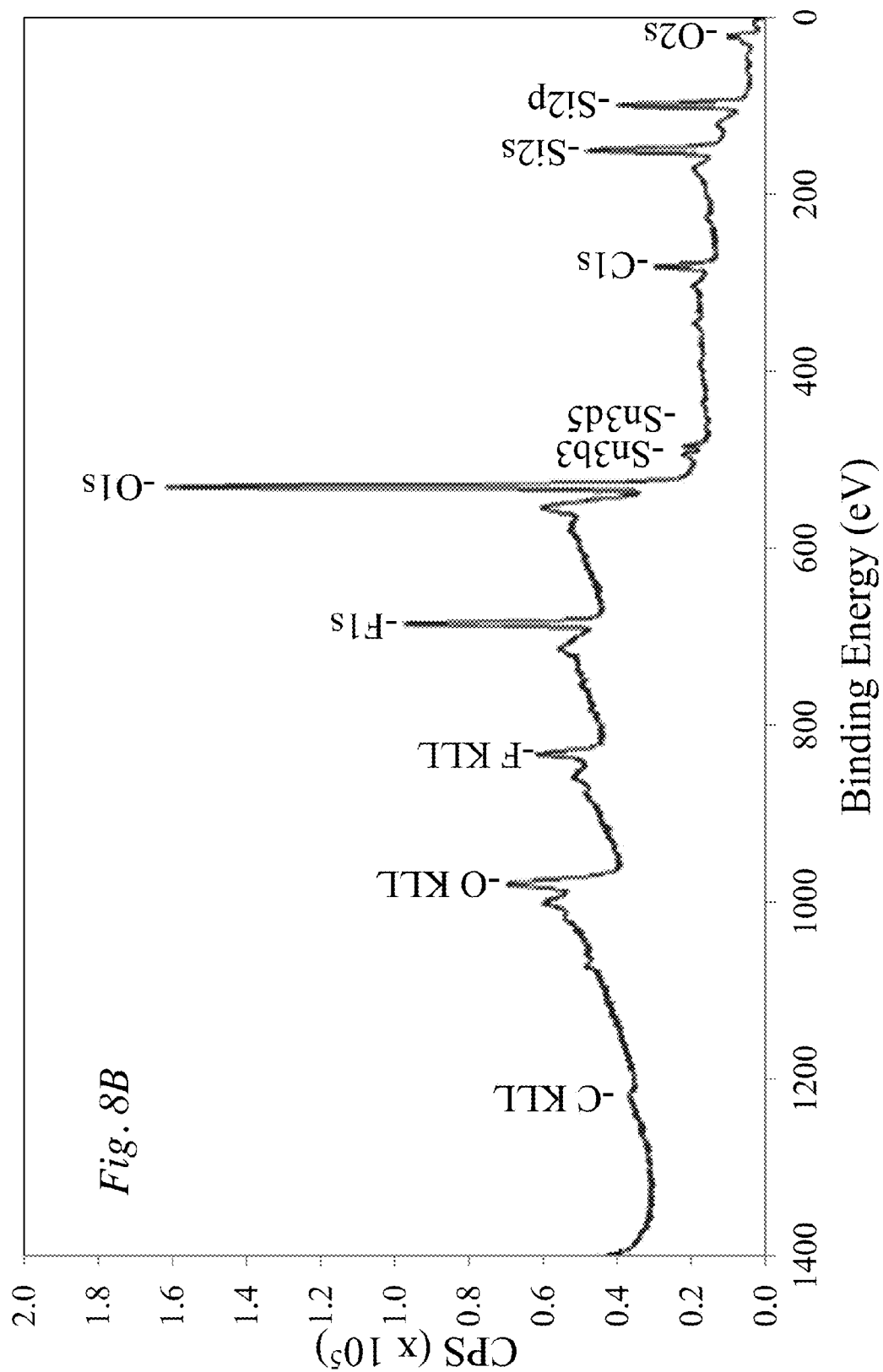
FIG. 8b is the XPS spectrum of coating from Example 2 on tin side of TCO coated glass after a 10 minute Argon Sputter Etch.

In an embodiment referred to as Example 10, following Method II the sol is prepared by charging a 500 mL flask with 197 g of IPA and 140 g of 0.08 M HCl. After stirring at 100 rpm at room temperature for one minute, 30.2 g (0.288) of methyltrimethoxysilane is added to the mixture. The mixture is stirred at room temperature for 30 minutes followed by addition of 60 g (0.288 moles) of tetraethoxysilane. The final mixture is stirred at room temperature for 30 minutes. This mixture is allowed to age under ambient conditions for 48 hours. The GPC test of the final sol produced molecular weight of Mw=1,635 g/mol with polydispersity PD=1.36. 30×30 cm glass sheets (polished with cerium oxide polish, washed, and allowed to dry) are flow coated with the final sol mixture and allowed to dry for approximately 1-10 minutes followed by curing at temperature of 120° C. for 60 minutes. GPC results are shown in FIGS. 7k-1 and 7k-2.

Figure 24:
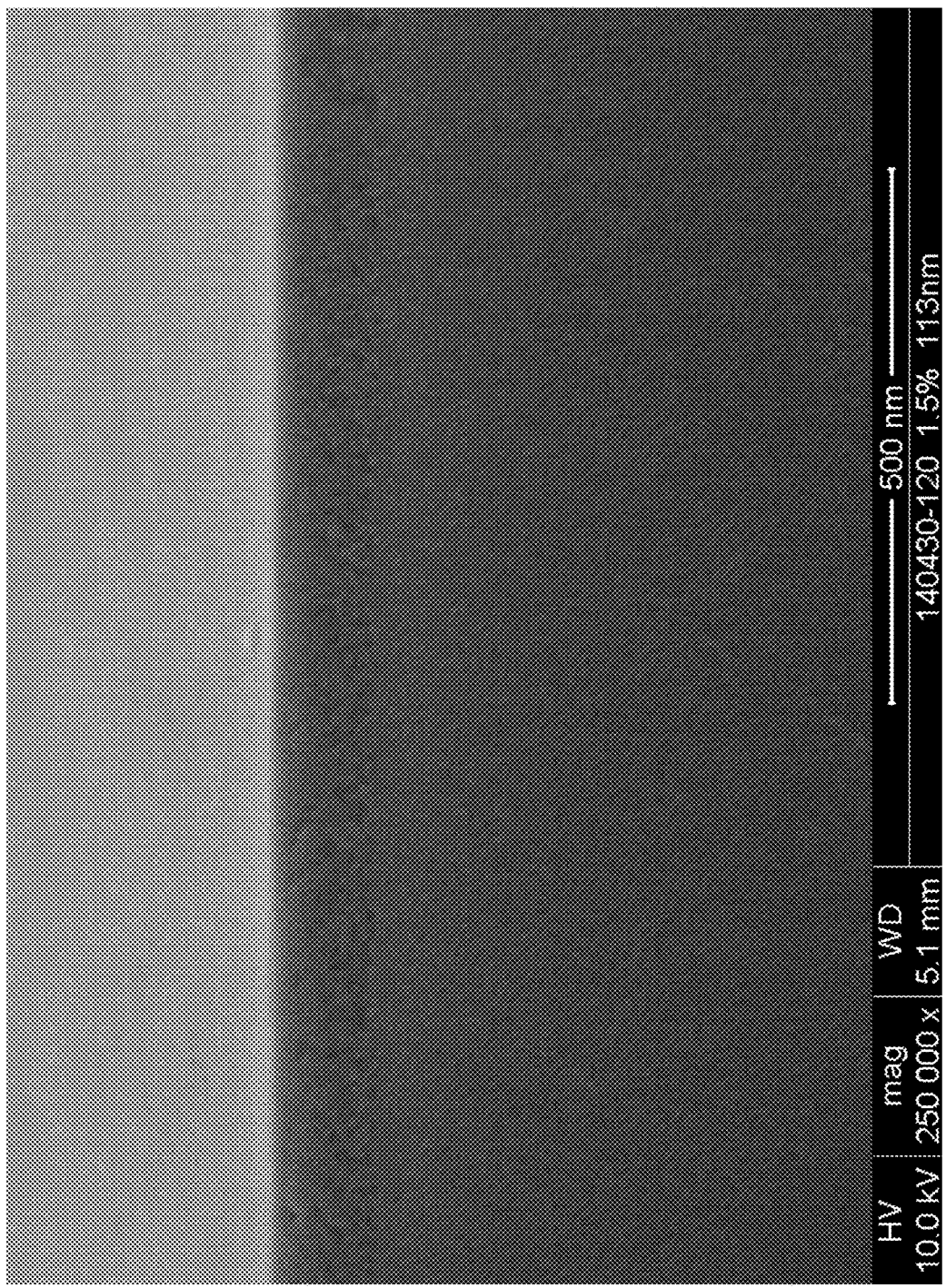
FIG. 24 is an SEM micrograph of the coated and cured sample of Example 11 on rolled glass.
Figure 25:
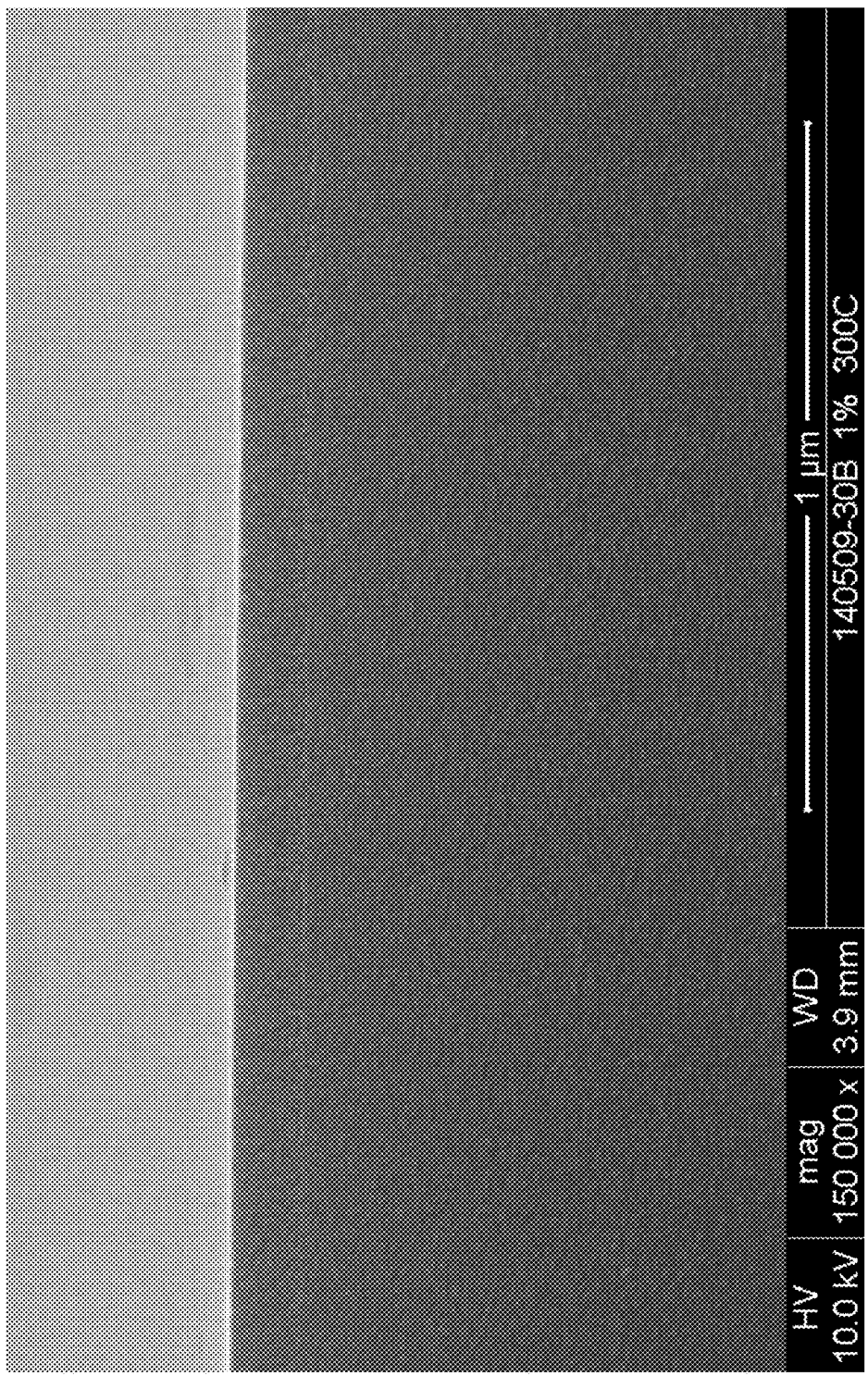
FIG. 25 is an SEM micrograph of the roll-coated and cured sample of Example 11 on rolled glass.

In an embodiment referred to as Example 11, sol from Example 8 is formulated with 6.4 g of TWEEN 80. 30×30 cm glass sheets (polished with cerium oxide polish, washed, and allowed to dry) are flow coated with the final sol mixture and allowed to dry for approximately 1-10 minutes followed by thermal curing. An SEM cross-section of a representative sample of cured film on float glass from Example 11 is shown in FIG. 24 and a representative sample of cured film on float glass from Example 11 is shown in FIG. 25.

In an embodiment referred to as Example 12, sol from Example 8 is formulated with 4.27 g of TWEEN 80. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 13, sol from Example 8 is formulated with 2.14 g of TWEEN 80. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 14, following Method II the sol is prepared by charging a 500 mL flask with 354 g of IPA, 0.66 g (0.011 moles) of B(OH)$_3$ and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=826/mol with polydispersity PD=1.07. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 15, sol from Example 8 is formulated with 6.4 g of TWEEN 80 and 6.4 g of AlCl$_3$. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 16, sol from Example 8 is formulated with 6.4 g of TWEEN 20. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 17, sol from Example 8 is formulated with 4.27 g of TWEEN 20. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 18, sol from Example 8 is formulated with 2.14 g of TWEEN 20. 30×30 cm glass sheets (polished with cerium oxide polish, washed, and allowed to dry) are flow coated with the final sol mixture and allowed to dry for approximately 1-10 minutes followed by thermal curing.

Figure 23:
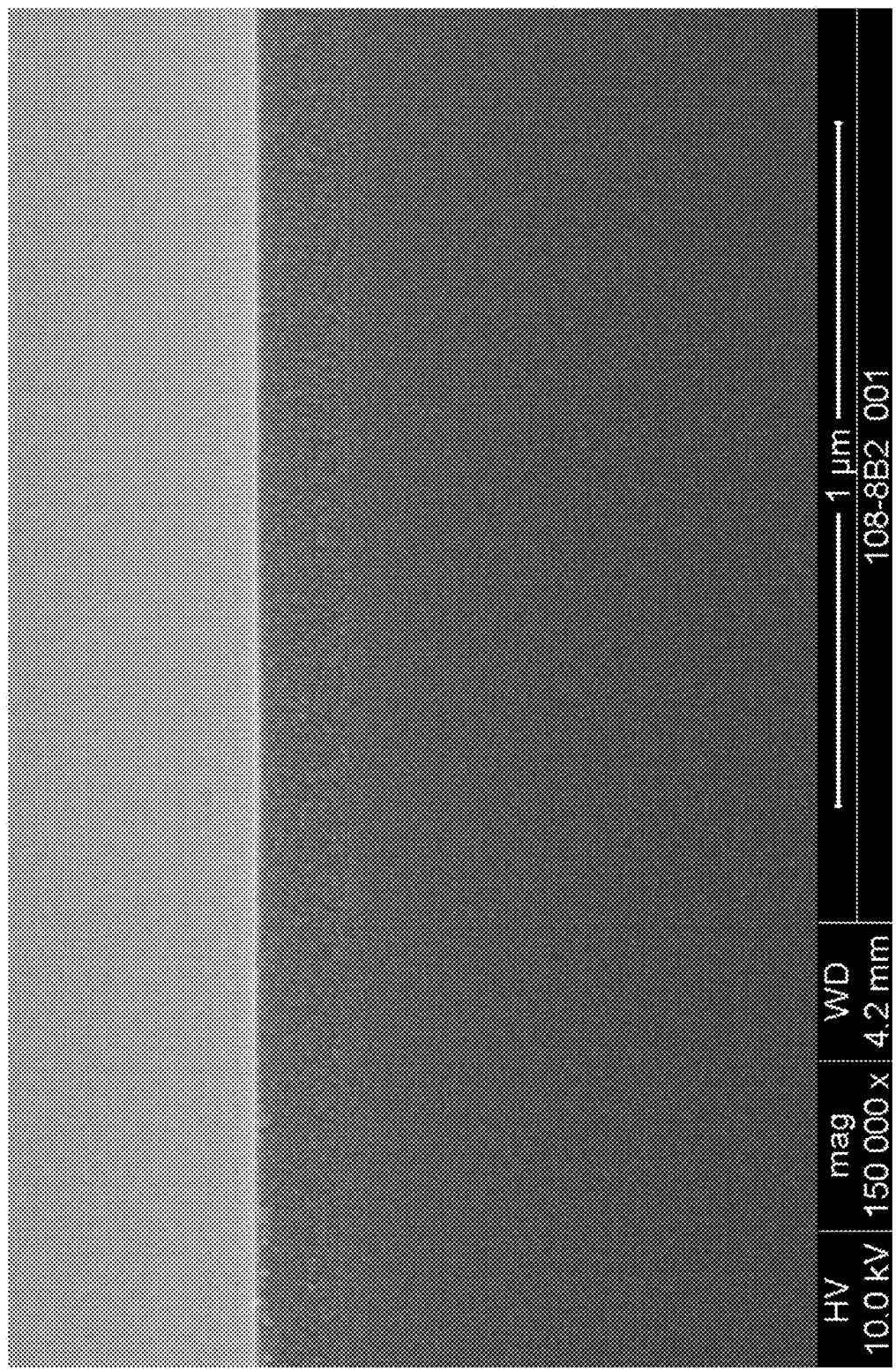
FIG. 23 is an SEM micrograph of the coated and cured sample of Example 19 on float glass.

In an embodiment referred to as Example 19, sol from Example 8 is formulated with 6.4 g of PEG 600. 30×30 cm glass sheets (polished with cerium oxide polish, washed, and allowed to dry) are flow coated with the final sol mixture and allowed to dry for approximately 1-10 minutes followed by thermal curing. An SEM cross-section of a representative sample of cured film on float glass from Example 19 is shown in FIG. 23.

In an embodiment referred to as Example 20, sol from Example 8 is formulated with 6.4 g of PEG 400. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 21, sol from Example 8 is formulated with 6.4 g of PEG 300. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 22, following Method II the sol is prepared by charging a 500 mL flask with 354 g of IPA, 6.4 g of TWEEN 80 and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=1558 g/mol with polydispersity PD=1.34. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 23, following Method II the sol is prepared by charging a 500 mL flask with 354 g of IPA, 6.4 g of PEG 600 and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=988 g/mol with polydispersity PD=1.1. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 24, following Method II the sol is prepared by charging a 500 mL flask with 354 g of IPA, 6.4 g of PEG-b-PPG-b-PEG and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=1333 g/mol with polydispersity PD=1.17. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 25, a 500 mL three-necked flask fitted with two addition funnels and a thermocouple temperature sensor is cooled in an ice bath. One of the addition funnels is charged with a mixture 32 g (0.235 moles) of methyltrimethoxysilane, 29 g of IPA, and 1.6 g of glacial AcOH. The other funnel is charged with 100 g of a 34% by weight colloidal silica (Nalco 1034A). The colloidal silica and methyltrimethoxysilane solutions are added drop wise at such a rate that the temperature of the reaction mixture does not exceed 5° C. After the addition is complete, the mixture is allowed to warm to ambient temperature with continued stirring and allowed to stand overnight. The mixture (151 g) is diluted with IPA (757 g). This mixture is allowed to age under ambient conditions for 48 hours. The GPC test of the final sol produced molecular weight of Mw=685 g/mol with polydispersity PD=1.1. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 26, a 500 mL three-necked flask fitted with two addition funnels and a thermocouple temperature sensor is cooled in an ice bath. One of the addition funnels is charged with a mixture of 17 g (0.125 moles) of methyltrimethoxysilane, 29 g of IPA, and 1.68 g of glacial AcOH. The other funnel is charged with 100 g of a 34% by weight colloidal silica (Nalco 1034A). The colloidal silica and methyltrimethoxysilane solutions are added drop wise at such a rate that the temperature of the reaction mixture does not exceed 5° C. After the addition is complete, the mixture is allowed to warm to ambient temperature with continued stirring and allowed to stand overnight. The mixture (140 g) is diluted with IPA (853.5 g). This mixture is allowed to age under ambient conditions for 48 hours. The GPC test of the final sol produced molecular weight of Mw=637 g/mol with polydispersity PD=1.07. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 27, a 500 mL three-necked flask fitted with two addition funnels and a thermocouple temperature sensor is cooled in an ice bath. One of the addition funnels is charged with a mixture 8 g (0.059 moles) of methyltrimethoxysilane, 28 g of IPA, and 1.68 g of glacial AcOH. The other funnel is charged with 100 g of 34% by weight colloidal silica (Nalco 1034A). The colloidal silica and methyltrimethoxysilane solutions are added drop wise at such a rate that the temperature of the reaction mixture does not exceed 5° C. After the addition is complete, the mixture is allowed to warm to ambient temperature with continued stirring and allowed to stand overnight. The mixture (151 g) is diluted with IPA (757 g). This mixture is allowed to age under ambient conditions for 48 hours. The GPC test of the final sol produced molecular weight of Mw=567 g/mol with polydispersity PD=1.03. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 28. The final sol from Example 27 is formulated with 1.79 g of 10 weight % solution of PowderLink in NMP. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 29. The final sol from Example 23 is formulated with 1.79 g of 10 weight % solution of PowderLink in NMP. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 30. The final sol from Example 23 is formulated with 3.58 g of 10 weight % solution of PowderLink in NMP. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 31. The final sol from Example 11 is formulated with 2.17 g (0.0067 moles) of Al(acac)$_3$. 30×30 cm glass sheets (polished with cerium oxide polish, washed, and allowed to dry) are flow coated with the final sol mixture and allowed to dry for approximately 1-10 minutes followed by thermal curing.

In an embodiment referred to as Example 32, following Method II the sol is prepared by charging a 500 mL flask with 354 g of IPA, 8.09 g of AlCl$_3$ 6H$_2$O and 6.4 g of TWEEN 80 and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane. The final mixture is stirred at room temperature for 30 minutes. This mixture is allowed to age under ambient conditions for 48 hours. The GPC test of the final sol produced molecular weight of Mw=1732 g/mol with polydispersity PD=1.41. 30×30 cm glass sheets (polished with cerium oxide polish, washed, and allowed to dry) are flow coated with the final sol mixture and allowed to dry for approximately 1-10 minutes followed by thermal curing.

Figure 28:
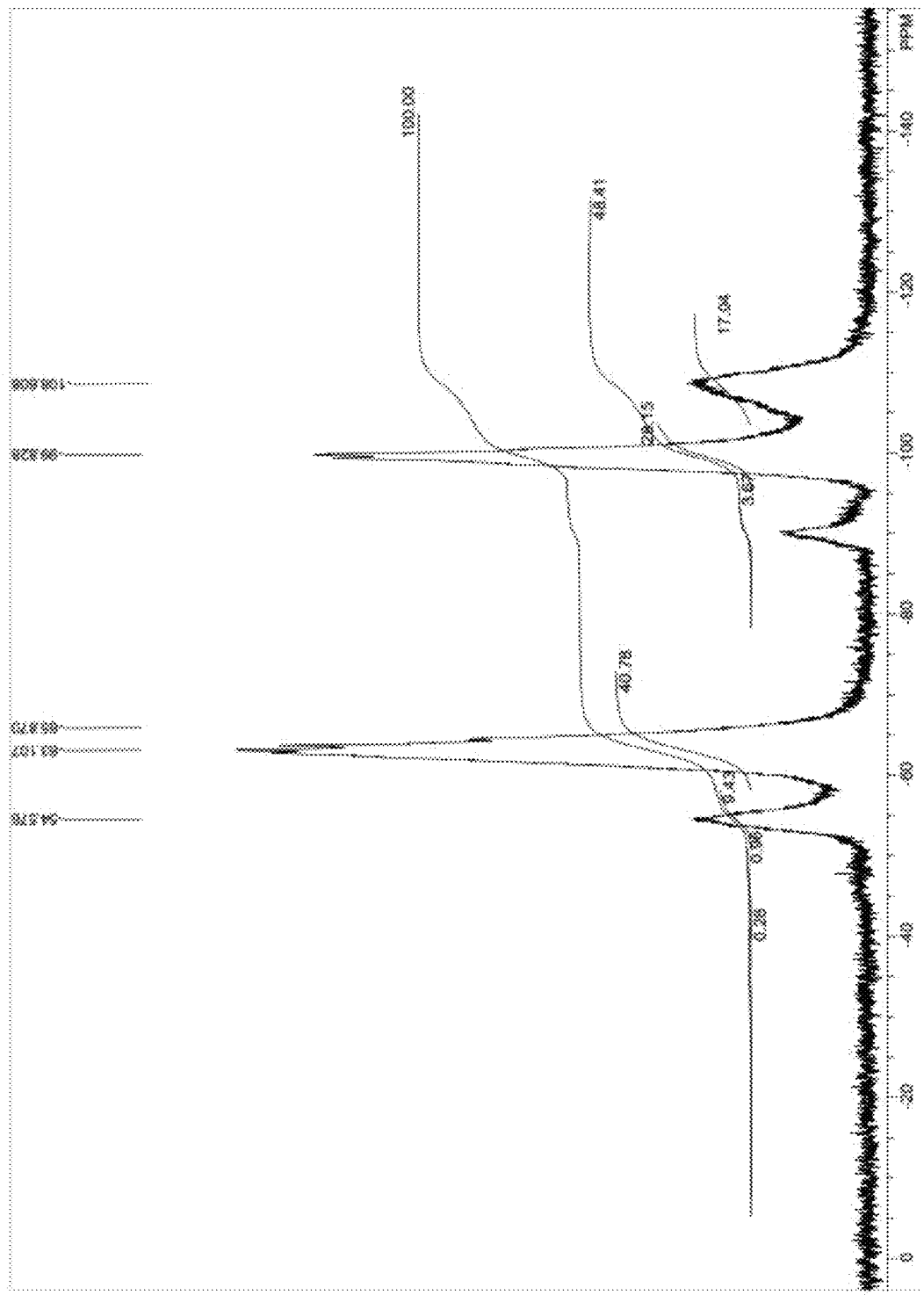
FIG. 28 and FIG. 29 depict Si-NMR spectra of Examples 33 and 35 respectively.

In an embodiment referred to as Example 33, following Method III the sol is prepared by charging a 500 ml flask with 345 g of IPA, and 50 g of 0.08 M HCl. After stirring at 100 rpm at room temperature for one minute, 13.96 g (0.067 moles) of tetraethoxysilane is added to the mixture. The mixture is stirred at room temperature for 30 minutes followed by addition of 9.13 g (0.067 moles) of methyltrimethoxysilane. The final mixture is stirred at room temperature for 30 minutes. This mixture is allowed to age under ambient conditions for 48 hours. The GPC test of the final sol produced molecular weight of Mw=886 g/mol with polydispersity PD=1.07. 30×30 cm glass sheets (polished with cerium oxide polish, washed, and allowed to dry) are flow coated with the final sol mixture and allowed to dry for approximately 1-10 minutes followed by thermal curing. NMR results are shown in FIG. 28.

In an embodiment referred to as Example 34, sol from Example 33 is formulated with 6.4 g of PEG 600. 30×30 cm glass sheets (polished with cerium oxide polish, washed, and allowed to dry) are flow coated with the final sol mixture and allowed to dry for approximately 1-10 minutes followed by thermal curing.

Figure 29:
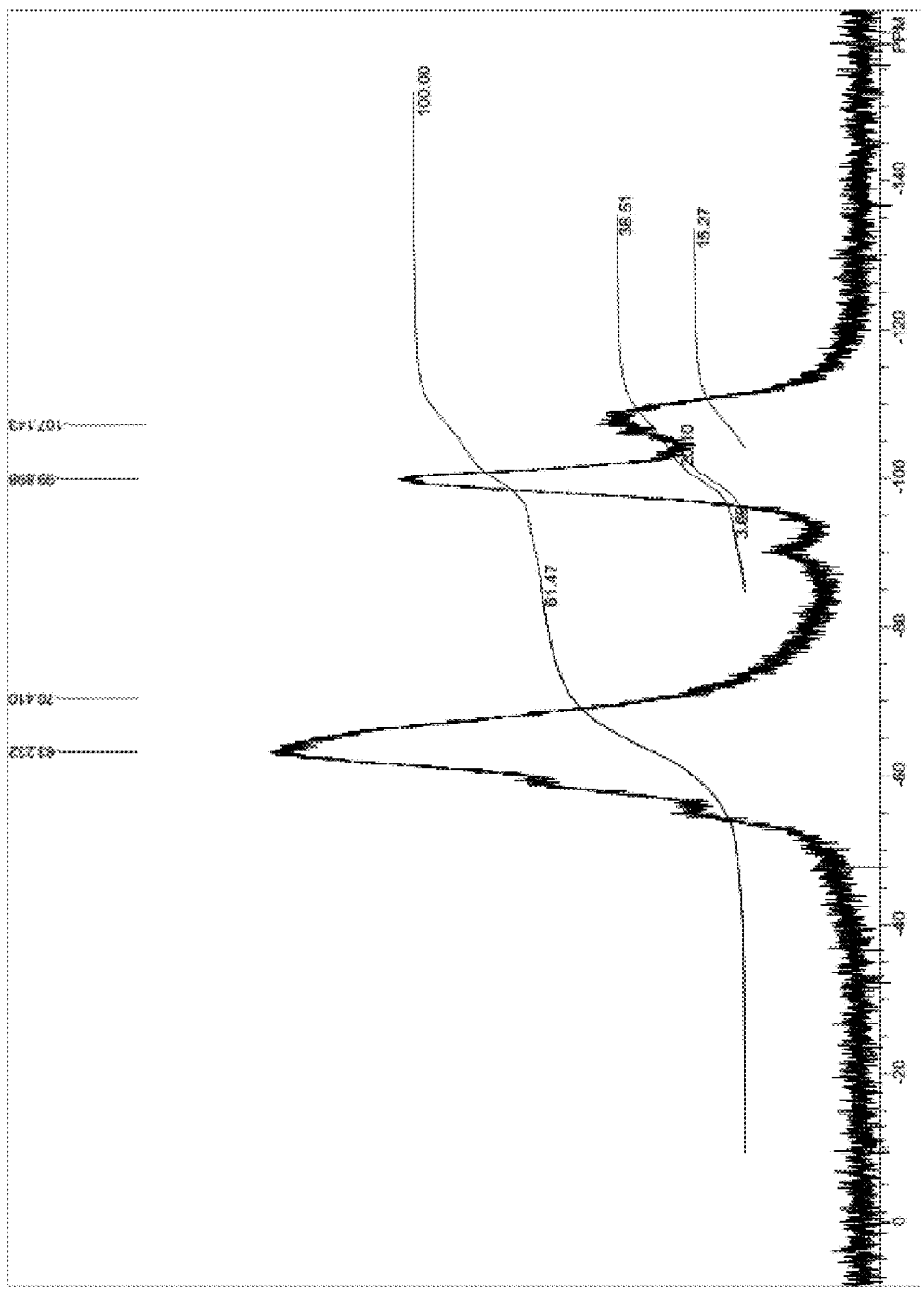

In an embodiment referred to as Example 35, following Method III the sol is prepared by charging a 500 ml flask with 345 g of IPA, and 50 g of 0.08 M HCl. After stirring at 100 rpm at room temperature for one minute, 12.6 g (0.061 moles) of tetraethoxysilane is added to the mixture. The mixture is stirred at room temperature for 30 minutes followed by addition of 5.73 g (0.042 moles) of methyltrimethoxysilane and 6.85 g (0.033 moles) of (3,3,3-trifluoropropyl)-trimethoxysilane. The final mixture is stirred at room temperature for 30 minutes. This mixture is allowed to age under ambient conditions for 48 hours. The GPC test of the final sol produced molecular weight of Mw=717 g/mol with polydispersity PD=1.01. 30×30 cm glass sheets (polished with cerium oxide polish, washed, and allowed to dry) are flow coated with the final sol mixture and allowed to dry for approximately 1-10 minutes followed by thermal curing. NMR results are shown in FIG. 29.

In an embodiment referred to as Example 36, 100 g of sol from Example 8 is formulated with 0.2 g of hydrogen peroxide and spin coated at 700 (rotations per minutes) rpm for 40 seconds on a 10×10 cm glass sheet followed by thermal curing.

In an embodiment referred to as Example 37, 100 g of sol from Example 8 is formulated with 0.3 g of hydrogen peroxide and spin coated at 700 rpm for 40 seconds on a 10×10 cm glass sheet followed by thermal curing.

In an embodiment referred to as Example 38, 100 g of sol from Example 8 is formulated with 0.4 g of hydrogen peroxide and spin coated at 700 rpm for 40 seconds on a 10×10 cm glass sheet followed by thermal curing.

In an embodiment referred to as Example 39, 100 g of sol from Example 8 is formulated with 0.2 g of benzoyl peroxide and spin coated at 700 rpm for 40 seconds on a 10×10 cm glass sheet followed by thermal curing.

In an embodiment referred to as Example 40, 100 g of sol from Example 8 is formulated with 0.3 g of benzoyl peroxide and spin coated at 700 rpm for 40 seconds on a 10×10 cm glass sheet followed by thermal curing.

In an embodiment referred to as Example 41, 100 g of sol from Example 8 is formulated with 0.4 g of benzoyl peroxide and spin coated at 700 rpm for 40 seconds on a 10×10 cm glass sheet followed by thermal curing.

In an embodiment referred to as Example 42, 100 g of sol from Example 8 is formulated with 0.2 g of AIBN (Azobisisobutyronitrile) and spin coated at 700 rpm for 40 seconds on a 10×10 cm glass sheet followed by thermal curing.

In an embodiment referred to as Example 43, 100 g of sol from Example 8 is formulated with 0.3 g of AIBN (Azobisisobutyronitrile) and spin coated at 700 rpm for 40 seconds on a 10×10 cm glass sheets followed by thermal curing.

In an embodiment referred to as Example 44, 100 g of sol from Example 8 is formulated with 0.4 g of AIBN (Azobisisobutyronitrile) and spin coated at 700 rpm for 40 seconds on a 10×10 cm glass sheet followed by thermal curing.

In an embodiment referred to as Example 45, 100 g of sol from Example 8 is formulated with 0.2 g of dicumyl peroxide (DCP) and spin coated at 700 rpm for 40 seconds on a 10×10 cm glass sheet followed by thermal curing.

In an embodiment referred to as Example 46, 100 g of sol from Example 8 is formulated with 0.3 g of dicumyl peroxide (DCP) and spin coated at 700 rpm for 40 seconds on a 10×10 cm glass sheet followed by thermal curing.

In an embodiment referred to as Example 47, 100 g of sol from Example 8 is formulated with 0.4 g of dicumyl peroxide (DCP) and spin coated at 700 rpm for 40 seconds on a 10×10 cm glass sheet followed by thermal curing.

In an embodiment referred to as Example 48, 100 g of sol from Example 8 is formulated with 0.2 g of dicumyl peroxide (DCP) and 0.6 g of NMP. The resulting mixture is spin coated at 700 rpm for 40 seconds on a 10×10 cm glass sheet followed by thermal curing.

In an embodiment referred to as Example 49, 100 g of sol from Example 8 is formulated with 0.2 g of dicumyl peroxide (DCP) and 0.6 g of THF. The resulting mixture is spin coated at 700 rpm for 40 seconds on a 10×10 cm glass sheet followed by thermal curing.

In an embodiment referred to as Example 50, 100 g of sol from Example 8 is formulated with 0.2 g of dicumyl peroxide (DCP) and 0.6 g of PGME. The resulting mixture is spin coated at 700 rpm for 40 seconds on a 10×10 cm glass sheet followed by thermal curing.

In an embodiment referred to as Example 51, 100 g of sol from Example 8 is formulated with 0.2 g of dicumyl peroxide (DCP) and 2 g of PGME. The resulting mixture is spin coated at 700 rpm for 40 seconds on a 10×10 cm glass sheet followed by thermal curing.

In an embodiment referred to as Example 52, 100 g of sol from Example 8 is formulated with 0.8 g of glyoxal. The resulting mixture is spin coated at 700 rpm for 40 seconds on a 10×10 cm glass sheet followed by thermal curing.

Figure 32B:
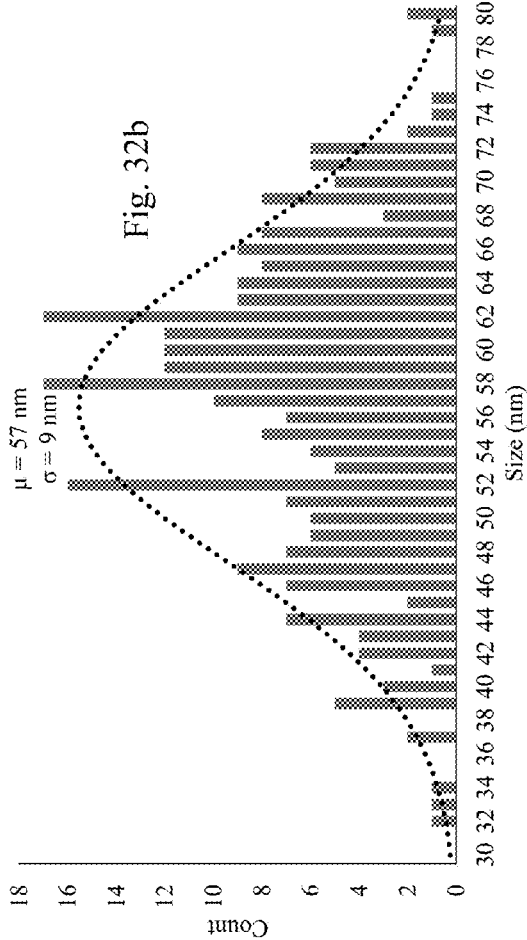
Figure 32A:
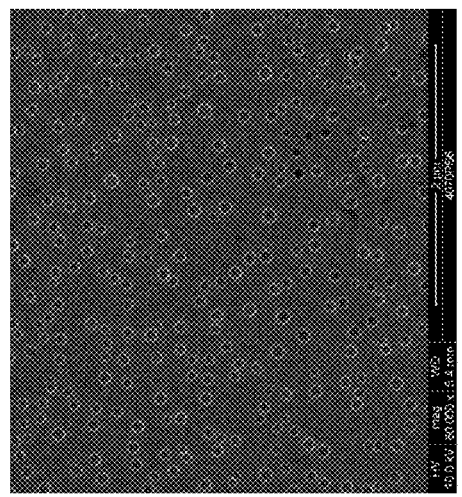
Figure 37A:
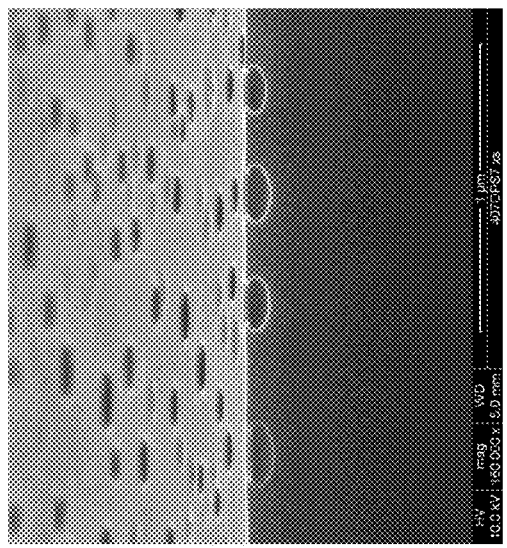
FIGS. 37a-37d depict an oblique cross-sectional SEM micrographs of roll-coated and cured samples showing various void structures in the vertical dimension of the coating.
Figure 37B:
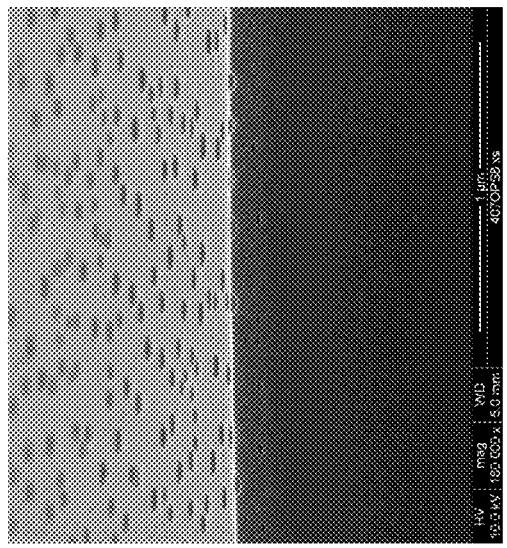
Figure 37C:
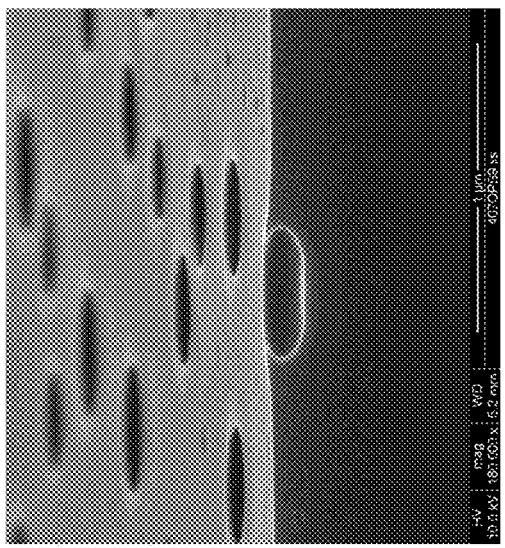
Figure 37D:
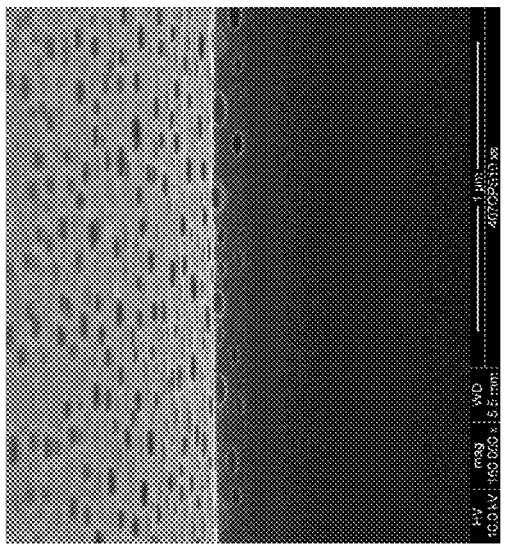

In an embodiment referred to as Example 53, 100 g of sol from Example 8 is formulated with 0.2 g of dicumyl peroxide (DCP) and 2 g of PGME and 0.8 g of glyoxal. The resulting mixture is spin coated at 700 rpm for 40 seconds on a 10×10 cm glass sheet followed by thermal curing. It was also roll-coated onto a substrate heated to 40° C. then cured at 275° C. for 30 minutes. The roll-coated sample was examined by SEM and is depicted in FIG. 32.

In an embodiment referred to as Example 54, following Method II the sol is prepared by charging a 500 mL flask with 354 g of IPA and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane and 7.64 g of PGME. The final mixture is stirred at room temperature for 30 minutes. This mixture is allowed to age under ambient conditions for 48 hours. The final sol is spin coated at 700 rpm for 40 seconds on a 10×10 cm glass sheet followed by thermal curing.

In an embodiment referred to as Example 55, 100 g of sol from Example 54 is formulated with 0.2 g of dicumyl peroxide (DCP) and 0.8 g of glyoxal. The resulting mixture is spin coated at 700 rpm for 40 seconds on a 10×10 cm glass sheet followed by thermal curing. It was also roll-coated onto a substrate at room temperature, then cured at 275° C. for 30 minutes. The roll-coated sample was examined by SEM and is depicted in FIG. 30.

In an embodiment referred to as Example 56, following Method II the sol is prepared by charging a 500 mL flask with 354 g of IPA and 50 g of 0.08 M HCl. After stirring at 100 rpm at room temperature for one minute, 9.13 g (0.067 moles) of methyltrimethoxysilane is added to the mixture. The mixture is stirred at room temperature for 30 minutes followed by addition of 13.96 g (0.067 moles) of tetraethoxysilane and 7.64 g of PGME and 3.06 g of glyoxal. The final mixture is stirred at room temperature for 30 minutes. This mixture is allowed to age under ambient conditions for 48 hours. The final sol is spin coated 700 rpm for 40 seconds on a 10×10 cm glass sheet followed by thermal curing.

In an embodiment referred to as Example 57, 100 g of sol from Example 56 is formulated with 0.2 g of dicumyl peroxide (DCP). The resulting mixture is spin coated at 700 rpm for 40 seconds on a 10×10 cm glass sheet followed by thermal curing.

In an embodiment referred to as Example 58, 100 g of sol from Example 8 is formulated with 0.2 g of benzoyl peroxide and 2 g of PGME and 0.8 g of glyoxal. The resulting mixture was spin coated at 700 rpm for 40 seconds on a 10×10 cm glass sheet followed by thermal curing.

In an embodiment referred to as Example 59, 100 g of sol from Example 8 is formulated with 0.2 g of dicumyl peroxide (DCP) and 1 g of PGME. The resulting mixture is roll-coated and thermally cured.

In an embodiment referred to as Example 60, 100 g of sol from Example 8 is formulated with 0.2 g of dicumyl peroxide (DCP) and 5 g of PGME. The resulting mixture is roll-coated and thermally cured.

In an embodiment referred to as Example 61, 100 g of sol from Example 8 is formulated with 0.3 g of dicumyl peroxide (DCP) and 2 g of PGME. The resulting mixture is roll-coated and thermally cured.

In an embodiment referred to as Example 62, 100 g of sol from Example 8 is formulated with 0.4 g of dicumyl peroxide (DCP) and 2 g of PGME. The resulting mixture is roll-coated and thermally cured.

In an embodiment referred to as Example 63, 100 g of sol from Example 8 is formulated with 0.5 g of dicumyl peroxide (DCP) and 2 g of PGME. The resulting mixture is roll-coated and thermally cured.

The coatings of the present disclosure also provide tunable mechanical properties. Nano-indentation is a method used to measure the mechanical properties of nanoscale materials, especially thin films and coatings. The testing instrument that is used for performing the nano-indentation tests is a Nanomechanical Test System (manufactured by Hysitron, Inc., USA). This Nanomechanical Test System is a high-resolution nano-mechanical test instrument that performs nano-scale quasi-static indentation by applying a force to an indenter tip while measuring tip displacement into the specimen. During indentation, the applied load and tip displacement are continuously controlled and/or measured, creating a load-displacement curve for each indent. From the load-displacement curve, nano-hardness and reduced elastic modulus values can be determined by applying the Oliver and Pharr method and a pre-calibrated indenter tip area function and a pre-determined machine compliance value. The instrument can also provide in situ SPM (scanning probe microscopy) images of the specimen before and after indentation. Such nanometer resolution imaging function is accomplished quickly and easily by utilizing the same tip for imaging as for indentation. The in situ SPM imaging capability is not only useful in observing surface features, but also critical in positioning the indenter probe over such features for indentation tests.

Typically nano-hardness and reduced elastic modulus may be determined using nano-indentation. The reduced elastic modulus has a relationship with the Young's modulus as shown in the equation below. If Poisson's ratio for the material to be tested is known then the Young's modulus of for the material can be calculated. The Poisson's ratio for the diamond indenter is 0.07 and the Young's modulus of the indenter is 1141 GPa.

$$\frac{1}{E_r} = \frac{(1 - V_{material}^2)}{E_{material}} + \frac{(1 - V_{indenter}^2)}{E_{indenter}}$$

The nano-indentation tests were performed on 1 cm² samples cut from coated glass specimens made according to the composition of Example 2 and Example 3. To obtain the hardness and modulus values for the coating, ten indents were performed on each sample. Loads of 15 μN were used for Sample 5F and 25 μN for Sample 7J. All indents were performed through in situ SPM imaging. Table 1 summarizes the test conditions and parameters used in the nano-hardness and modulus tests.

TABLE 1

| Nano-hardness and Modulus Testing Conditions and Parameters | |
|---|---|
| Specimens | Sample 5F and Sample 7J |
| Test instrument | TriboIndenter |
| Indentation Load | 15, 25 μN |
| Indenter Probe Tip | Diamond Berkovich indenter tip |
| Temperature | 74° F. |
| Humidity | 25% RH |
| Environment | Ambient air |

Tables 2 and 3 present the nano-hardness, H, and reduced elastic modulus, $E_r$, measurement results. These tables also show values for the contact depth, Hc, of each indent. The test locations of these indents were chosen to ensure adequate spacing between measurements.

Tables 2 and 3 demonstrate that the average nano-hardness was highest for Sample 7J (2.11 GPa) and lowest for Sample 5F (1.43 GPa). Average reduced elastic modulus was highest for Sample 7J (20.99 GPa) and lowest for Sample 5F (13.51 GPa). These results further confirm that the hardness of the coatings of the disclosure can be tuned by changing the ratios of organoalkoxysilane, tetraalkoxysilane and organofluoroalkoxysilanes in the synthesis of sols from which the coatings are obtained.

TABLE 2

Nano-hardness and Reduced Elastic Modulus Test Results for Sample 5F - Film Made from Composition of Example 2

| 15 μN | H (GPa) | Er (GPa) | Hc (nm) |
|---|---|---|---|
| | | Test Under | |
| 1 | 1.46 | 13.93 | 15.24 |
| 2 | 1.45 | 13.67 | 15.16 |
| 3 | 1.48 | 13.38 | 14.98 |
| 4 | 1.46 | 13.21 | 15.13 |
| 5 | 1.48 | 13.37 | 15.02 |
| 6 | 1.34 | 13.50 | 16.04 |
| 7 | 1.46 | 13.55 | 15.23 |
| 8 | 1.43 | 13.95 | 15.40 |
| 9 | 1.43 | 13.57 | 15.41 |
| 10 | 1.34 | 13.00 | 16.06 |
| Average | 1.43 | 13.51 | 15.37 |
| St. Dev | 0.05 | 0.30 | 0.39 |

TABLE 3

Nano-hardness and Reduced Elastic Modulus Test Results for Film 7J - Film Made from Composition of Example 3

| 25 μN | H (GPa) | Er (GPa) | Hc (nm) |
|---|---|---|---|
| | | Test Under | |
| 1 | 2.09 | 20.76 | 15.87 |
| 2 | 2.04 | 20.75 | 16.10 |
| 3 | 2.09 | 20.53 | 15.72 |
| 4 | 2.27 | 21.75 | 14.99 |
| 5 | 2.08 | 21.15 | 15.82 |
| 6 | 2.13 | 21.40 | 15.59 |
| 7 | 2.09 | 20.78 | 15.80 |
| 8 | 2.03 | 21.20 | 16.09 |
| 9 | 2.15 | 21.22 | 15.59 |
| 10 | 2.11 | 20.30 | 15.78 |
| Average | 2.11 | 20.99 | 15.73 |
| St. Dev | 0.07 | 0.44 | 0.31 |

Another series of nano-indentations tests using the conditions of Table 4 were carried out for the coating from Example 19 cured under various conditions.

TABLE 4

Nano-hardness and Modulus Testing Conditions and Parameters.

| | |
|---|---|
| Specimens | 6 types of ARC film |
| Test instrument | TriboIndenter |
| Indenter Probe Tip | Diamond Berkovich indenter tip |
| Indentation Loads | 60, 40, 20, 17, and 15 μN |
| Temperature | 76° F. |
| Humidity | 37% RH |
| Environment | Ambient air |

The cure conditions of coating from Example 19 are summarized in Table 5.

TABLE 5

Cure condition for coatings from Example 19:

| Example 19 | Cure Temp (° C.) | Cure Time (min) |
|---|---|---|
| 19-1A | 500 | 30 |
| 19-2A | 250 | 10 |
| 19-3A | 250 | 30 |

TABLE 5-continued

Cure condition for coatings from Example 19:

| Example 19 | Cure Temp (° C.) | Cure Time (min) |
|---|---|---|
| 19-4A | 275 | 10 |
| 19-5A | 275 | 30 |

The results of nano-indentation tests of the coating from Example 19 are summarized in Tables 6-10.

TABLE 6

Nano-hardness and Reduced Elastic Modulus Test Results for 19-1A

| Test | H (GPa) | $E_r$ (GPa) | $H_c$ (nm) |
|---|---|---|---|
| 1 | 1.41 | 11.06 | 19.46 |
| 2 | 1.40 | 11.70 | 19.57 |
| 3 | 1.39 | 11.18 | 19.71 |
| 4 | 1.38 | 11.31 | 19.78 |
| 5 | 1.37 | 11.11 | 19.91 |
| Average | 1.39 | 11.27 | 19.69 |
| S.D. | 0.02 | 0.26 | 0.18 |

TABLE 7

Nano-hardness and Reduced Elastic Modulus Test Results for 19-2A

| Test | H (MPa) | $E_r$ (GPa) | $H_c$ (nm) |
|---|---|---|---|
| 1 | 560.18 | 5.76 | 18.03 |
| 2 | 571.94 | 6.76 | 17.68 |
| 3 | 515.26 | 6.26 | 19.23 |
| 4 | 528.28 | 6.39 | 18.84 |
| 5 | 541.52 | 6.75 | 18.44 |
| Average | 543.44 | 6.38 | 18.44 |
| S.D. | 23.02 | 0.41 | 0.62 |

TABLE 8

Nano-hardness and Reduced Elastic Modulus Test Results for 19-3A

| Test | H (MPa) | $E_r$ (GPa) | $H_c$ (nm) |
|---|---|---|---|
| 1 | 534.86 | 4.09 | 18.62 |
| 2 | 554.16 | 4.16 | 18.10 |
| 3 | 531.54 | 4.15 | 18.70 |
| 4 | 533.17 | 4.14 | 18.68 |
| 5 | 542.68 | 4.16 | 18.43 |
| Average | 539.28 | 4.14 | 18.51 |
| S.D. | 9.35 | 0.03 | 0.25 |

TABLE 9

Nano-hardness and Reduced Elastic Modulus Test Results for 19-4A

| Test | H (MPa) | $E_r$ (GPa) | $H_c$ (nm) |
|---|---|---|---|
| 1 | 533.02 | 4.12 | 20.80 |
| 2 | 582.91 | 4.50 | 19.35 |
| 3 | 572.94 | 4.53 | 19.68 |
| 4 | 581.83 | 4.51 | 19.44 |

TABLE 9-continued

Nano-hardness and Reduced Elastic
Modulus Test Results for 19-4A

| Test | H (MPa) | $E_r$ (GPa) | $H_c$ (nm) |
|---|---|---|---|
| 5 | 567.28 | 4.41 | 19.65 |
| Average | 567.60 | 4.41 | 19.78 |
| S.D. | 20.38 | 0.17 | 0.58 |

TABLE 10

Nano-hardness and Reduced Elastic
Modulus Test Results for 19-5A

| Test | H (MPa) | $E_r$ (GPa) | $H_c$ (nm) |
|---|---|---|---|
| 1 | 659.34 | 5.92 | 20.08 |
| 2 | 658.88 | 6.08 | 20.12 |
| 3 | 676.19 | 5.63 | 19.67 |
| 4 | 677.19 | 5.63 | 19.67 |
| 5 | 672.63 | 5.52 | 19.72 |
| Average | 668.85 | 5.76 | 19.85 |
| S.D. | 9.05 | 0.23 | 0.23 |

The abrasion resistance of the coating is measured by an abrader device according to European standard EN1096.2 (glass in building, coated glass). The coatings made according to Examples 1, 2, 3, 4, 5, 6, 7, 8, 9, and 10 without any added composition modifying additives, are able to meet the passing criteria of the standard. Coatings made from Examples 3, 7, 8, 9, 10 are exceptional in that they have almost no damage after 500 cycles of testing per the EN1096 standard. Abrasion losses are less than 0.5%.

The coatings of the present disclosure pass the standard test for measuring abrasion resistance of coatings on surfaces as defined according to European Standard EN1096.2 (Glass in Building, Coated Glass). The test involves the action of rubbing a felt pad on the coated glass. The felt rubbing pad is subjected to a to-and-fro translation motion with a stroke length of 120±5 mm at a speed of 54-66 strokes/min combined with a continuous rotation of the pad of 6 rpm or of a rotation of between 10° to 30° at the end of each stroke. The back and forth motion along with the rotation constitutes 1 cycle. The specifications of the circular felt rubbing pad include a diameter of 14-15 mm, thickness of 10 mm and density of 0.52 g / cm². The felt pad is attached to a mechanical finger that is 15 mm to 20 mm in diameter and placed under a load of 4 Newtons. The transmission between 380 nm and 1100 nm is measured to evaluate abrasion resistance and the standard dictates an absolute change in transmission of no more that 0.5% with respect to a reference sample.

TABLE 11

Varying of Abrasion Resistance by Changing the
Ratio of Precursors on Tin-Sided TCO Glass

| Composition | Pre-Abrasion Transmission Gain | Post-Abrasion Transmission Gain |
|---|---|---|
| Example 2 | 2.56 | 1.69 |
| Example 3 | 3.17 | 2.83 |
| Example7 | 2.49 | 2.49 |
| Example 8 | 2.08 | 1.83 |
| Example 9 | 2.69 | 2.43 |
| Example 10 | 2.06 | 1.95 |

The coatings of the present disclosure have abrasion resistance that can be tuned or modulated in a variety of ways. Examples in Table 11 demonstrate how the abrasion resistance of the coatings from this disclosure can be tuned or modulated by changing sol composition from which the coatings are obtained. It would be beneficial to be able to provide coatings as in Example 3 that have a higher durability against abrasion for solar modules or glass substrates that are exposed to abrasive natural environments like sandstorms or cleaning actions that involve contacting the antireflective coatings with abrasives. In areas where the solar modules are unlikely to be exposed to significant abrasive environments, it might be more beneficial to provide coatings that have a higher pre-abrasion transmission as in Example 2.

The contact angle of the coatings is measured by means of a goniometer wherein the contact angle of the water droplet is measured by means of a CCD camera. An average of three measurements is used for each sample. On tin-sided float glass, average contact angles for coatings made from Examples 2, 4, 5 and 6 measure 85° and on tin-sided TCO glass, average contact angles measure 90°.

The reliability results of the coatings in this disclosure are broadly similar to existing anti-reflective coatings. However, under 85° C./85% RH test conditions per IEC61215 and IEC61646, the coatings of this disclosure have a protective effect on glass corrosion which is not observed when highly porous anti-reflective sol-gel coatings are tested under similar conditions. Without being bound to theory, we believe that porous anti-reflective coatings facilitate easy leaching of sodium ions from the glass, whereas the coatings of this disclosure can be tuned to achieve hydrophobic properties which slow down the rate and/or decrease the amount of water that is in contact with the glass. Coatings made from examples 2, 4, 5 and 6 of this disclosure exhibit minimal glass corrosion compared to uncoated glass. The other remarkable feature is that these reliability results have been achieved with a coating cured at just 120° C. Existing anti-reflective coatings are typically sintered at 400~700° C. to achieve the level of reliability indicated by these results.

Where applicable, the measurement of anti-reflective properties of the coatings is done as follows: the transmittance of the coatings is measured by means of UV-vis spectrophotometer equipped with an integrator accessory. The anti-reflective enhancement factor is measured as the relative percent increase in transmittance compared to untreated glass slides versus glass slides coated with compositions of this disclosure. ASTM E424 describes the solar transmission gain, which is defined as the relative percent difference in transmission of solar radiation before and after the application of the coating. The coatings exhibit about 1.5% to about 3.25% gain in solar transmission. The refractive index of the coating is measured by an ellipsometer.

Coated samples of Examples 11-63 were cured at various conditions. Film thickness, refractive index (RI), solar weighted transmission delta ($AT_4$), and abrasion performance according to tests described herein based on European Standard EN1096.2 (Glass in Building, Coated Glass) were measured and summarized in Table 16.

The $T_{Am}$ metric is solar-weighted transmission using the ISO60904 solar spectrum between 380 nm to 1100 nm. $\Delta T_{Am}$ is the absolute difference $T_{am}$ between a coated sample of glass and an uncoated sample of the same type of glass.

TABLE 16

Cure conditions, metrology and performance results of coatings from examples.

| Example # | Cure Temperature (° C.) | Cure Time (min) | Thickness (nm) | RI | $\Delta T_{AM}$ | Abrasion P/F |
|---|---|---|---|---|---|---|
| 11 | 500 | 30 | 135.30 | 1.258 | 3.22 | P |
| 12 | 500 | 30 | 120.40 | 1.289 | 2.99 | P |
| 13 | 500 | 30 | 126.20 | 1.325 | 2.75 | P |
| 14 | 500 | 30 | 120.53 | 1.260 | 3.34 | P |
| 14 | Tempered | | 124.43 | 1.280 | 3.04 | P |
| 16 | 500 | 30 | 127.30 | 1.260 | 3.23 | P |
| 17 | 500 | 30 | 103.70 | 1.290 | 2.84 | P |
| 18 | 300 | 60 | 131.09 | 1.340 | 2.56 | P |
| 19 | 500 | 30 | 129.33 | 1.280 | 3.07 | P |
| 20 | 300 | 30 | 142.90 | 1.340 | 2.45 | F |
| 21 | 300 | 30 | 154.80 | 1.290 | 2.76 | P |
| 22 | 550 | 15 | 147.10 | 1.260 | 3.14 | P |
| 23 | 550 | 15 | 121.63 | 1.290 | 2.98 | P |
| 24 | 550 | 15 | 133.20 | 1.270 | 3.18 | P |
| 25 | 300 | 30 | 136.27 | 1.360 | 2.13 | F |
| 26 | 300 | 30 | 162.10 | 1.313 | 2.49 | F |
| 27 | 300 | 15 | 133.85 | 1.288 | 2.91 | F |
| 28 | 300 | 15 | 124.13 | 1.290 | 3.00 | F |
| 29 | 300 | 15 | 130.00 | 1.311 | 2.89 | P |
| 30 | 300 | 15 | 135.97 | 1.316 | 2.91 | P |
| 31 | 300 | 30 | 127.30 | 1.341 | 2.50 | — |
| 32 | 550 | 15 | 89.20 | 1.383 | 1.48 | P |
| 33 | 300 | 30 | 105.23 | 1.387 | 1.80 | P |
| 34 | 550 | 15 | 125.78 | 1.307 | 3.05 | — |
| 35 | 300 | 15 | 120.53 | 1.37 | 1.95 | P |
| 36 | 275 | 30 | 100.32 | 1.38 | 1.88 | P |
| 39 | 275 | 30 | 120.50 | 1.36 | 2.25 | P |
| 42 | 275 | 30 | 106.86 | 1.38 | 2.17 | P |
| 44 | 275 | 30 | 104.48 | 1.34 | 2.28 | P |
| 45 | 275 | 30 | 106.86 | 1.38 | 2.17 | P |
| 46 | 275 | 30 | 110.86 | 1.35 | 2.52 | P |
| 47 | 275 | 30 | 129.98 | 1.36 | 2.69 | P |
| 48 | 275 | 30 | 117.48 | 1.36 | 2.33 | P |
| 49 | 275 | 30 | 119.78 | 1.36 | 2.47 | P |
| 50 | 275 | 30 | 117.46 | 1.35 | 2.50 | P |
| 51 | 275 | 30 | 123.66 | 1.36 | 2.53 | P |
| 52 | 275 | 30 | 103.66 | 1.40 | 2.01 | P |
| 53 | 275 | 30 | 123.30 | 1.35 | 2.45 | P |
| 54 | 800 | 30 sec | 112.78 | 1.39 | 1.88 | P |
| 55 | 800 | 40 sec | 118.02 | 1.35 | 2.54 | P |
| 56 | 275 | 30 | 105.92 | 1.38 | 1.88 | P |
| 57 | 275 | 30 | 127.06 | 1.36 | 2.24 | P |
| 58 | 275 | 30 | 126.28 | 1.35 | 2.45 | P |
| 59 | 275 | 30 | 121.00 | 1.39 | 2.18 | — |
| 60 | 275 | 30 | 117.00 | 1.38 | 2.29 | — |
| 61 | 275 | 30 | 129.00 | 1.38 | 2.34 | — |
| 62 | 275 | 30 | 123.00 | 1.33 | 2.92 | — |
| 63 | 275 | 30 | 120.00 | 1.31 | 3.08 | — |

Embodiments of the invention have $\Delta T_{Am}$ in the range of between about 1.4% to about 3.5% and between about 1.5% to about 3.25% and between about 2.0% to about 3% and greater than about 1.5%. Embodiments have refractive indices of between about 1.25 to about 1.45 and between about 1.30 to about 1.42 and between about 1.35 to about 1.40.

FIG. 1a illustrates the UV-vis transmittance spectra showing maximum transmittance enhancement of coatings on tin side of float glass from composition given in Example 2. A statistical comparison of 11 samples from coating made from composition in Example 2 on tin side vs non-tin side of float glass provided a solar weighted photon gain of 2.23% vs 1.93%. Without being bound to theory, the coatings of this disclosure interact with the tin side of float glass to provide an enhancement in the beneficial properties of the antireflective coatings.

Figure 1B:
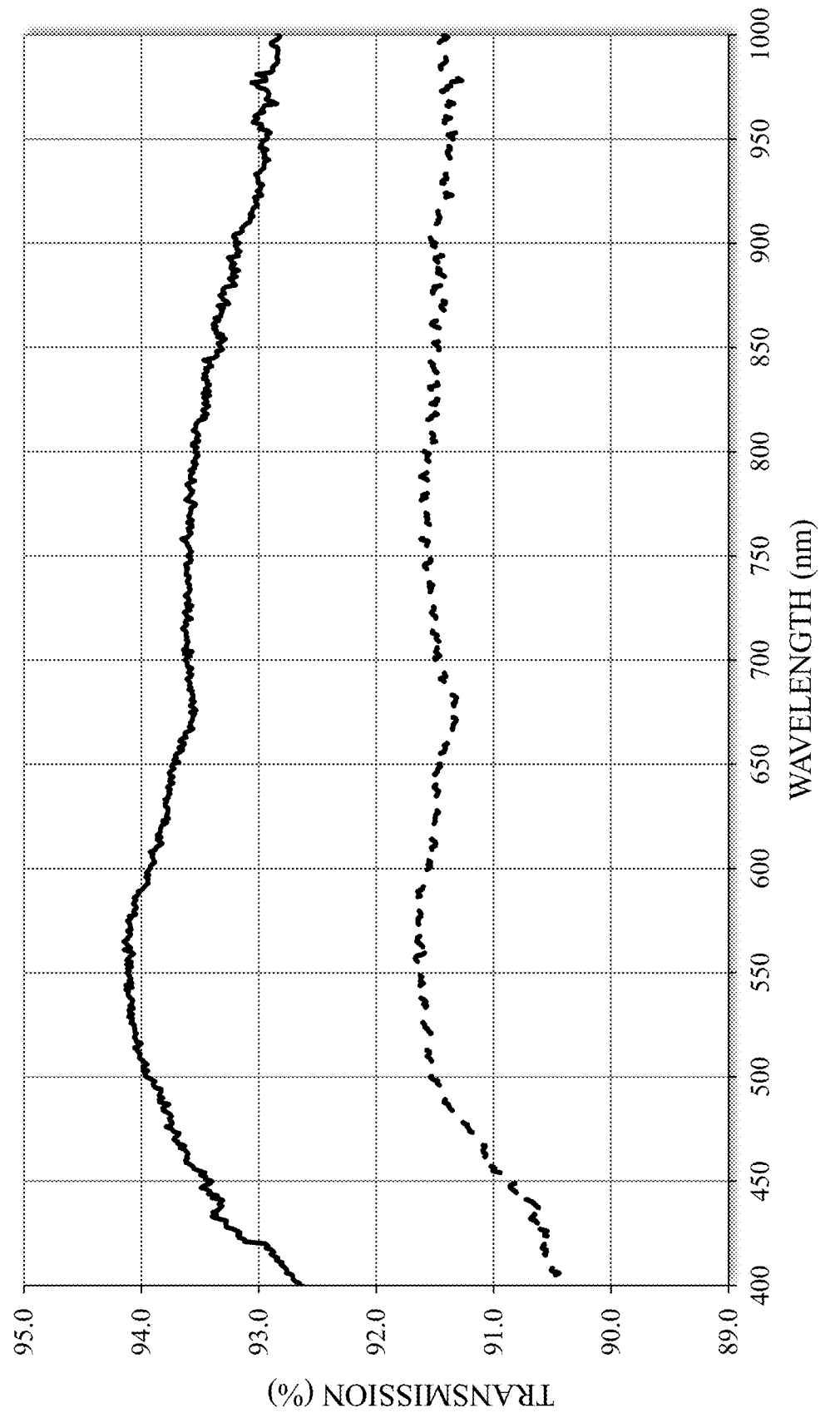
FIG. 1b illustrates the UV-vis transmittance spectra of a coating made from Example 3 roll coated on a patterned glass substrate.

FIG. 1b illustrates the UV-vis transmittance spectra of roll-coated coating made from Example 3 on a patterned glass substrate.

Figure 2A:
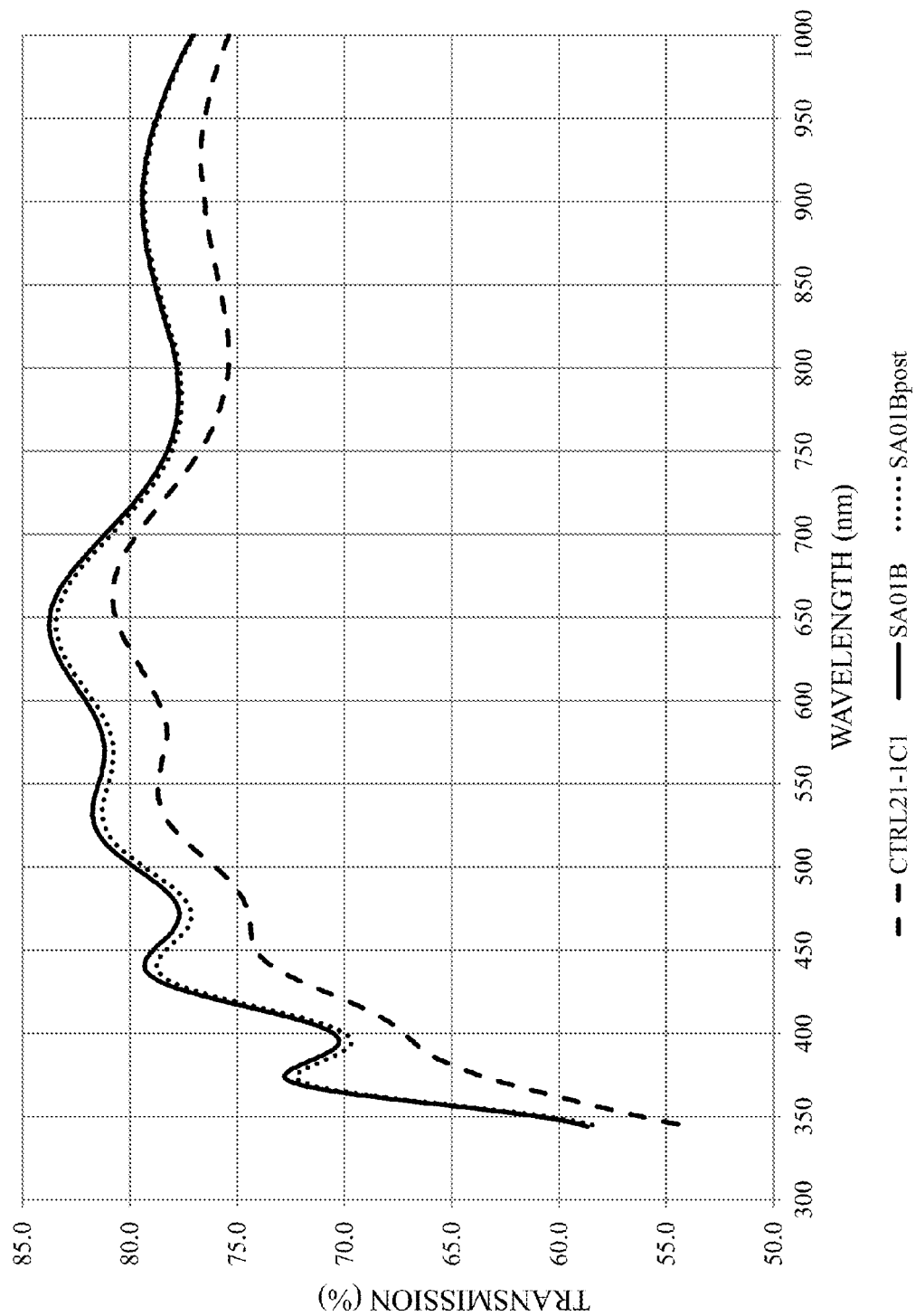
FIG. 2a illustrates the UV-vis transmittance spectra showing maximum transmittance enhancement of coatings on tin side of TCO glass substrates made from compositions given in Example 3 with pre- and post-abrasion spectra.

FIG. 2a illustrates the UV-vis transmittance spectra showing maximum transmittance enhancement of coatings on tin side of TCO glass substrates made from compositions given in Example 3 comparing pre- and post-abrasion spectra.

Figure 2B:
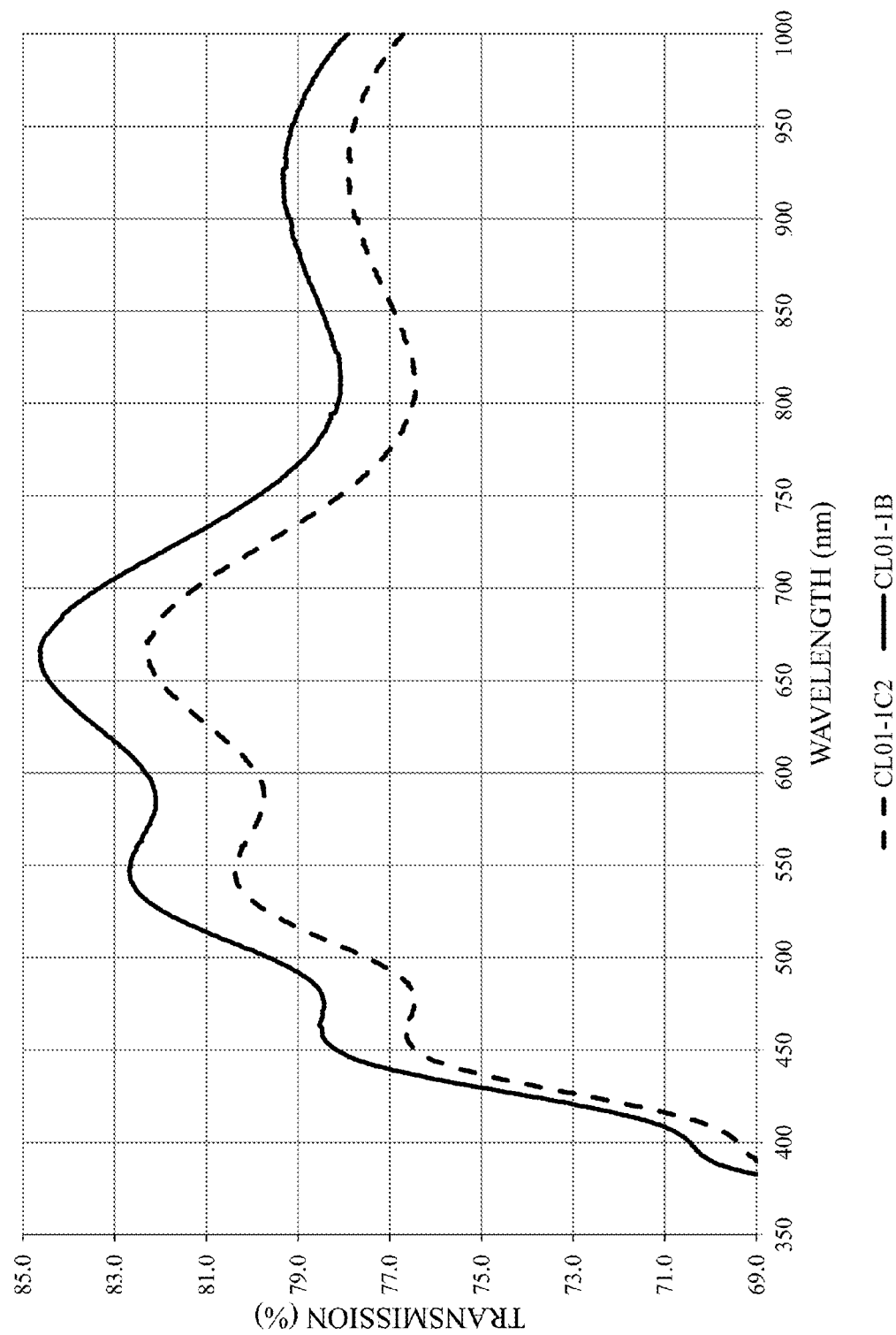
FIGS. 2b and 2c illustrate the UV-vis spectra of coatings on the tin side of a TCO glass substrate made from composition of example 5 and 7 respectively.
Figure 2C:
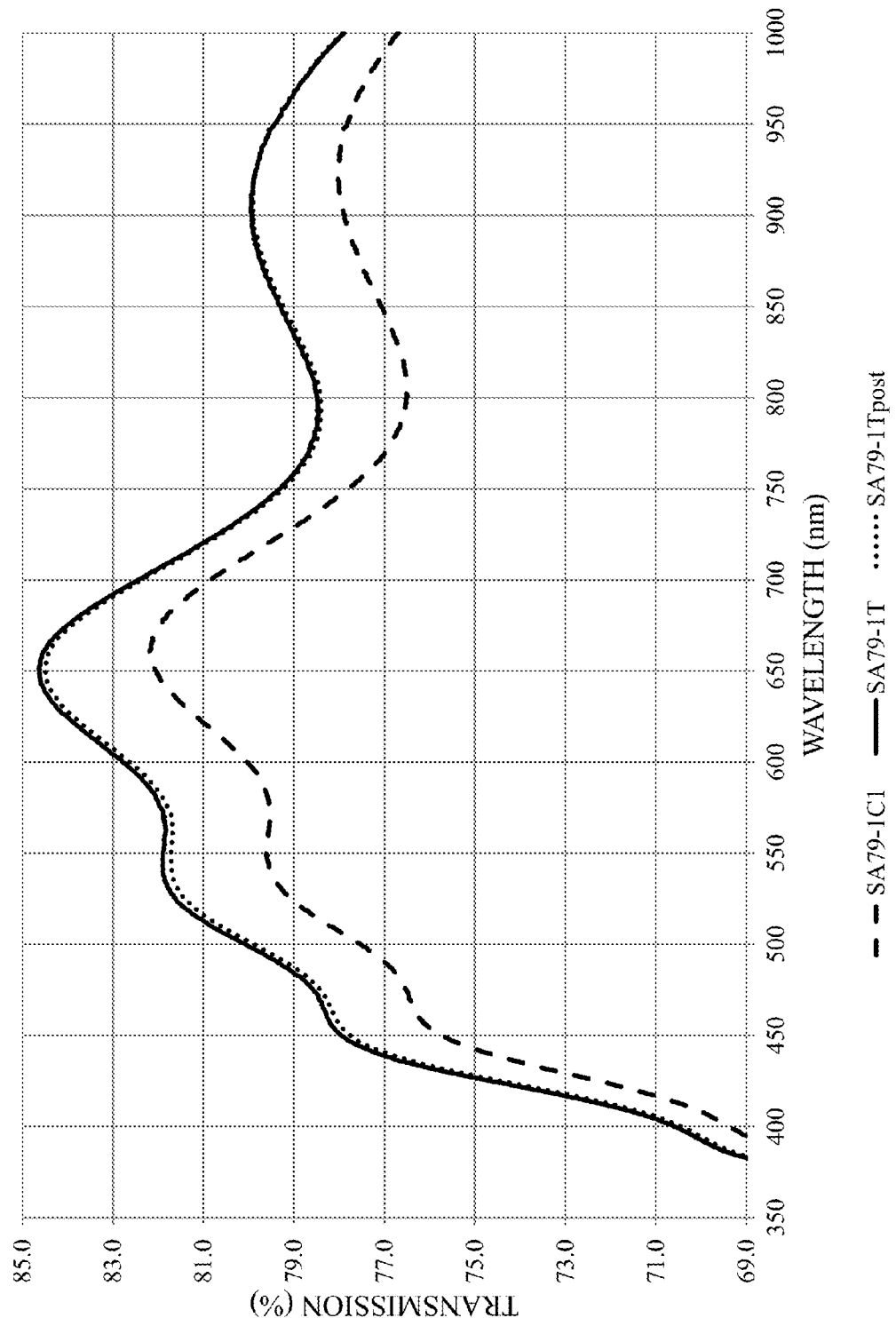

FIGS. 2b and 2c illustrate the UV-vis transmittance spectra of coatings made from example 5 and Sols from the three formulations could have different inherent viscosities and it would be preferable to be able to tune the viscosities of the sols such that their solar-weighted photon gain is maximized.

FIG. 3a is a TEM cross-sectional view of a coating made from the composition of Example 2 on a glass slide substrate. The TEM images show the absence of any discernible porosity in these coatings. The film thickness about 70-80 nm.

Figure 3B:
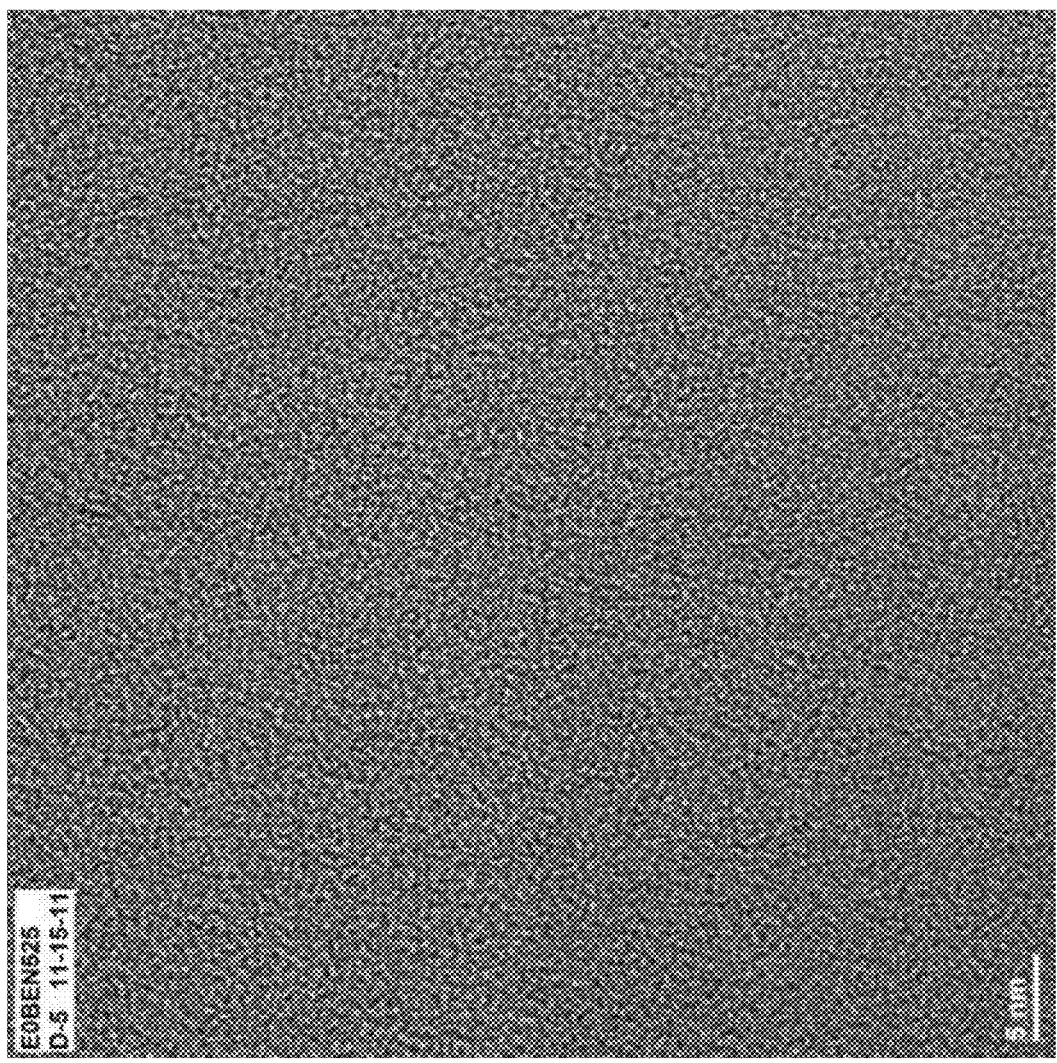
FIG. 3b is a High resolution TEM of a coating made from the composition of Example 2 on a glass substrate.

FIG. 3b is a HRTEM of a coating made from the composition of Example 2 on a glass slide.

FIG. 4 is an SEM cross-sectional view of a coating made from the composition of Example 2 on a 30×30 cm float glass substrate. The SEM images show the absence of porosity and a film thickness of 133 nm.

FIG. 5 is an SEM cross-sectional view of a coating made from the composition of Example 3 on a 30×30 cm float glass substrate. The SEM images show the absence of porosity and a film thickness of ~83 nm.

FIG. 6 is an SEM cross-sectional view of a coating made from the composition of Example 4 on a 30×30 cm float glass substrate. The SEM images show the absence of porosity and a film thickness of 76 nm.

It should be appreciated that in some embodiments, the coatings of the present disclosure provide an increase in transmission from about 1% to about 3.5% and in some embodiments from about 1.5% to about 3%, and a contact angle of about 80 degrees to about 120 degrees and in some embodiments about 85 degrees to about 100 degrees.

Typical hardness for a mixture of pure silica sol-gels coatings is observed to be around 1.05 GPa. Without wishing to be bound by theory, the enhanced mechanical properties of some of the coatings of this disclosure (as compared to pure silica-based coatings) may be due to several factors that contribute to increased hardness. First, the extensive cross-linking due to the use of the three-precursor system makes the Si—O—Si network stronger. Second, the combined use of organosiloxane and organofluorosiloxane enhances the noncovalent interactions between the organic side chains to promote better interactions that enhance the overall mechanical properties. Third, the increased interactions between the side chains promote a better filling of porous void space in the sol-gel network to make a homogenous and largely nonporous coating. Taken together, the unique combination of precursors along with the absence of visible porous microstructure and the enhanced side chain interactions between the organic groups provides the improved mechanical properties as compared to coatings of the prior art.

The anti-soiling and self-cleaning property of coatings of this disclosure can be tuned by changing the surface characteristics of these coatings. XPS data for coatings of this disclosure show how the fluorine content of the coatings can be varied from 0-9.1% and carbon content can be varied from 16.8% to 41.7%.

TABLE 12

XPS Data for Coatings of this Disclosure on Tin Side of TCO Coated Glass Subject to 20 sec Ar+ sputter to remove any adventitious impurities

| Sample | F % | C % | Si % | O % | N % | Na % | Ca % |
|---|---|---|---|---|---|---|---|
| Example 2 + 20 sec sputter | 9.1 | 41.7 | 16.1 | 32.1 | nd | 0.6 | 0.4 |
| Example 3 + 20 sec sputter | nd | 16.8 | 28.5 | 53.6 | nd | 0.7 | 0.3 |
| Example 4 + 20 sec sputter | 7.4 | 25.3 | 21.7 | 44.1 | 0.5 | 1.0 | nd |

TABLE 13

XPS Data for Coatings of this Disclosure in the native state and after 10 minutes of Argon Sputter Etch on Tin Side of TCO coated Glass

| Sample | F % | C % | Si % | O % | Sn % | Na % | Ca % |
|---|---|---|---|---|---|---|---|
| Example 2 as received | 11.9 | 39.5 | 14.9 | 32.7 | nd | 0.6 | 0.4 |
| Example 2 after 10 min sputter | 12.9 | 13.1 | 28.7 | 45.1 | 0.2 | Nd | nd |

A comparison of the XPS data for the as-received sample from Example 2 and the XPS data for the same sample after it is sputtered with Argon ions for 10 minutes show that fluorine from the coating material is present in the as-received sample and after the 10 minute etch. The data also shows that a small amount of tin from the tin side of the TCO coated float glass is detected along with the coating.

As indicated elsewhere herein, the coatings of this disclosure may be deposited on substrates by techniques known in the art, including dip coating, spraying, drop rolling, or flow coating to form a uniform coating on the substrate. A flow coating head, as depicted in FIG. 9, FIG. 10, FIG. 11, FIG. 12, FIG. 13, and FIG. 14 may enable improvements in flow coating. A process for roll coating is described in FIG. 15A, FIG. 15B, and FIG. 16.

Figure 9:
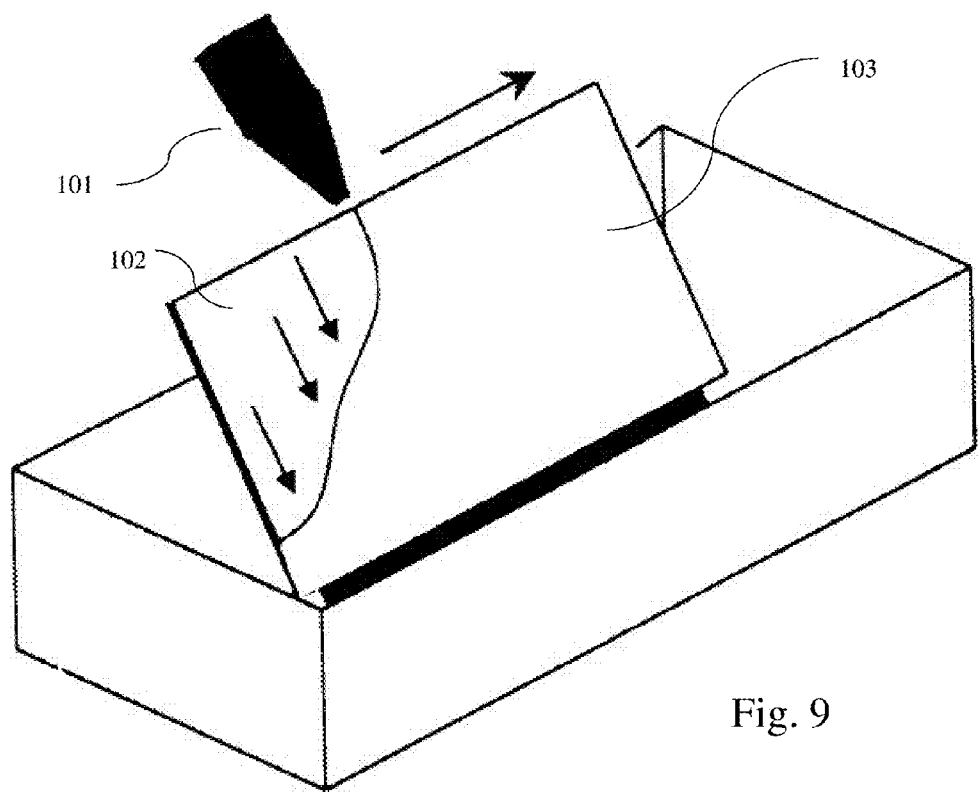
FIG. 9 depicts an embodiment of flow coating.

FIG. 9 depicts an embodiment of laboratory scale flow coating. In embodiments, a nozzle (101) dispenses a material (102) onto an inclined substrate (103) as it is moved across the top edge of the substrate. The material flows down the substrate, and the excess drips from the bottom edge of the substrate. The material that remains adhered to the substrate undergoes a gelation process as it dries and forms a thin-film coating on the substrate.

While the basic laboratory system shown in FIG. 9 can be scaled up in substrate size, its rate of coating may be slow and wasteful of coating material. It is possible to recover the coating material that drips off the bottom edge and recycle it to the nozzle, but this makes control of composition and contamination of the recycled material difficult. What is needed is a flow coating system that has a fast coating rate and that is economical with coating material with minimal wastage dripping from the bottom edge, without recycling of this material.

Figure 10:
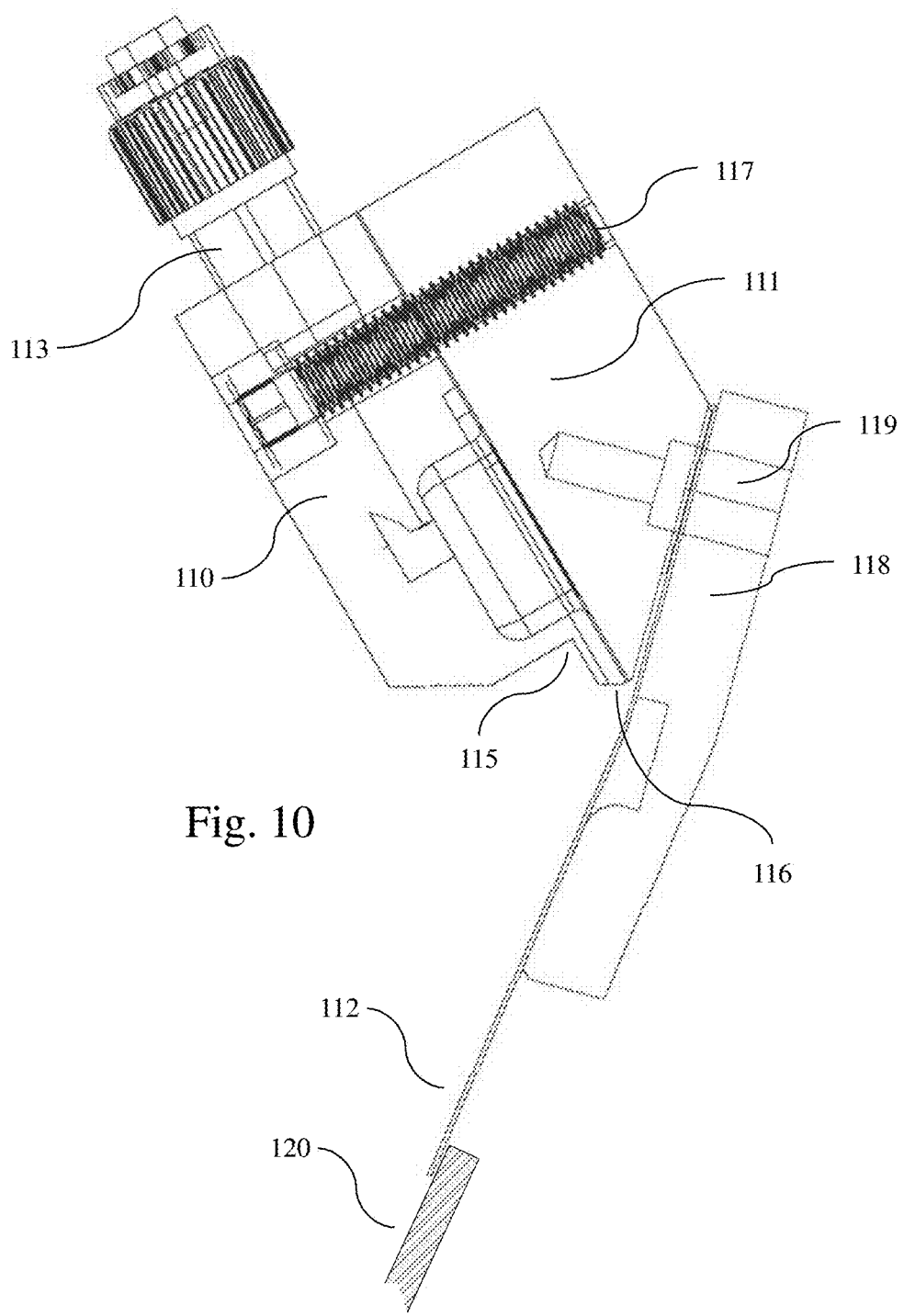
FIG. 10 depicts a cross-sectional view of an embodiment of a flow coating head.
Figure 13:
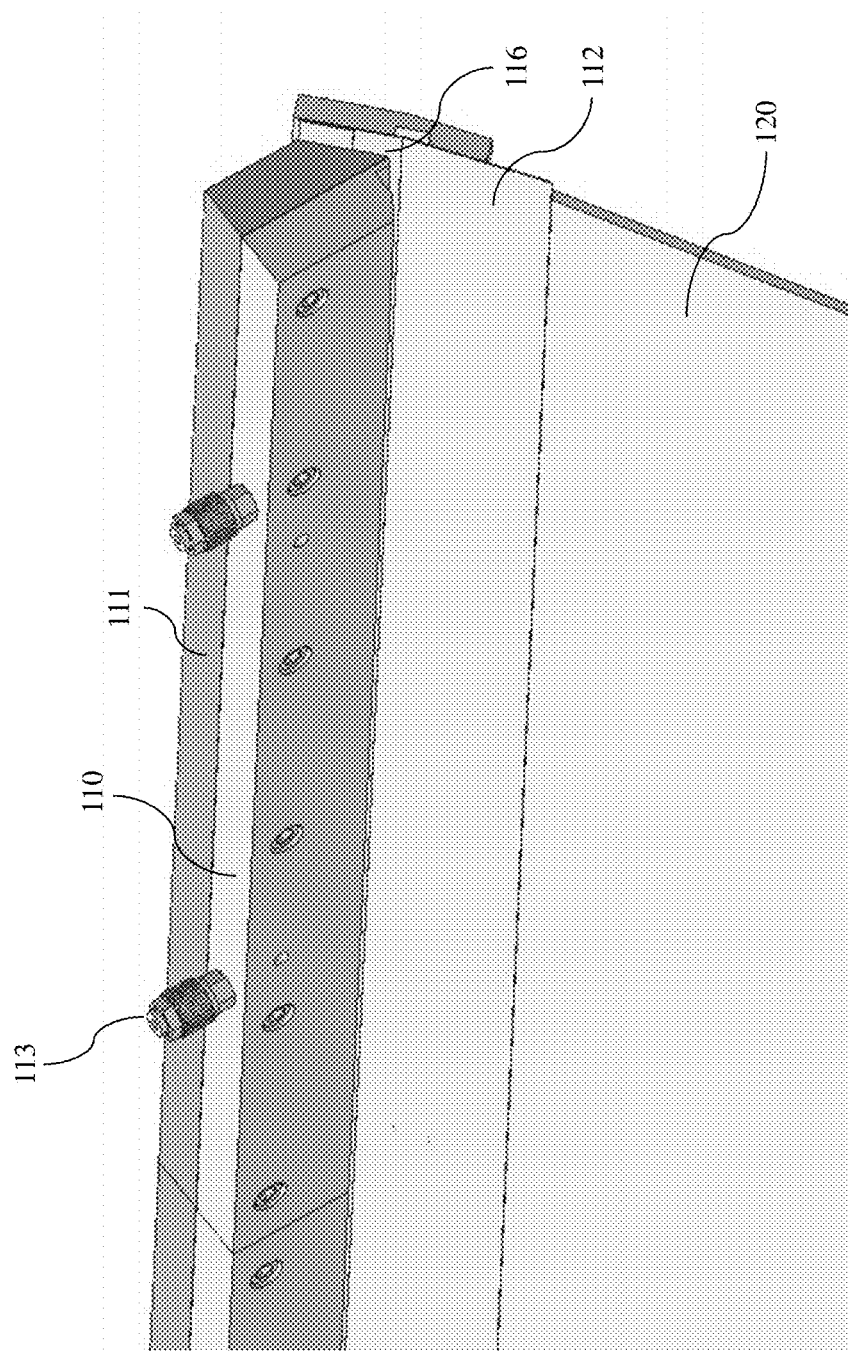
FIG. 13 depicts a partial view of the assembled flow coating head of FIG. 10 and a corresponding substrate.

In one embodiment, a coating head such as the one shown in FIG. 13 and in cross-section in FIG. 10 may be used in flow coating. The coating head includes a long slot (116) formed between a lower slot manifold (110) and an upper slot manifold (111). This slot is positioned parallel to and extends along the length of the top edge of an inclined substrate (120). In an embodiment, the slot is approximately as long as the edge of the substrate to be coated. For example, the slot may be oriented along the longer edge of a rectangular substrate, such that the fluid flows down the substrate along its shorter edge. This orientation minimizes the time required for gravity to carry the fluid across the entire area of the substrate. In an embodiment, a distribution blade (112) bridges the gap between the slot and the top edge of the substrate such that coating material flowing out of the slot is deposited on to the distribution blade and then flows under gravity to the bottom of the distribution blade, which contacts the front surface of the substrate just below the top edge of the substrate. The coating material then flows off the distribution blade onto the front surface of the substrate and from there down the substrate until eventually it either drips from the bottom edge or is removed by other means. The length of the distribution blade is slightly longer than the length of the slot and of the edge of the substrate that is being coated. In an embodiment, the distribution blade extends beyond each end of the slot manifold assemblies. For example, the distribution blade may extend 2-100 mm beyond each end of the slot manifold assemblies. In another example, the distribution blade may extend 10 mm beyond the substrate.

Figure 12:
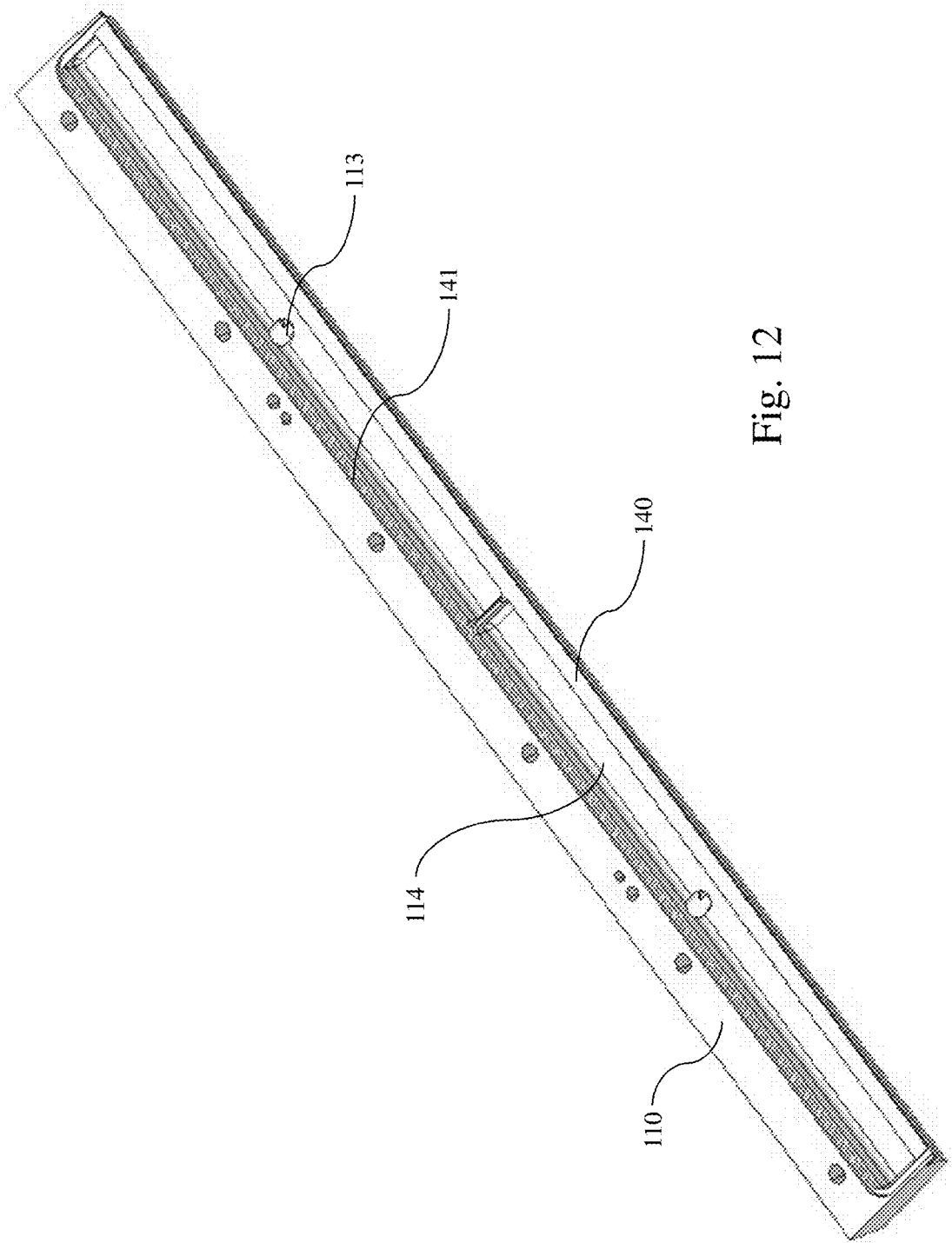
FIG. 12 depicts an isometric view of a flow coating head lower slot manifold.

Coating material is supplied to the slot by a dispensing system, such as a pump (not shown) capable of transferring the liquid coating material, and that is also capable of delivering a measured quantity of coating material through one or more inlet ports (113) in the lower slot manifold. The inlet port directs material into a corresponding internal pocket (114) within the lower slot manifold that allows the coating material to accumulate below the lip of the slot and to spread evenly along the slot before it begins to overflow the slot and flow onto the distribution blade, providing a uniform fluid front of material over the blade. FIG. 12 shows an isometric view of the internal detail of a lower slot manifold (110). The coating material flows from the port inlet, located in the middle of the internal pocket, outwards toward the ends of the internal pocket and so is distributed evenly along the back side of the slot lip (140). Once enough material has filled the internal pocket it will begin to overflow the slot lip evenly along the length of the slot. The upper slot manifold (not shown in FIG. 12) forms the opposing side of the slot. A seal channel (141) may allow the assembly to close to the appropriate slot width, as is described herein.

Figure 14:
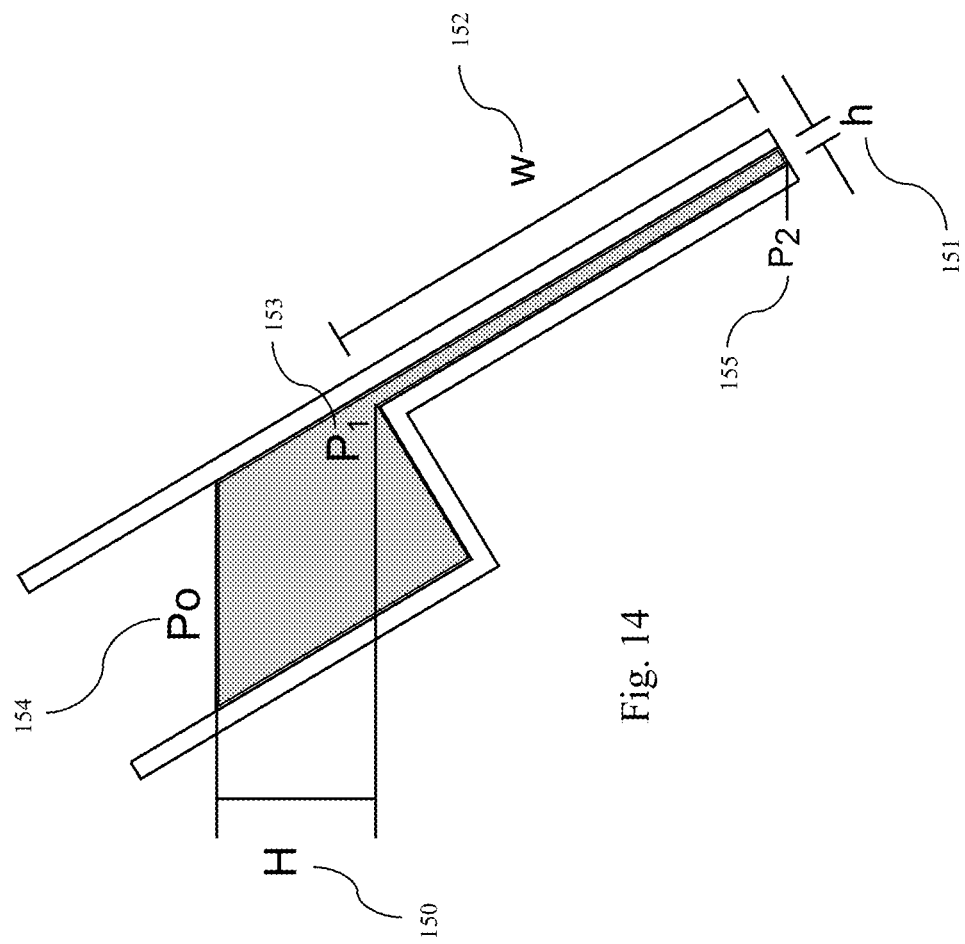
FIG. 14 shows a schematic cross-sectional view of a coating slot identifying several critical dimensions and parameters.

Producing high quality coatings of uniform thickness onto the substrate may depend on the rate at which the fluid flows through the slot. In turn, the rate at which the material flows may be highly dependent upon several factors of the design including the slot length (l), width (w) (152) and height (h) (151), as seen in FIG. 14, the viscosity ($\mu$) and density ($\rho$) of the coating material, and the pressure differential ($\Delta P$) over the width of the slot. In an embodiment, the fluid flow in the slot is both laminar and has a fully developed velocity profile upon exit onto the distribution blade. Laminar flow in the slot can be achieved by ensuring the fluid has a Reynolds number less than 1,400. In an embodiment, the Reynolds number (Re) of the coating fluid within the slot is less than 100. The coating fluid may exit the slot with a velocity profile that is independent of subtle edge effects, turbulence and other disturbances present at the coating fluid's entry into the slot. This condition can be achieved by ensuring the width of the slot is significantly longer than the flow's characteristic entrance length (Le). In an embodiment, the slot width is equal to at least 10 times the entrance length. Such a condition is governed in the following relation, which uses the Blasius approximation to solve for the entrance length between parallel surfaces:

$$L_e = \frac{hRe_h}{100}$$

The volumetric rate at which the coating fluid flows through the slot is closely approximated by the following relation:

$$Q = \frac{l\Delta Ph^3}{12w\mu}$$

With average flow speed, V, determined by:

$$V = \frac{Q}{lh}$$

In an embodiment, sol coating flow rates per unit slot length of between $5\times10^{-9}$ and $5\times10^{-4}$ m²/s are useful for coating glass substrates of high quality, and uniform thickness. In an embodiment with a 2 meter long slot, this equates to a volumetric flow rate between $1\times10^{-8}$ and $1\times10^{-3}$ m³/s. To prevent splatter or turbulent flow or other undesirable phenomena from impacting the distribution blade or substrate, coating material may not be forced from the slot under high pressure or flow rates. For example, gravity force may be used to drive fluid from the internal pocket to the distribution blade. In an embodiment, the slot is designed such that for the chosen coating material properties, the flow rate out of the slot is less than the flow rate into the internal pocket. This has the effect of building a reservoir of coating material behind the slot in the internal pocket, forcing it to spread evenly under the influence of gravity along the entire length of the slot and to build up a head height H (150), as in FIG. 14, inside the internal pocket. If the flow rate through the slot is too high, then coating material will completely flow through part of the slot before spreading along the entire length of the slot and reaching the ends furthest away from the inlet port. If the flow rate is too low, then the internal pocket may completely fill with coating material causing an increase in pressure that will create uneven flow rates and excessive back pressure on the coating fluid, and adversely affect the flow rate through the slot. All of these issues can cause the slot flow rate to vary and can affect the quality and uniformity of the coating. The pressure drop over the slot width, $\Delta P$, can be related the fluid head height within the interior pocket, H (150), the internal pocket pressure $P_O$ (154), pressure at the entrance to the narrow slot, P1 (153), and the pressure at the exit of the slot, P2 (155), the fluid material density $\rho$ and the gravitational constant g according to the following relationship:

$$\Delta P = P_1 - P_2$$

$$\Delta P = \rho g H + P_o$$

This pressure input as a function of head height, combined with the desired flow rate drives the desired slot height, h (151). As a result, careful consideration should be paid to the pressure in the internal pocket. Some embodiments keep the internal pocket sealed via a gasket, o-ring or sealant such that pressure is controlled by the relative flow rates of coating material into and out of the pocket. Other embodiments may include vents between the internal pocket and ambient pressure or to an auxiliary pressurization system. In an embodiment, pressure inside the pocket is vented to the atmosphere and slot height, h, is determined by the following relationship:

$$h = \sqrt[3]{\frac{12Qw\mu}{l\rho g H}}$$

Given the above parameters, for a typical sol coating, the width of the slot is between 0.05 and 2 mm, and preferably 0.1 to 0.5 mm. This width may be controlled by placing shims between the upper and lower slot manifolds. Alternative embodiments may use machined steps or other gap control methods. The assembly of upper and lower slot manifolds may have a gasket-like seal along the top and sides to ensure material is directed towards the slot. An O-ring or similar internal pocket seal may allow the assembly to close to the appropriate slot width, and may be facilitated with the use of a seal channel (141).

The distribution blade may serve at least three functions in enabling consistent and uniform coating thickness; 1) it provides a path for coating material to flow from the slot to the substrate; 2) it has a high energy surface that causes the material to spread evenly by surface tension during its travel from the slot to the substrate; and 3) it provides an interface to the substrate surface that is tolerant of imperfections in flatness or warping of the substrate. In one embodiment, the distribution blade is relatively more flexible than the substrate and is able to conform to an uneven or warped substrate. For example, the distribution blade is 316 L stainless steel, 2020 mm long, 45 mm wide and 0.38 mm thick and the substrate is tempered soda-lime glass 1970 mm long, 984 mm wide and 3.2 mm thick. In another embodiment, the distribution blade is relatively more rigid than the substrate and a mechanism clamps the substrate to the back surface such that it is held flat against the distribution blade. In one embodiment, the distribution blade has a surface energy between 25 mN/m and 100 mN/m.

The coating material exiting the head slot may not naturally form a continuous curtain or "waterfall" of coating material in the absence of the distribution blade, and instead, the coating material may exit the slot with many drips or small rivulets of material all along the length of the slot which may not result in a consistent or uniform thickness coating on the substrate. To achieve a curtain or "waterfall" out of the slot head in the absence of the distribution blade would require significantly greater flow rates of coating material, and could therefore result in significant waste of coating material. Thus, the distribution blade enables a consistent and uniform thickness coating with minimal material waste.

In FIG. 10, the distribution blade is a thin piece of material that is held in place by a backing plate (118) that along with the distribution blade is attached to the upper slot manifold (111) by a plurality of bolts or other fastening means (119). This backing plate also serves to tension the distribution blade by forcing it forward at a slight angle. This reduces warping of the thin distribution blade along its length. The upper and lower slot manifolds are held together by a plurality of bolts or other fastening means (117). In some embodiments the bottom edge of the thin distribution blade may be beveled or rounded. In a preferred embodiment it is beveled between 15° and 60°.

In some embodiments the distribution blade is made from a stainless steel alloy such as 316L. In other embodiments it could be made from titanium, chrome or nickel plated steel, various corrosion resistant alloys, glass, ceramics, polymer or composite materials such as a metal coated polymer. The material may be chosen to be chemically resistant to the composition of the coating material such that it is not damaged by the coating material and such that it does not contaminate the coating material in any way.

In FIG. 10, the lower slot manifold has a notch (115) just below the slot. The purpose of this notch is to prevent the flow of coating material from the slot along the bottom edge of the lower slot manifold and from there dripping on to the distribution blade or the substrate.

Figure 11:
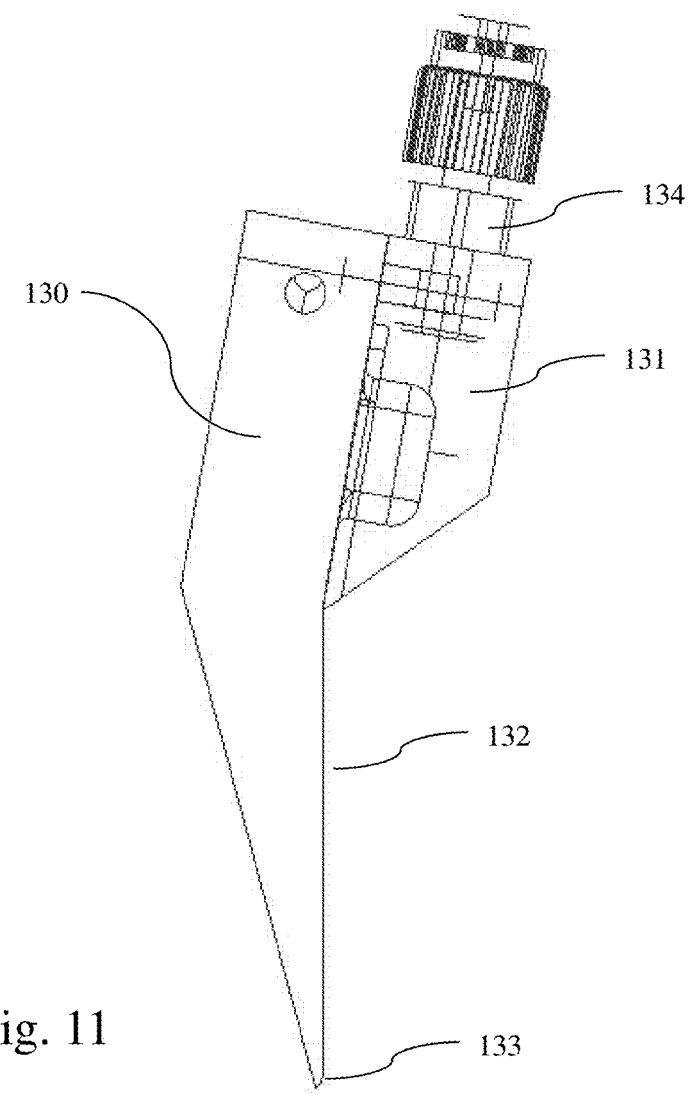
FIG. 11 depicts a cross-sectional view of a second embodiment of a flow coating head.

FIG. 11 shows an alternative embodiment of a distribution blade (130) wherein the blade is a solid piece of material that also forms the upper slot manifold. The front surface of the blade (132) acts to distribute the coating material evenly from the slot to the substrate. The bottom edge of the blade is profiled (133) to facilitate the flow of coating material from the blade onto the substrate. It should be understood that the exact shape of this profile can include curved or angled flat bevels and that the transition of angle from the face of the distribution blade can range from gradual to abrupt and that the final angle that the edge makes with the substrate surface can be from 10° (sharp) to 110° degrees (obtuse). In another embodiment, the thick or solid distribution blade does not also form the upper slot manifold, but is instead a separate piece that is bolted onto the slot manifold in a manner similar to the thin distribution blade shown in FIG. 10.

Some embodiments of the distribution blade include coatings or surface treatments on the front side (that is the wet side) and on the back side. For example, a front side surface treatment may enhance the spreading of the coating material as it flows to the substrate. A back-side treatment might repel the coating material to suppress material gathering on the backside due to capillary action that then dripped onto the substrate as it was removed from the distribution or gather on the backside and contaminate the next substrate positioned against the blade. Other embodiments of the distribution blade include laminates and composites where dissimilar materials are fused or assembled together to provide differences between the front and back-side surface properties as might also be achieved in the case of a coated metal blade.

Some embodiments of the coating head manifolds may have coatings or surface treatments to protect them from adverse chemical reactions with the coating material or to change how the coating material flows within the internal pocket or over the slot lip.

A full coating head may be composed of a plurality of slot manifold assemblies. For example each slot manifold assembly might be 50 cm long. Four such assemblies may be mounted on a supporting structure such that they form a 200 cm long coating head. The dimensions of the slot manifold assembly and the number of such assemblies used for a particular length of coating head may be selected to manage the cost of manufacturing the slot manifolds themselves and the complexity of constructing the coating head from multiple slot manifold assemblies. In the case where multiple slot manifold assemblies are used to assemble a coating head, it is advantageous to have a single distribution blade that is continuous over the entire length of the coating head. However, multiple adjacent or overlapping segments of distribution blade comprising the length of the coating head are not precluded.

It should be understood that the number of internal pockets and inlet ports within a slot manifold is variable and may be more or less than the two shown in FIG. 12. The number of pockets and inlet ports may be selected to manage the manufacturing complexity of the slot manifold and the uniformity of flow of coating material from the slot.

In the slot manifold, the wall between internal pockets may be kept as thin as possible. This wall affects the flow of material over the slot lip in its immediate vicinity. By keeping the wall as thin as is practical, the effect is minimized.

The method of coating using the apparatus may include the following steps. First, optionally, the substrate may be prepared for the coating by increasing the surface energy of the surface to be coated, thus making it possible for the coating material to spread evenly on the substrate surface by surface tension. In one embodiment, the substrate is glass and the surface energy is increased by washing vigorously with water and/or mechanical brushes. In other embodiments, the substrate surface may be prepared using gas plasma such as oxygen or by treatment with a gas flame. Other pretreatments are described further herein.

Next, the substrate to be coated may be positioned with its top edge aligned with and parallel to the bottom edge of the distribution blade. The bottom edge of the distribution blade may overlap slightly with the top edge of the substrate. The amount of overlap is dependent upon the coating requirements but may be at least 0.1 mm and in a preferred embodiment be approximately 3 mm. The ends of the distribution blade may extend slightly beyond the left and right edges of the substrate, between 2 and 100 mm on each side. In an embodiment, it extends by 10 mm on each side. The substrate may be inclined at an angle of 60° to 85° relative to horizontal. In the case of a flexible thin distribution blade, the angle between the surface of the substrate and the surface of the distribution blade may be between 0° and 5°. The substrate can be pushed slightly against the distribution blade to apply pressure to the contact area such that the distribution blade conforms to any gross irregularity or deviation from flatness of the substrate. In the case of a rigid distribution blade, the substrate may be positioned with its front surface parallel to the back surface of the distribution blade and a clamping mechanism may hold the substrate to the distribution blade such that any warping or deviation from flatness of the substrate is eliminated against the flat back side of the distribution blade. In one embodiment, the coating head is stationary and the substrate is brought to it. However, in other embodiments, the substrate may be stationary and the coating head moved to position or both elements may move together to arrive at the final coating position. It is also possible for both elements to be stationary relative to each other but to be moving relative to the larger coating system.

Next, the front surface of the substrate may be completely wetted with a pre-wet solution. This pre-wet solution is dispensed in a manner that quickly wets the entire substrate surface rapidly, such as in less than 30 seconds. In one embodiment, a plurality of fan nozzles positioned on a rotatable mechanism above and in front of the substrate and along its length aligned to the coating head starts spraying pre-wet solution such that it first wets the distribution blade along it entire length. Then the nozzle assembly rotates such that the fan shaped jets of pre-wet solution from the nozzles travel down the substrate from its top edge to its bottom edge and in the process deposit pre-wet solution on the full surface of the distribution blade and the substrate. When employed, the pre-wet step decreases the time for the coating material to completely wet the substrate to between 1 and 25 seconds; improves the uniformity of distribution of the coating material on the substrate to ±25% by volume per unit area and reduces the amount of coating material needed to completely coat the substrate by up to 90%. The composition of the pre-wet solution is chosen to provide a number of properties: The viscosity is within ±50% of the viscosity of the coating material and more preferably within ±10% and even more preferably within ±2% and/or the surface tension is within ±50% of the surface tension of the coating material and more preferably within ±10% and even more preferably within ±2% and/or the vapor pressure is within ±50% of the vapor pressure of the coating material and more preferably within ±10% and even more preferably within ±2%. In one embodiment, the pre-wet solution comprises the same mixture of solvents, mixed in the same ratios as the coating material. For example, the pre-wet solution might be composed of 90% isopropyl alcohol and 10% water that approximately matches the ratio of isopropyl alcohol and water in a sol-gel coating material. In an alternative embodiment, the pre-wet solution could be a non-ionic, cationic or anionic surfactant, such as for example sodium dodecyl sulfate or perfluoroalkyl sulfonate.

Next or some time shortly after the pre-wet step has commenced, a pre-determined amount of coating material may be dispensed from the coating head on to the substrate. The coating material flows down the substrate completely covering the front surface of the substrate. Excess coating material may drip from the bottom edge or be wicked away from bottom edge by capillary action onto a mechanism designed for that purpose. In some embodiments, excess coating material may be collected at the bottom of the substrate for reuse. The decision to reuse this material or not depends on the composition of the coating material and substrate. For example, if the coating material is quite stable and does not significantly change during the time it travels down the substrate and if the substrate does not contaminate the coating material then a decision might be made to reuse excess material collected from the bottom edge.

Next, optionally, there may be a pause of between 1 and 600 seconds after the dispensing of coating material has finished while excess coating material is able to drain out of the internal pocket and from the wet surface of the distribution blade onto the substrate. The length of this pause may be optimized to reduce the possibility of drips from the distribution blade after the substrate is removed from the coating head. In some embodiments, this pause may be long enough to allow the distribution blade and/or the top area of the substrate to dry or partially dry.

Next, the substrate may be withdrawn from the coating head. In some embodiments, if the coating head is still wet, a drip guard may quickly move into place between the substrate and the bottom edge of the distribution blade. This drip guard may optionally touch the bottom edge of the blade to wick away excess material in which case the surface of the drip guard may have similar surface characteristics to the front surface of the distribution blade to encourage the coating material to easily flow off the distribution blade.

Finally, the substrate may be allowed to dry in a manner that allows the coating material to undergo gelation such that a uniform high quality coating is formed on the substrate surface.

This coating method, enabled by the novel design of the coating head can have several of the following advantages over alternative coating techniques. First, by dispensing material simultaneously across the full width of the substrate the time to dispense can be greatly shortened. Second, by pre-wetting the substrate the amount of time for the coating material to flow down the substrate can be greatly shortened and the amount of coating material required to fully wet the substrate surface is greatly reduced. Third, if coating material is not collected at the bottom of the substrate for reuse then only fresh (virgin) material can be deposited on the substrate so control of coating material purity and composition can be greatly increased. Fourth, by utilizing a distribution blade in conjunction with a properly sized slot dispenser, the uniformity of flow of material on to the substrate can be greatly increased at very low cost and with a very simply system. Fifth, the technique can be very tolerant of deviation of flatness on the substrate without requiring any precision mechanical control or design. Sixth, the method does not necessarily pose any significant chemical compatibility challenges where it may be difficult to identify critical coating components with properties that are not sensitive to or contaminate the coating material. Finally, the method can be inherently single sided allowing the flexibility to coat one side of the substrate or both (in a second coating step) if needed.

Is should also be understood that in some embodiments the formulation of the coating material will have a significant effect on the uniformity of the thin-film. In particular, in a sol-gel coating material the ratio of solids or particle content to solvent in conjunction with the ambient conditions during drying may affect the gelation process that occurs as the thin-film forms. Careful control of these elements will enhance the uniformity of the final thin-film especially in the top to bottom direction on the substrate.

Figure 15A:
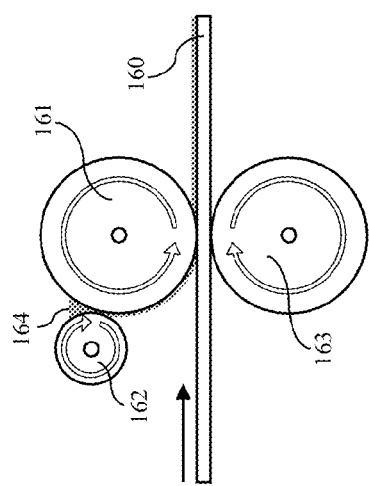
FIGS. 15a and 15b depict a roll-coat system optimized for coating on flat substrates.
Figure 15B:
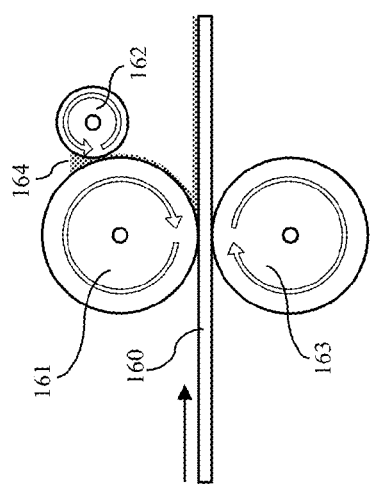

FIG. 15a shows a simplified schematic of a forward roll coating apparatus. FIG. 15b shows a simplified schematic of a reverse roll-coating apparatus. In both figures, a flat substrate (160) is fed from left to right. A counter pressure roller (163) supports the substrate from the bottom and moves in a complementary direction to the movement of the substrate. A coating material (164) is deposited in a reservoir created between a doctor roller (162) and an application roller (161). The pressure or spacing of the doctor roller to application roller controls the amount of coating material that is transferred to the application roller. The surfaces of the doctor and application rollers may be smooth or textured, soft or hard. The roller surfaces need not be the same. For example, the doctor roller may be compliant and textured while the application roller could be hard and smooth and vice versa. The application roller transfers coating material to the surface of the substrate. The pressure or distance between the application roller and the substrate surface is adjustable to facilitate control of the final wet-coating thickness and/or uniformity of the material on the substrate. In forward roll-coating, the application roller (161) moves in the same direction as the direction of motion of the substrate. In reverse roll-coating, the application roller (161) moves in the opposite direction to the motion of the substrate.

The substrate may be continuous, such as for example a roll of polymer sheet or steel, or it may be discontinuous, such as discrete pieces of glass or wood or individual solar modules. In the case of discontinuous substrates, the application roller assembly may be moved in a vertical direction such that it touches down on the leading edge of the substrate as it enters the roll-coater and then lifts off the trailing edge as the substrate exits the roll-coater. This technique may reduce uniformity on the leading and trailing edges.

The selection of the materials within the roll-coater that come into contact with the liquid coating material are a consideration. In some embodiments, the coating material may be corrosive, having either a high or low pH. In an embodiment, the pH of the coating material is between 1.8 and 2.8. Additionally, in some embodiments, the coating material contains organic solvents such as iso-propyl alcohol, methanol, ethanol, propanol, propylene glycol monomethyl ether (PGME), propylene glycol monomethyl ether acetate, and the like. All materials may be selected to withstand both the organic solvents and pH conditions used. For metallic components, stainless steel is preferential with chrome-plated steel, for example. In selecting polymer materials for pipes, fittings and seals made from polytetrafluoroethylene, polypropylene, polyether ether ketone, and polyvinylidene difluoride may be considered. For polymer coatings on the rollers polyurethane, EPDM (ethylene propylene diene monomer) rubber and nitrile rubber are suitable. The particular embodiment of a roll-coater selected for a specific sol-gel coating application depends upon a number of factors. The wet film thickness is a process parameter to consider in achieving the final cured film thickness. The desired wet thickness may be dependent on the desired final dry thickness, the solids content of the coating material and the target porosity of the final dry film. In one embodiment, the desired final thickness is 120 nm (DT), the solids content (SC) of the coating material is between 1% and 3% by volume and the target porosity (P) is 10%. The target wet thickness (WT) may be calculated with the following formula:

$$WT = \frac{DT}{SC*(1-P)}$$

Figure 16:
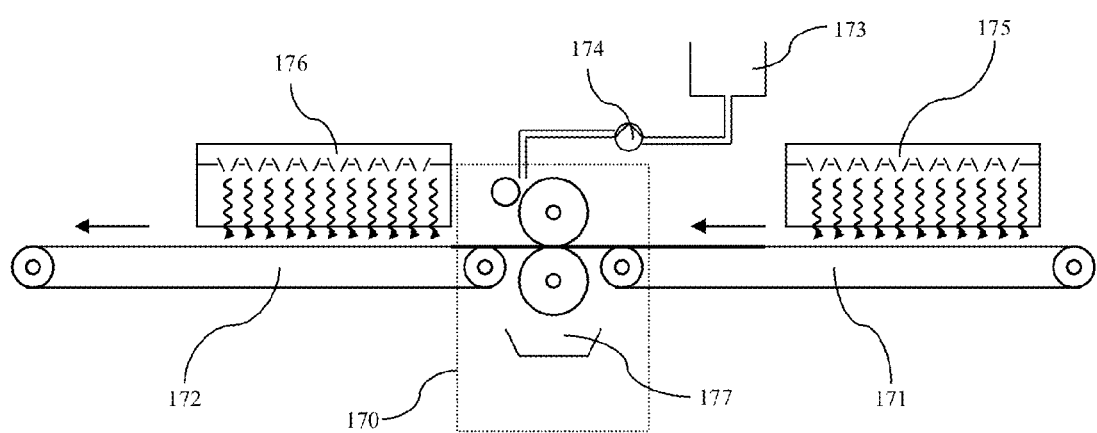
FIG. 16 depicts an embodiment of a roll-coat system for flat substrates.

For example, the equation yields a target wet thickness between approximately 4 μm and 14 μm using the input parameters above. Wet thickness can be controlled by a number of process controls on the roll-coater system. Selection of which parameters are most important is dependent upon the characteristics of the coating material, such as for example its viscosity, and the architecture or operation mode of the roll-coater, such as forward or reverse. Typically, the parameters adjusted are the doctor roller spacing and/or pressure to the application roller; the application roller spacing/pressure to the substrate; the speed at which the substrate moves and in the case of reverse roll-coating the difference in speed between the substrate and the application roller. The speed at which the doctor roller moves relative to the application roller is also a process parameter. FIG. 16 shows an embodiment of a roll-coater used for sol-gel coating of flat substrates such as glass or solar modules. The roll-coater (170) is positioned after a feed-in conveyor (171) and ahead of a feed-out conveyor (172). In FIG. 16, substrates move from right to left. Coating material (173) is fed to the roll-coater from a storage tank at a controlled rate by a pump (174). Excess material is collected (177) off the ends of the rollers and recirculated. An optional pre-heater (175) may be positioned such that it can heat the substrate prior to the roll-coater. The substrate may be heated to a temperature between about 2° C. to about 80° C. and between about 20° C. to about 50° C. and between about 30° C. to about 40° C. In some embodiments this pre-heat step may be used to reduce thermal stress during the very rapid heating of subsequent process step. In some embodiments the pre-heat step may be used to achieve specific coating process targets such as uniformity, thickness, porosity, pore-size, pore-morphology, pore-distribution in the coating, pore-size distribution and process speed. Careful consideration should be paid regarding heat transfer from warmed substrates to the application roller such that it is accounted for in the process. In some embodiments a flash-off heater (176) is positioned at the output of the roll-coater to control evaporation of the solvent of the coating material to facilitate the gelation of the thin-film. In some embodiments the coating material may be heated to a temperature of between about 25° C. to about 60° C. and between about 30° C. to about 50° C. In some embodiments, the pre-heater and the flash-off heater may be radiant infra-red or they may be electric or fuel fired convection heaters or a combination or the like. In some embodiments forced air at ambient or close to ambient temperature could be used to accomplish the flash-off process by accelerating solvent evaporation.

The conveyor systems used to move substrates between process stages may be continuous belt driven systems. In some embodiments robots might be used to convey substrates between process stages. In other embodiment substrates might be conveyed by humans using carts. In any case it should be understood that substrates may be conveyed between process steps by many means known in the art.

An important consideration when using roll-coaters is accommodating or controlling for evaporation of coating material solvent from the equipment itself as the machine is running. To mitigate this evaporation, it can be advantageous to add make-up solvent to the coating material such that the solids concentration is controlled within a workable range. Make-up solvent can be added at a constant rate known to match the steady-state rate of evaporation; it can be added periodically based on pre-determined intervals based on time, quantities of substrates coated, or coating material consumed. Make-up solvent can be added based on an active feedback loop wherein the solids concentration is measured directly or indirectly and then used to control the amount added. Solids concentration might be measured by optical means such as dynamic light scattering or adsorption or refractive index; it could be measured by physical properties such as for example density or viscosity; it could be measured chemically such as for example monitoring pH.

Sol-gel materials used for coatings are often sensitive to environmental conditions such as relative humidity and temperature during the gelation process. Additionally, sol-gel materials may release significant amounts of solvent vapor prior to or during cure. It is therefore desirable to engineer the environment around the roll-coating system such as that temperature and humidity are controlled, and solvent vapor is removed. In some embodiments a containment chamber is built around the complete roll-coater system with a dedicated HVAC unit to control temperature and relative humidity. In an embodiment, there is a secondary interior containment around the coater application roller and the flash-off area that is small in volume such that its temperature and relative humidity can be controlled more easily. This interior containment area is also used to collect solvent vapor for venting, destruction or recycling. This has an additional advantage to prevent people working inside the primary containment area from being subjected to elevated levels of solvent vapor. Such an environmental chamber system would have safety interlocks such that the tool could be stopped and any coating material safely contained if the solvent vapors approached flammability safety limits.

Figure 17:
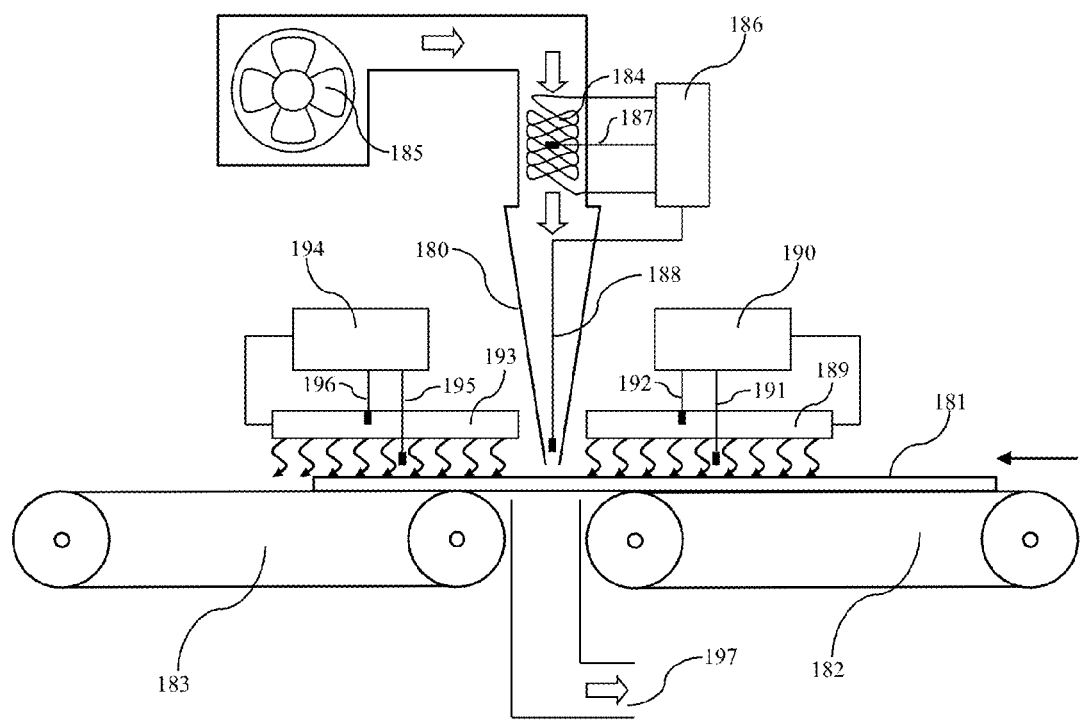
FIG. 17 depicts an embodiment of a skin-cure system.

FIG. 17 shows a cross-sectional schematic view of one embodiment of a curing apparatus and method for skin-cure. In this apparatus, an air-knife (180) directs heated air on to the surface of a substrate (181) presented to the air-knife by a feed-in conveyor (182) and extracted by a feed-out conveyor (183). The air may be heated by an electrical element (184), as shown in FIG. 17, may also be heated by any other method known in the art. The air may be heated to any temperature useful in the method, such as to a temperature of 300° C. to 1000° C. Air may be forced through the heating element and air-knife by a fan (185). The temperature of the air is controlled by an electronic controller (186) and temperature sensor (188) located in the heated air stream. Optionally, overheat protection of the heating element may be provided by the electronic controller and, optionally, a second temperature sensor (187) located close to the heating element. When no substrate is present, air may flow from the fan through the heating element, through the air-knife and then directly to the exhaust (197). When a substrate is present, the air flows along the top surface of the substrate. In an embodiment, a pre-heating stage (189), for example an infra-red emitter, heats the substrate prior to the air-knife. The pre-heat temperature is controlled by an electronic controller (190) and a temperature sensor (191) with an optional safety over-heat sensor (192). In another embodiment, a flat plate attached to the leading edge of the air-knife forms a pre-heat chamber (189) with the top surface of substrate. This pre-heat chamber traps the hot air close to the substrate surface for a longer period allowing the hot air more time to pre-heat the substrate surface. A post-heating stage (193), for example an infra-red emitter (190) located subsequent to the air-knife provides additional heat that can extend the time that the substrate stays at an elevated temperature. The post-heating temperature is controlled by an electronic controller (194) and a temperature sensor (195), with an optional safety over-heat sensor (196). In another embodiment, there is a heating element in place of the pre-heat chamber. The pre-heating of the substrate can serve to reduce thermal stress during the very rapid heating under the air-knife and to provide an additional control on the peak temperature the substrate reaches under the air-knife, the peak temperature being a function of the initial temperature plus the temperature rise due to the air-knife.

A major advantage of this embodiment of a skin-cure system is that it allows the curing of a thin-film sol-gel coating without heating the entire substrate to a high temperature. A properly configured air-knife is able to heat the surface very fast (high power) without imparting a great deal of heat (energy) to the full substrate. Thus while the surface heats rapidly to a high temperature the overall substrate does not heat up excessively. In one embodiment the substrate is glass coated on one side with thin-film solar cells, and the opposing side of the glass is the desired surface for the sol coating. In this case, it is desirable to avoid heating and raising the temperature of the semiconductor photovoltaic material as much as possible while curing the sol coating. Thin-film solar materials such as CdTe, CIGS or amorphous silicon can be quite sensitive to elevated temperatures. High temperatures can cause dopants within the material to defuse in a detrimental manner or can cause metal electrode materials to defuse into the photovoltaic material. In some embodiments, the temperature of the photovoltaic cell may be kept from exceeding 100° C. to 120° C. as the sol is cured. Additionally, polymer materials within the finished solar module such as encapsulates may be kept from exceeding their glass transition temperature of 150° C. to 200° C.

Figure 18:
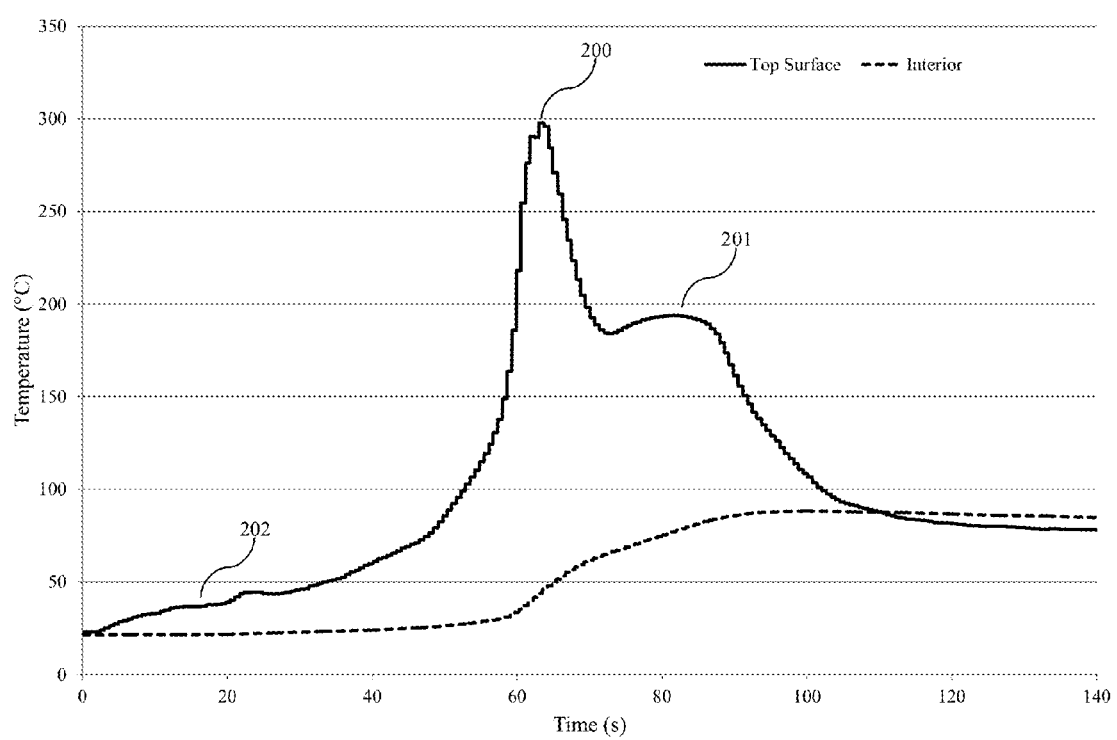
FIG. 18 depicts an example temperature profile for a skin-cure system.

FIG. 18 shows an example temperature profile for a skin-cure system. In this example the substrate is a dummy thin-film solar module consisting of two pieces of glass typical of those used in thin-film module manufacturing, laminated together with temperature sensors embedded between the glass sheets such that they measure the interior temperature of the dummy module and temperature sensors attached to the top surface. The module is moved at a speed of 1 cm/s under an air-knife set to an exit air temperature of approximately 650° C. and a gap distance (from substrate top surface to the air-knife opening) of approximately 1 cm. Two temperatures are shown, the top surface temperature representing the temperature reached by the interior of the dummy module. In this example the pre-heat chamber embodiment was used. From the profile, the pre-heat chamber caused an initial rise in temperature of the top surface (202) to approximately 100° C., there after the air-knife caused a very rapid temperature rise (200) to approximately 300° C. after which the post-heat infra-red emitter set to a temperature of 300° C. as measured by a sensor placed between the substrate and the IR emitter, maintains the top surface temperature (201) at approximately 200° C. Through-out the process the interior temperature never exceeds approximately 90° C.

In one embodiment, the substrate is glass of thickness 1 mm to 4 mm. In an embodiment of a skin-cure apparatus, the air-temperature exiting the air knife is between 500° C. to 750° C. as controlled by the power setting of the heating element and the volume of air provided by the fan. The speed of the substrate is between 0.25 cm/s and 3.5 cm/s. The resulting temperature of the substrate surface is between 150° C. to 600° C. and this temperature is attained between the start of the pre-heat chamber and the end of the air-knife. In other embodiments the substrate is pre-heated by an infra-red emitter to approximately 25° C. to 200° C. prior to the air-knife wherein it is further heated to approximately 150° C. to 600° C. Thereafter, the substrate is maintained at a temperature of between 120° C. to 400° C. until the end of the post-heat section. Such a configuration of the skin-cure apparatus has been shown to cure the sol coating while leaving the opposing surface at a temperature below 120° C.

The process of rapidly heating the substrate using the air-knife and then maintaining that temperature with radiant heat facilitates the curing of the sol-gel material. In an embodiment, the curing is achieved by providing sufficient energy so that a sufficient portion of the remaining Si—OH moieties within the coating undergo a condensation reaction and form Si—O—Si crosslinks that greatly strengthen the material enabling it to pass Taber abrasion testing to standard EN1096.2 with no more than 0.5% loss of absolute transmission. In other embodiments, the curing temperature is used to facilitate other processes such as volatizing a sacrificial component of the coating to form a desired porosity or a desired surface morphology. Other embodiments may use very high temperatures to completely oxidize all organic components in the coating creating a hydrophilic pure silica film. Yet further embodiments may use the heat and/or reactive gas composition of the air-knife to initiate chemical reactions that modify the properties of the coating, such as for example, surface energy, color, refractive index, surface morphology and surface chemistry. In embodiments, the skin-cure process works in concert with the composition and properties of the coating material to facilitate tuning of the properties of the final thin-film coating.

The foregoing apparatus and methods are particularly well suited to the application of sol-gel thin-films to glass. In an embodiment, the glass to be coated is the front (sun facing) surface of a solar module and the sol-gel thin-film is an anti-reflective coating. Either bare glass may be coated and/or cured by the apparatus or fully assembled solar modules or solar modules at any intermediate stage of manufacture. In other embodiments, the apparatus may be used to coat and/or cure windows, architectural glass, displays, lenses, mirrors or other electronic devices.

In an aspect, a coating and curing apparatus may include a conveyor system of a combination roll coating and curing facility, wherein the combination roll coating and curing facility comprises at least one roll coating facility and at least one curing facility, and wherein the conveyor system is adapted to transport a substantially flat substrate through the combination roll coating and curing facility, a processor that controls a process parameter of the at least one roll coating facility, and an air knife of the at least one curing facility, wherein the air knife is adapted to direct heated air to a portion of the flat substrate as it is transported through the at least one curing facility, wherein the at least one roll coating facility is adapted to coat the substantially flat substrate with a sol gel coating material. The substantially flat substrate may be a part of at least a partially finished solar module. The apparatus may further include an electrical element disposed within the air stream to heat the air flowing through the air knife. The air may be heated to a temperature between about 300° C. and 1000° C. The apparatus may further include a fan in the air stream that directs air to the air-knife. The apparatus may further include an electronic controller that controls the temperature based on readings from at least one temperature sensor located in the air stream. The apparatus may further include an exhaust to remove heated air from the apparatus. The apparatus may further include a flat plate attached to the leading edge of the air-knife, wherein the flat plate is adapted to form a pre-heat chamber with the top surface of the substantially flat substrate. The apparatus may further include an infra-red emitter disposed along the conveyor system prior to the air knife, wherein the infra-red emitter is adapted to heat the substantially flat substrate to a temperature of between 25° C. to 200° C. The apparatus may further include an infra-red emitter disposed along the conveyor system subsequent to the air knife, wherein the infra-red emitter is adapted to maintain the flat substrate at a temperature of between 120° C. to 400° C. The process parameters may include at least one of a doctor roller spacing and/or pressure to an application roller, the application roller spacing or pressure taken with respect to the substantially flat substrate, a speed at which the substantially flat substrate is conveyed by the conveyor system, and in the case of reverse roll-coating, a difference in speed between the substantially flat substrate and the application surface of the application roller. The processor may further control a process parameter of the curing facility. A plurality of roll coating facilities and curing facilities may be arranged sequentially. The air-temperature exiting the air knife may be between 500° C. to 750° C. The speed of the substantially flat substrate on the conveyor system may be between 0.25 cm/s and 3.5 cm/s. The resulting temperature of a surface of the substantially flat substrate may be between 150° C. to 600° C.

In an aspect, a method of coating and curing may include conveying a substantially flat substrate to be coated with a conveyor system through a combination roll coating and curing facility, wherein the combination roll coating and curing facility comprises at least one roll coating facility and at least one curing facility, roll coating the substantially flat substrate with a sol gel coating material with the at least one roll coating facility, and curing the sol gel coating material on the substantially flat substrate with an air knife of the at least one curing facility, wherein the air knife is adapted to direct heated air to a portion of the substantially flat substrate as it is transported through the curing facility by the conveyor system. A sol-gel coated substantially flat substrate may be formed by the method, wherein a portion of the sol-gel coating material is cured while a different portion of the sol-gel coating material remains uncured.

In an aspect, a method of tuning the performance of a sol gel coating may include determining a desired cure temperature profile to achieve a specific performance metric for a sol gel coating using at least one physical analysis method, selecting settings for an air knife curing system's operating parameters to achieve the desired temperature profiles for the sol gel coating on a substantially flat substrate, and curing the sol-gel coating on the substantially flat substrate with the air knife curing system. The at least one physical analysis method may include at least one of thermogravimetric analysis, Fourier transform infrared spectroscopy, ellipsometry, nanoindentation, abrasion testing, spectrophotometry, and a water contact angle measurement. The air knife curing system operating parameters may include at least one of substrate speed, air knife air-flow volume, air knife output air temperature, air knife opening distance to substrate surface, a temperature set-point for a pre-heating zone and a temperature set point for a post heating zone. The performance metric for the sol-gel coating may include at least one of hardness, abrasion resistance, surface energy, refractive index, optical transmission, thickness and porosity. The method may further include a step of coating the substantially flat substrate with the sol gel coating using a roll-coating system before the step of curing. A sol-gel coated substantially flat substrate may be formed by the method. The specific performance metric may include a hardness of the sol-gel coating within a range of 0.2 GPa to 10 GPa. The specific performance metric may include a test in which no more than 1% of absolute optical transmission is lost after at least 500 strokes of an abrasion test performed in accordance with specification EN1096.2. The specific performance metric may include a water contact angle where the water contact angle is within 60° to 120°. The specific performance metric may include a water contact angle where the water contact angle is within 5° to 30°. The specific performance metric may include a refractive index of the cured, coated sol gel from 1.25 to 1.45. The thickness may be approximately 50 nm to 150 nm. A sacrificial component of the sol-gel coating may be volatilized to form a desired porosity.

Figure 19:
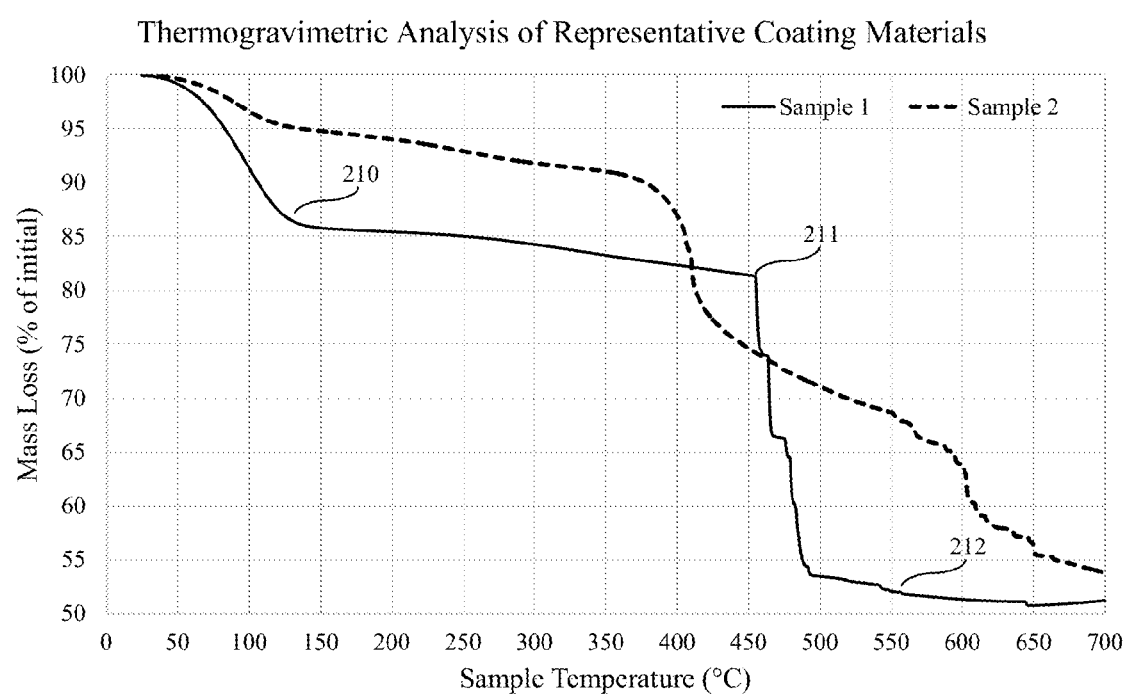
FIG. 19 depicts an example of thermogravimetric analysis of representative samples of coating material.

FIG. 19 shows a thermogravimetric analysis of representative samples of coating material. Thermogravimetric analysis is performed by heating a sample gradually and recording the loss of mass as various components of the sample volatilize. When performed on coating materials such as these example sol-gel coatings for glass, it can be used to determine critical temperatures required to cure the coating material. The figure shows three temperatures of interest. Using Sample 1 from Example 3 in FIG. 19 as an illustrative example, there is a point of inflection (210) at approximately 125° C., another much steeper point of inflection (211) at approximately 450° C. finally there is a flattening out (212) above 500° C. Without being bound by theory, these three points are interpreted as follows. As temperature increases to point 210 any residual water and solvent is volatilized and all easily accessible Si—OH moieties react, condense and release water. This represents a cured film that has attained a useful hardness and abrasion resistance at a relatively low temperature. Further heating in the range from point 210 until point 211 represents an approximately linear reduction in mass as additional remaining Si—OH moieties condense and release water. This temperature range represents increasing hardness and abrasion resistance of the material with increasing temperature, without detrimental effects on the coating. This reduction in mass causes a corresponding decrease in density and hence a decrease in refractive index.

In coating materials that form hydrophobic films, the reduction in Si—OH may also result in an increase of the hydrophobic effect as measured by increasing water contact angle. Heating beyond point 211 begins to oxidize organic moieties within the coating and decomposes the material, the byproducts of which may then volatilize. In some embodiments these moieties may be methyl groups or other hydro-carbon groups or fluoro-carbon chains or any combination thereof. Other reactions may also occur such as for example the formation of SiC and $Si_xO_yC_z$. This temperature regime may be generalized as the oxidation of the organic components of the coating, reactions between byproducts of that oxidation with each other and with components of the film itself and the transformation of the coating to a substantially inorganic silica coating. At this point further heating no longer causes significant mass loss and the curve flattens out as indicated by point 212. Sample 2 of example 2 exhibits approximately the same shape and inflection points as Sample 1. It also illustrates that when more complex organic moieties are present in the coating the transformation that occurs after the second inflection point can be more complex and more prolonged. Therefore, for the purposes of developing a process for curing these coatings we can determine from this analysis that a first low temperature cure can be accomplished at a temperature of approximately 125° C., which is the first point of inflection. A second higher temperature cure at the second point of inflection (approximately 450° C. for the material in Sample 1 and 350° C. for the material in Sample 2) results in increased hardness, abrasion resistance and hydrophobicity. Temperatures beyond the second inflection point result in the breakdown and modification of organic moieties that may in some embodiments be useful.

The curing process parameters including substrate speed, air knife output air temperature, air knife air flow volume, air knife opening distance to substrate surface, pre and post heating set temperatures are used to control process cure parameters including maximum temperature, rate of heating, duration at temperature, cumulative temperature exposure and rate of cooling that can be used to tune specific properties of the final cured film. One property is hardness as measured by nano-indentation methods. In some embodiments, the curing system described herein may cure sol-gel coatings on glass substrates to a hardness of approximately 0.2 GPa to 10 GPa and preferably to a hardness of approximately 2 GPa to 4 GPa. Another property is abrasion resistance. In some embodiments, the curing system described herein may cure sol-gel coatings on glass substrates to an abrasion resistance whereby they lose no more than 1% of absolute optical transmission as measured by spectrophotometer after 500 strokes of an abrasion test performed in accordance with specification EN1096.2 and preferably no more than 0.5% loss of absolute optical transmission after 1000 strokes. Such a test can be performed using a Taber reciprocating abrader model 5900 with a ratcheting arm assembly. A third property is surface energy as measured by water contact angle (WCA). In some embodiments the curing system described herein may cure sol-gel coatings to a WCA of approximately 60° to 120° and preferably to a WCA of approximately 70° to 100°. In other embodiments the film can be cured to a WCA of approximately 5° to 30° and preferably a WCA of approximately 10° to 20°. A fourth property is refractive index (RI) as measured by ellipsometer. In some embodiments the curing system described herein may cure sol-gel coatings to a RI of approximately 1.25 to 1.45 and preferably a RI of approximately 1.35 to 1.42. A fifth property is final film thickness as measured by ellipsometer. The final film thickness is a function of the initial (pre-cure) dry film thickness and the cure parameters such that the cure parameters modify the initial dry thickness. In some embodiments the curing system described herein may cure sol-gel coatings to a thickness of 50 nm to 150 nm and to a preferred thickness of 70 nm to 130 nm.

Figures 20A, 20B, 20C:
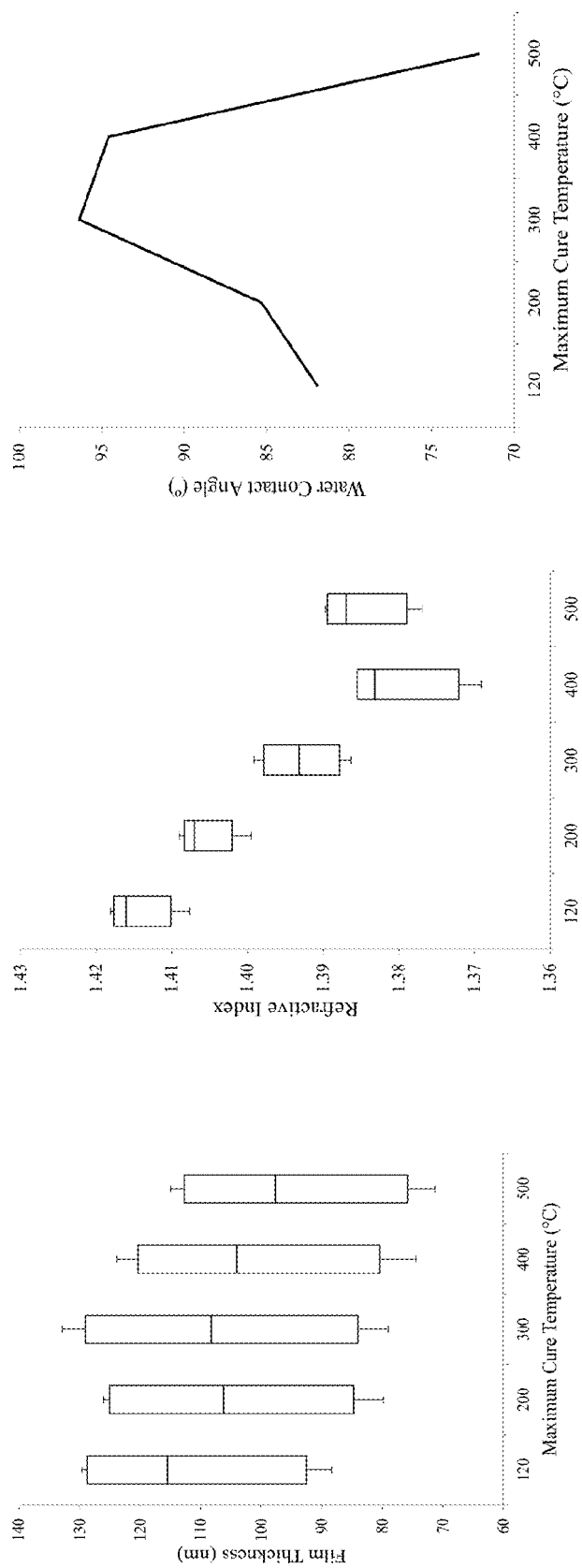
FIGS. 20a, 20b and 20c show data for an exemplary sol-gel coating that demonstrates control of final film thickness, refractive index and water contact angle as a function of maximum cure temperature.

FIGS. 20a, 20b and 20c depict data for an exemplary sol-gel coating that demonstrate control of final film thickness, refractive index and water contact angle as a function of maximum cure temperature.

Figure 20E:
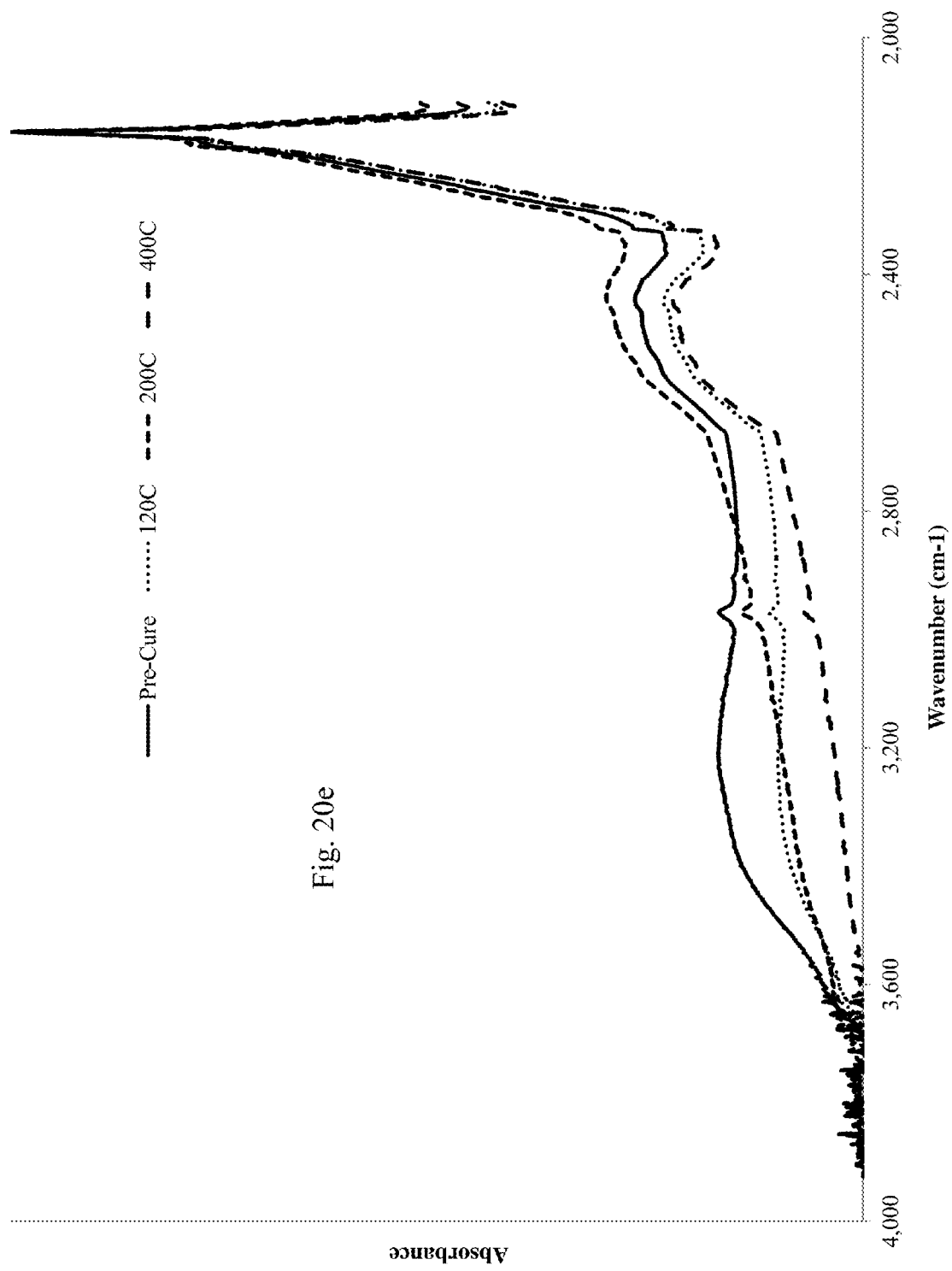

FIG. 20d shows Fourier transform infrared spectra (FT-IR) of sol-gel coating material from Example 3 taken before and after a cure process step. This analysis technique shows how chemical bonds within the material change during the curing process. In particular, the spectral peaks denoted by points 220, 221 & 222 have changed during the process. Without being bound by theory, these changes can be interpreted as the reduction of Si—OH bonds through condensation causing the reduction of the peaks at points 220 and 222. These bonds are converted to Si—O—Si bonds causing the increase in the peak at point 221. This analysis technique can be used to quantify the proportion of Si—OH bonds that condense and hence to quantify the degree to which the film is cured. FIG. 20e shows FT-IR spectra of Example 3 cured at different cure temperatures of 120° C., 200° C. and 400° C.

FIG. 21 shows Si-29 NMR of the sol from Example 2 taken before coating and curing. The assigned chemical shifts and qualitative mol % of total molecules are shown in Table 14.

TABLE 14

The list of assigned peaks and mol % of total molecules in FIG. 21.

| Si signal in unit Structure | Chemical shifts/ppm | mol % of unit in the total sol structure |
|---|---|---|
| $[RSi(OH)_2O_{0.5}]_a$ and $[R'Si(OH)_2O_{0.5}]_m$ | −53 | 6.22 |
| $[RSi(OH)O]_c$ and $[R'Si(OH)O]_p$ | −58 | 10.46 |
| $[RSiO_{1.5}]_b$ and $[R'SiO_{1.5}]_n$ | −63.3 | 40.49 |
| $[Si(OH)_3O_{0.5}]_z$ | −90 | 2.73 |
| $[Si(OH)_2O]_y$ | −93 | 2.0 |
| $[Si(OH)O_{1.5}]_x$ | −99.65 | 27.21 |
| $[SiO_2]_w$ | −108.52 | 10.43 |

Total Si—OH containing units in the sol of Example 2 is 48.6 mol % of units of the total sol structure based in Si-NMR. However, not all Si—OH have the same reactivity towards condensation as some have more steric hindrance than others in the complex cage, branch and network structure of the sol polymer.

FIG. 22 shows Si-29 NMR of the sol from Example 3 taken before coating and curing. The assigned chemical shifts and qualitative mol % of total molecules are shown in Table 15.

TABLE 15

The list of assigned peaks and mol % of total molecules in FIG. 22.

| Si signal in unit Structure | Chemical shifts/ppm | mol % of unit in the total sol structure |
|---|---|---|
| $[RSi(OH)_2O_{0.5}]_a$ | −53 | 11.11 |
| $[RSi(OH)O]_c$ | −58 | 1.00 |
| $[RSiO_{1.5}]_b$ | −63.3 | 41.38 |
| $[Si(OH)_3O_{0.5}]_z$ | −90 | 2.73 |
| $[Si(OH)_2O]_y$ | −93 | 2.0 |

TABLE 15-continued

The list of assigned peaks and mol % of total molecules in FIG. 22.

| Si signal in unit Structure | Chemical shifts/ppm | mol % of unit in the total sol structure |
|---|---|---|
| $[Si(OH)O_{1.5}]_x$ | −99.65 | 30.27 |
| $[SiO_2]_w$ | −108.52 | 11.74 |

Total Si—OH containing units in the sol of Example 3 is 47.1 mol % of units of the total sol structure based in Si-NMR. However, not all Si—OH have the same reactivity towards condensation as some have more steric hindrance than others in the complex cage, branch and network structure of the sol polymer.

Figure 30A:
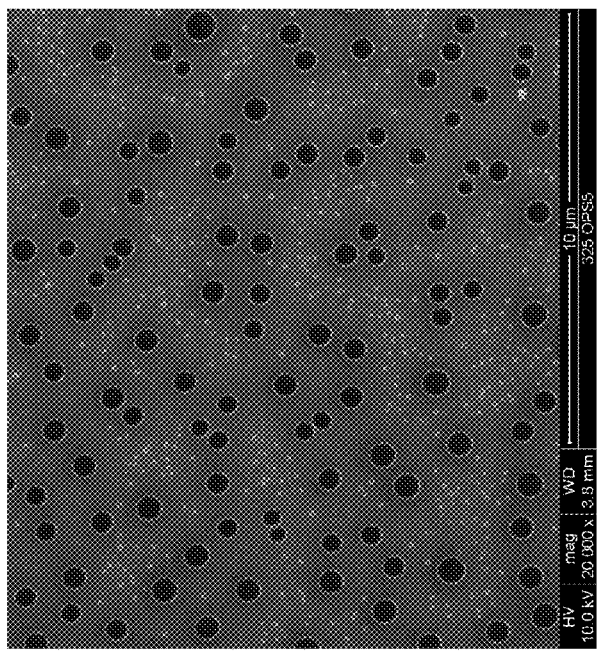
FIG. 30a depicts a top-down SEM micrograph of the roll-coated and cured sample of Example 55.
Figure 30B:
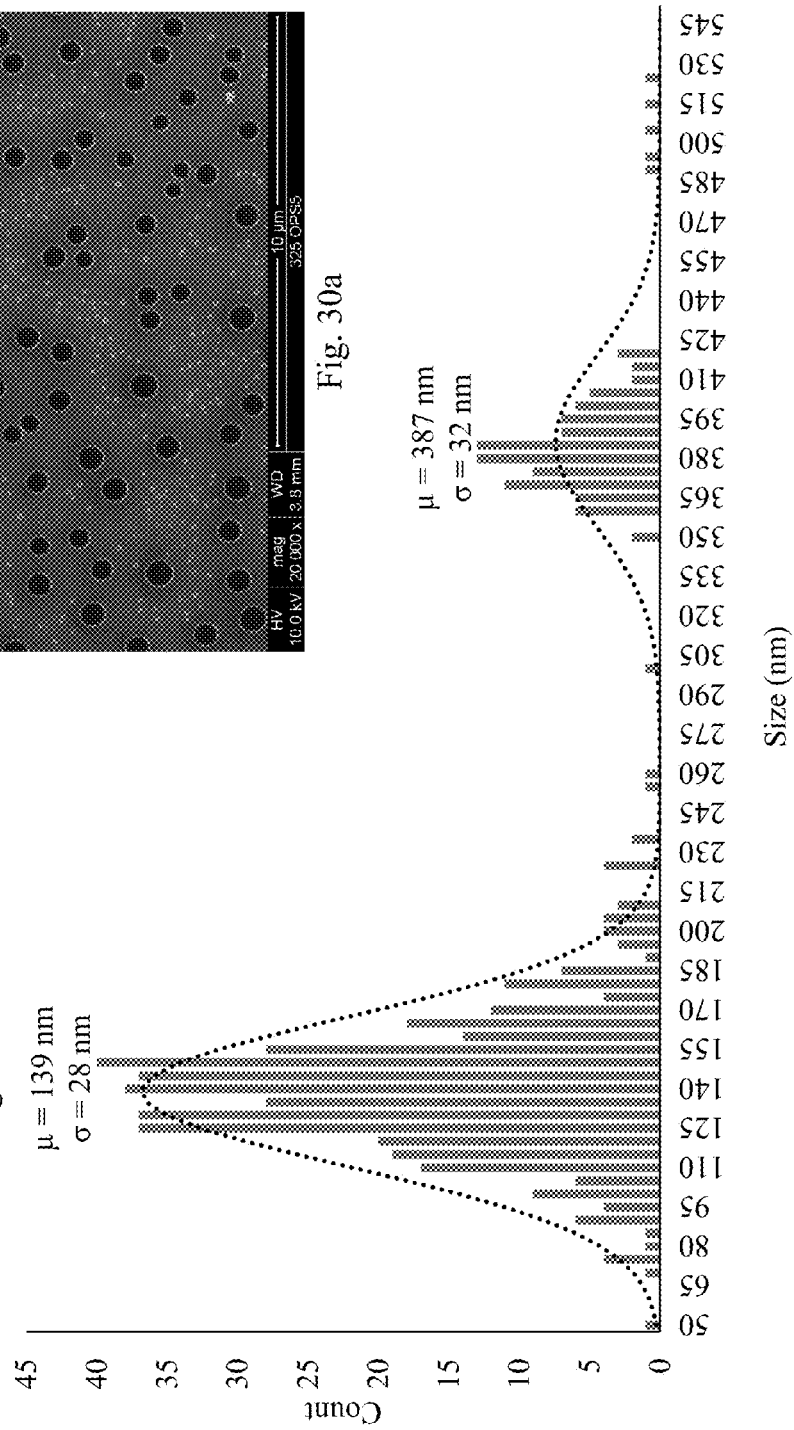
Figure 31B:
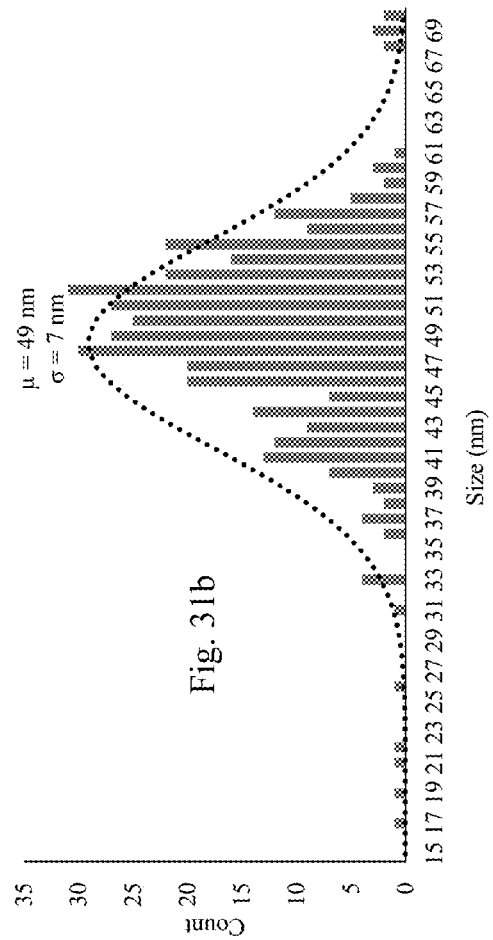
Figure 31A:
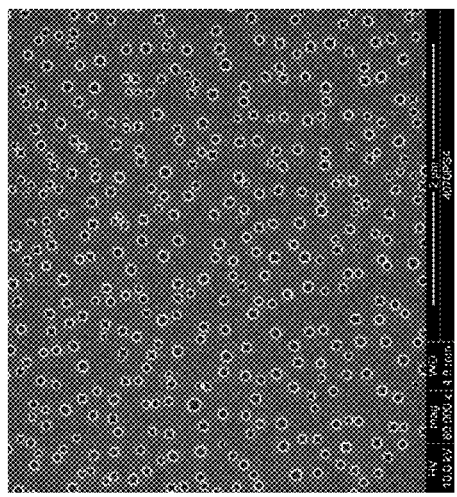

FIG. 30a is a top-down SEM micrograph of a sample roll-coated with a single-layer transparent coating from the solution from Example 55. It depicts a plurality of voids in the coating. FIG. 30b is the result of an image analysis of the SEM micrograph of FIG. 30a using the open source ImageJ program. It shows the distribution of void diameter for voids open and or visible at the surface of the film in the image. In this particular embodiment, the distribution is bi-modal, with a first group of voids having a mean diameter of about 119 nm and a standard distribution of about 28 nm and a second group having a mean diameter of about 387 nm and a standard distribution of about 32 nm. In embodiments of the present disclosure, coatings may have bi-modal distributions of void diameter with a first group having a mean of between about 25 nm and about 150 nm and a standard deviation of between about 5 nm and about 40 nm, and a second group having a mean of between about 150 nm and about 500 nm and a standard deviation of between about 25 nm and about 50 nm.

FIGS. 31a-36a are top-down SEM micrographs of samples prepared from embodiments of the present disclosure that have approximately Gaussian distributions of void diameter as determined by image analysis of the micrograph images with the ImageJ software program. They show the distribution of void diameter for voids open and or visible at the surface of the film in the image. FIG. 31b shows a distribution with a mean void diameter of about 49 nm with a standard deviation of about 7 nm. FIG. 32b shows a distribution with a mean void diameter of about 57 nm with a standard deviation of about 9 nm. FIG. 33b shows a distribution with a mean void diameter of about 69 nm with a standard deviation of about 10 nm. FIG. 34b shows a distribution with a mean void diameter of about 37 nm with a standard deviation of about 4 nm. FIG. 35b shows a distribution with a mean void diameter of about 113 nm with a standard deviation of about 15 nm. FIG. 36b shows a distribution with a mean void diameter of about 119 nm with a standard deviation of about 15 nm. In embodiments of the present invention coatings may have approximately Gaussian distributions of void diameter between about 10 nm and about 150 nm with standard deviations of about 2 nm to about 40 nm and between about 35 nm and about 120 nm with standard deviations of between about 4 nm and about 15 nm.

Using the void area data generated from the ImageJ analysis of FIGS. 30a-36a, the percentage of the surface area that is visible open voids can be determined. Table 16 below summarizes the area percentages for the figures shown.

TABLE 16

Percentage of total area that is visible voids at the surface.

| FIG. | % |
|---|---|
| 30 | 9.5% |
| 31 | 5.7% |
| 32 | 5.9% |
| 33 | 7.2% |
| 34 | 3.2% |
| 35 | 13.4% |
| 36 | 19.3% |

In embodiments of the present disclosure, coatings, which may be single-layer transparent coatings, may have ratios of total area of voids visible at the surface to total surface area of between about 1% and about 50% and between about 3% and about 20%.

FIGS. 37a, 37b, 37c and 37d are oblique cross-sectional SEM micrographs of embodiments of the present disclosure of coatings, which may be single-layer transparent coatings, showing a cross-section through the coating and part of the top surface of the coating. The coating may contain a plurality of oblate voids. The size of the voids may range from small to large relative to the thickness of the coating. In embodiments the ratio of the void major axis to the average thickness of the coating is between about 0.05 to about 5. In embodiments some voids may substantially extend through the full thickness of the coating. In embodiments, some voids may be open to the surface. In embodiments, some voids may not be open to the surface. In embodiments, the vertical distribution of voids through the thickness of the coating may be bi-modal with a first group of relatively smaller voids within the bulk of the coating and a second group of relatively larger voids open to the surface of the coating. Open voids at the surface of the coating may also be characterized as dimples, depressions, holes or the like. In embodiments, the vertical distribution of voids through the thickness of the coating may be approximately Gaussian.

For characterization purposes, the porosity of the coating may be defined as the percentage of the total cross-sectional area of the coating that is within visible voids in a cross-sectional SEM micrograph of the coating. In embodiments the porosity of the coating may be between about 50% and about 2% and between about 30% and about 5%.

In embodiments, the major axis of the oblate voids in the coating may be between about 5 nm and about 500 nm and between about 150 nm and about 250 nm and between about 5 nm and about 100 nm and between about 40 nm and about 80 nm. The minor axis of the oblate voids may be between about 3 nm and about 150 nm and between about 70 nm to about 90 nm and between about 20 nm to about 60 nm and between about 3 nm and about 50 nm. The flattening or ellipticity, or oblateness of the oblate voids may be defined with the following equation where a is the major axis and b is the minor axis.

$$f = \frac{a-b}{a}$$

In embodiments, the oblate voids in the coating have a flattening of between about 0.0 to about 0.8 and between about 0.3 to about 0.7.

Figure 38:
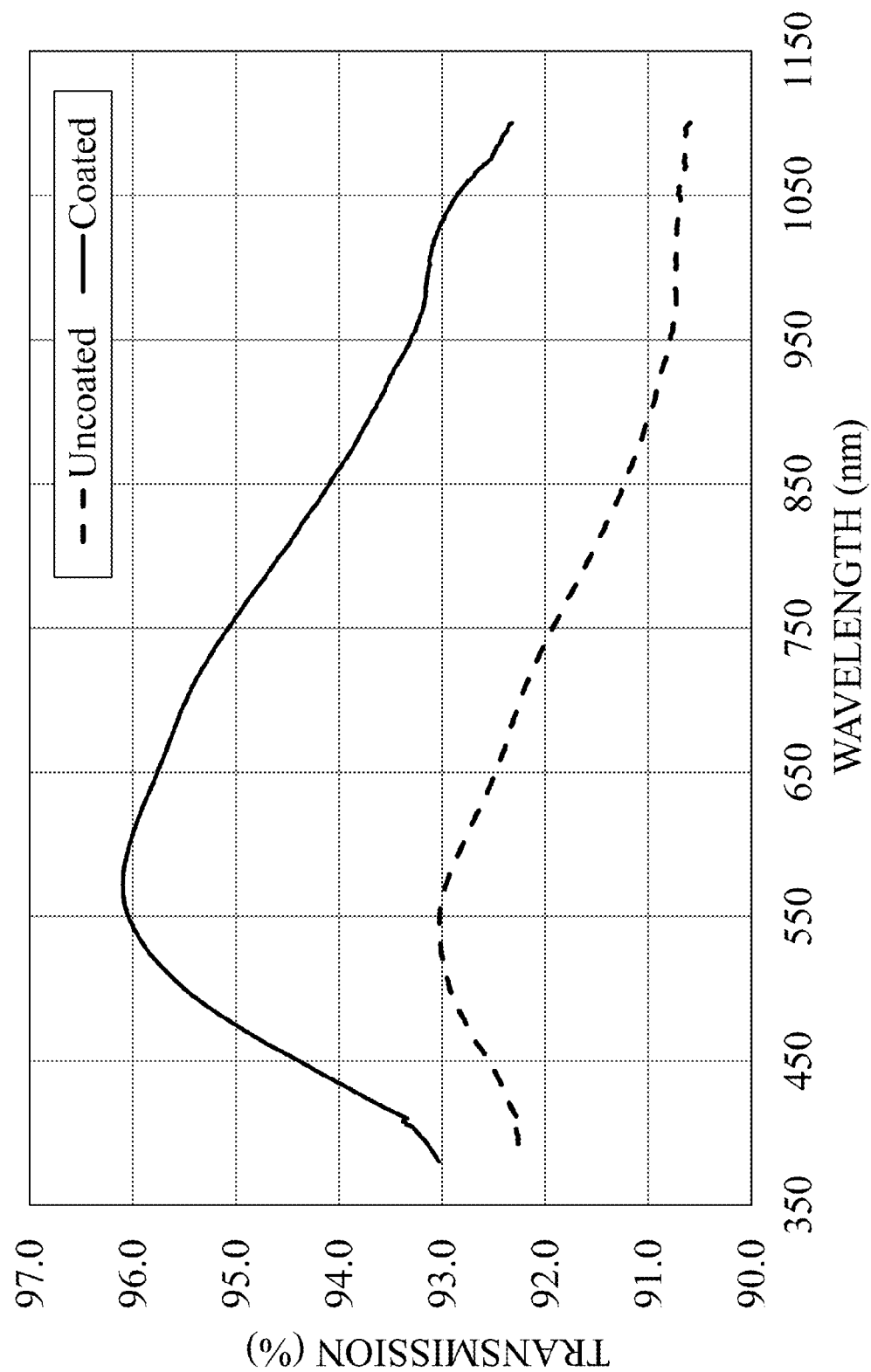
FIG. 38 illustrates the UV-vis transmittance spectra of coating made from Example 55 roll coated on a float-glass substrate.

FIG. 38 illustrates the transmittance spectra of a piece of PPG Starphire float-glass coated with the mixture of Example 55 versus the transmittance spectra of a the same glass type that is uncoated. The sample shows a strong anti-reflective effect with $\Delta T_{AM}$ (absolute difference in solar weighted transmission between coated and uncoated) of 2.74%.

The presence of relatively large voids in the coating may engender several useful properties to the coating and to articles to which the coating is applied. In some embodiments, the porosity of the coating, which may be a single-layer transparent coating, reduces its refractive index such that the coating acts as a very effective anti-reflecting layer. In some embodiments the bi-modal distribution of voids in the coating may be used to create more complex optical transmission spectra compared to the spectra of a single-layer anti-reflective coating; the larger voids may be sized such that they scatter short wavelength UV light while not substantially affecting longer wavelength light, while smaller voids would have negligible scattering effects but would reduce the coating refractive index to enhance anti-reflective performance. Such coatings may be very useful in applications such as solar photovoltaic modules wherein maximum transmission of solar light is desired, but at the same time materials within the photovoltaic module such as encapsulants like EVA and backsheet materials may be degraded by UV light. Another useful application would be so-called conservation glass wherein art works or other artifacts need to be displayed behind glass, but it is desired to reduce reflections from the glass for easy viewing while at the same time filtering harmful UV light that may damage or degrade the art works or artifacts over the longer term. Today such conservation glass is fabricated using multiple coating layers with separate functions such as UV filtering and anti-reflection and anti-fingerprint or anti-stain. The coating of the present invention may have all of these functions in a single layer. In some embodiments the voids may be used to hold a substance that can impart additional properties in situ or that can be released over time to achieve a useful goal. In some embodiments, hydrophobic and oleophobic materials such as long-chain hydrocarbons, silicone polymers, fluoro-polymers and the like could be held in the voids so that they imparted a long term hydrophobic and or oleophobic characteristic to the glass surface. In some embodiments, the refractive index of the material within the void may substantially match the refractive index of the bulk of the coating and so that even relatively large voids would have negligible optical effect. Materials could be deposited into the voids by various methods of coating known in the art such as roll-coating, spray coating, slot-die coating, dip-coating, emersion and the like. In some embodiments, the voids could be re-charged with material in the field after some period of time, for example by applying a spray or rubbing a material on the surface. In some embodiments, the voids could be used to hold biocide materials such as fungicides and pesticides and the like to impart longer term resistance to bio-contamination. In some embodiments, the size of the voids could be selected such that the release of substances held within the voids was temporally controlled. In some embodiments, the substance within the voids could be a drug or other medicinal or bio-active agent.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the disclosure.

Similarly, it should be appreciated that in the foregoing description of exemplary embodiments of the disclosure, various features of the disclosure are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context.

What is claimed is:

1. A siloxane polymer solution composition, comprising:
   (i) a siloxane polymer A formed from acid hydrolyzed alkoxysilane, organosilane, and optionally, an organofluorosilane, wherein the siloxane polymer A has the following formula:
   $[RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y$ $[Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth) acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group, a fluorine substituted glycidylether group, or a combination thereof, $0<a,b,c,w,x,y,z<0.9$, $0\leq m,n,p<0.9$, and $a+b+c+m+n+p+w+x+y+z=1$;
   (ii) a hydrolysis acid catalyst;
   (iii) a polar organic solvent; and
   (iv) a colloidal silica nano-filler in an amount from 0.1 to 5 wt. % of the total siloxane polymer solution,
   wherein the siloxane polymer solution is prepared in a two-step process comprising preparing hydrolyzed organosilane in the presence of the colloidal silica nano-filler before combining with the alkoxysilane.

2. The composition of claim 1, wherein said siloxane polymer A comprises an average molecular weight (Mw) of 600 to 10,000 Daltons.

3. The composition of claim 1, wherein said siloxane polymer A comprises 0.1 to 10 weight percent of the total weight of the sol.

4. The composition of claim 1, wherein said alkoxysilane comprises tetramethoxysilane, said organosilane comprises methyltrimethoxysilane, and said organofluorosilane comprises trifluoropropyltrimethoxysilane.

5. The composition of claim 1, wherein said alkoxysilane comprises tetraethoxysilane, said organosilane comprises methyltrimethoxysilane, and said organofluorosilane comprises trifluoropropyltrimethoxysilane.

6. The composition of claim 1, wherein said alkoxysilane comprises tetramethoxysilane, said organosilane comprises methyltrimethoxysilane, and said organofluorosilane comprises (tridecafluoro-1,1,2,2-tetrahydrooctyl)trimethoxysilane.

7. The composition of claim 1, wherein said alkoxysilane comprises tetraethoxysilane, said organosilane comprises methyltrimethoxysilane, and said organofluorosilane comprises (tridecafluoro-1,1,2,2-tetrahydrooctyl)trimethoxysilane.

8. The composition as of claim 1, wherein said siloxane polymer A comprises a relative weight ratio of said tetraalkoxysilane to a total of said organosilane and said organofluorosilane of 0.2 to 2.

9. The composition of claim 1, wherein the hydrolysis acid catalyst is selected from the group consisting of hydrochloric acid, nitric acid, sulfuric acid, phosphoric acid, methanesulfonic acid and acetic acid in amount of 0.01 to 1.0 weight present of the total sol formulation.

10. The composition of claim 1, wherein the polar organic solvent is selected from the group consisting of alcohols, esters, ethers, propylene glycol monomethyl ether (PGME), a mixture of isopropanol and PGME, aldehydes, and ketones; and water, wherein an amount of the amount of said solvent and said water in said mixture is from 50% to 99.5% by weight.

11. The composition of claim 1, further comprising at least one additive selected from the group consisting of a porogen, a template, a thermal radical initiator, a photo radical initiator, an adhesion promoter, a Si—OH condensation catalyst and a surfactant.

12. The composition of claim 11, wherein the porogen or template is selected from the group consisting of ethylene oxide, propylene oxide, polyethylene oxides, polypropylene oxides, ethylene oxide/propylene oxide block co-polymers, polyoxyethylated polyoxypropylated glycols, fatty acid ethoxylates, ethylene glycol esters, glycerol esters, mono- di-glycerides, glycerylesters, polyethylene glycolesters, polyglycerol esters, polyglyceryl esters, polyol monoesters, polypropylene glycol esters, polyoxyalkylene glycol esters, polyoxyalkylene propylene glycol esters, polyoxyalkylene polyol esters, polyoxyalkylene glyceride esters, polyoxyalkylene fatty acid, sorbitan esters, sorbitan fatty acid esters, sorbitan esters, polyoxyalkylene sorbitan esters, polyoxyethylene sorbitan monolaurate, polyoxyethylene sorbitan monostearate, polyoxyethylene sorbitan tristearate, and sorbitan ester ethoxylates in an amount of 0.0 to 5 wt % of total sol composition.

13. The composition of claim 11, wherein the adhesion promoter is selected from the group consisting of (meth) acryloxypropyl trimethoxysilane, (meth)acryloxypropyl triethoxysilane, (meth)acryloxypropyl dimethylmethoxysilane, (meth)acryloxypropyl methyldimethoxysilane, 3-glycidylpropyl trimethoxysilane, 3-glycidylpropyl triethoxysilane, 3-glycidylpropyl dimethylmethoxysilane, and 3-glycidylpropyl methyldimethoxysilane in an amount of 0.0-5.0 weight percent of the total sol formulation.

14. The composition of claim 11, wherein the thermal radical initiator is selected from the group consisting of 4,4'-azobis(4-cyanovaleric acid), 4,4'-azobis(4-cyanovaleric acid) >75%,1,1'-azobis(cyclohexanecarbonitrile) 98%, azobisisobutyronitrile, 2,2'-azobis(2-methylpropionamidine) dihydrochloride, 2,2'-azobis(2-methylpropionitrile), 2,2'-azobis(2-methylpropionitrile), tert-butyl hydroperoxide, tert-butyl peracetate, cumene hydroperoxide, 2,5-di(tert-butylperoxy)-2,5-dimethyl-3-hexyne, 2,5-di(tert-butylperoxy)-2,5-dimethyl-3-hexyne, dicumyl peroxide, 2,5-bis(tert-butylperoxy)-2,5-dimethylhexane, 2,4-pentanedione peroxide, 1,1-bis(tert-butyylperoxy)-3,3,5-trimethylcyclohexane, 1,1-bis(tert-butylperoxy)cyclohexane, 1,1-bis(tert-amylperoxy) cyclohexane, benzoyl peroxide, 2-butanone peroxide, tert-butyl peroxide, lauryl peroxide, tert-butyl peroxybenzoate, tert-butylperoxy 2-ethylhexyl carbonate, and tert-butyl hydroperoxide in an amount of 0.1 to 5 wt % of the total sol composition.

15. The composition of claim 11, wherein the photo radical initiator is selected from the group consisting of acetophenone, anisoin, anthraquinone, anthraquinone-2-sulfonic acid, sodium salt monohydrate, (benzene) tricarbonylchromium, benzil, benzoin, benzoin ethyl ether, benzoin isobutyl ether, benzoin methyl ether, benzophenone, benzophenone/1-hydroxycyclohexyl phenyl ketone, 3,3',4,4'-benzophenonetetracarboxylic dianhydride, 4-benzoylbiphenyl, 2-benzyl-2-(dimethylamino)-4'-morpholinobutyrophenone, 4,4'-bis(diethylamino)benzophenone, 4,4'-bis(dimethylamino)benzophenone, camphorquinone, 2-chlorothioxanthen-9-one, (cumene)cyclopentadienyliron(II) hexafluorophosphate, dibenzosuberenone, 2,2-diethoxyacetophenone, 4,4'-dihydroxybenzophenone, 2,2-dimethoxy-2-phenylacetophenone, 4-(dimethylamino)benzophenone, 4,4'-dimethylbenzil, 2,5-dimethylbenzophenone, 3,4-dimethylbenzophenone, diphenyl(2,4,6-trimethylbenzoyl)phosphine oxide/2-hydroxy-2-methylpropiophenone, 4'-ethoxyacetophenone, 2-ethylanthraquinone, ferrocene, 3 3'-hydroxyacetophenone, 4'-hydroxyacetophenone, 3-hydroxybenzophenone, 4-hydroxybenzophenone, 1-hydroxycyclohexyl phenyl ketone, 2-hydroxy-2-methylpropiophenone, 2-methylbenzophenone, 3-methylbenzophenone, methybenzoylformate, 2-methyl-4'-(methylthio)-2-morpholinopropiophenone, phenanthrenequinone, 4'-phenoxyacetophenone, thioxanthen-9-one, triarylsulfonium hexafluoroantimonate salts, and triarylsulfonium hexafluorophosphate salts in an amount of 0.0 to 5 wt % of total sol composition.

16. The composition of claim 11, wherein the Si—OH condensation catalyst is selected from the group consisting of: a hydroxide selected from the group consisting of potassium hydroxide (KOH), sodium hydroxide (NaOH), cesium hydroxide (CsOH), ammonium hydroxide (NH4OH) and tetramethyl ammonium hydroxide (TMAH); an amide selected from the group consisting of formamide, dimethylformamide (DMF) and N,N-dimethylacetamide (DMA); imidazolines; an amine selected from the group consisting of triethyl amine and trimethyl amine; N-methylpyrrolidinone (NMP); thermal base generator (TBG); and tetramethoxymethyl glycoluril in an amount of 0.0 to 1.0 wt % of the total sol formulation.

17. The composition of claim 11, wherein the surfactant is selected from the group consisting of nonionic surfactants, polyoxyethylene glycol alkyl ethers, polyoxyethylene octyl phenyl ether, polyoxyethylene glycol sorbitan alkyl esters (polysorbate), ionic surfactants and tetraalkylammonium halides including cetyltrimethylammonium bromide in an amount of 0.0 to 5.0 wt % of the total sol formulation.

18. A method of forming a coating on a substrate, comprising:
preparing a siloxane polymer solution composition, comprising:
(i) a siloxane polymer A formed from acid hydrolyzed alkoxysilane, organosilane, and optionally, an organofluorosilane, wherein the siloxane polymer A has the following formula:
$[RSi(OH)_2O_{0.5}]_a[RSiOH_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y[Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group , a fluorine substituted glycidylether group, or a combination thereof, $0<a,b,c,w,x,y,z<0.9$, $0<m,n,p<0.9$, and $a+b+c+m+n+p+w+x+y+z=1$;

(ii) a hydrolysis acid catalyst;
(iii) a polar organic solvent; and
(iv) a colloidal silica nano-filler in an amount from 0.1 to 5 wt. % of the total siloxane polymer solution, wherein the siloxane polymer solution is prepared in a two-step process comprising preparing hydrolyzed organosilane in the presence of the colloidal silica nano-filler before combining with alkoxysilane;
coating the substrate with the siloxane polymer solution; and
curing the coating to form a thin film.

19. The method of claim 18, further comprising an additive selected from the group consisting of a porogen, a template, a thermal radical initiator, a photo radical initiator, an adhesion promotor, a Si—OH condensation catalyst and a surfactant.

20. The method of claim 18, wherein the siloxane polymer solution is prepared in a two-step process comprising preparing hydrolyzed organosilane optionally combined with hydrolyzed organofluorosilane mixed with the colloidal silica nanofiller before combining with alkoxysilane.

21. The method of claim 18, wherein said alkoxysilane comprises tetramethoxysilane, said organosilane comprises methyltrimethoxysilane, and said organofluorosilane comprises trifluoropropyltrimethoxysilane.

22. The method of claim 18, wherein said alkoxysilane comprises tetraethoxysilane, said organosilane comprises methyltrimethoxysilane, and said organofluorosilane comprises trifluoropropyltrimethoxysilane.

23. The method of claim 18, further comprising thermally curing the coating at a temperature from 120° C. to 800° C.

24. The method of claim 18, wherein the coating has a thickness of about 80 nm to about 500 nm after curing.

25. The method of claim 18, wherein the substrate is at least one of a window, an architectural glass, an LED, a semi-conductor, an exposed photovoltaic element, a lens, a diffuser, a mirror, a windshield, an automotive glass, a screen, a display, goggles, eyeglasses, sunglasses, a greenhouse glass, a hybrid solar surface, a marine glass, an aviation glass, a glass used in transportation, and a mobile device screen.

26. The method of claim 18, wherein the substrate is coated by roll-coating or solution coating.

27. The method of claim 18, further comprising preheating the substrate to a temperature between 20° C. and 80° C. prior to coating.

28. The method of claim 18, further comprising preheating the substrate by radiant infrared heating.

29. The method of claim 18, further comprising preheating the substrate with a convection heater.

30. A coated glass substrate formed by the method of claim 18.

31. A coating comprising a dried gel prepared from siloxane polymer solution comprising:
i) a siloxane polymer A formed from acid hydrolyzed alkoxysilane, organosilane, and optionally, an organofluorosilane, wherein the siloxane polymer A has the following formula:

$[RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y[Si(OH)_3O_{0.5}]_z$, where R is selected from the group consisting of independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth) acryl group a substituted or unsubstituted glycidylether group, or a combination thereof, R' is selected from the group consisting of a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a substituted or unsubstituted (meth)acryl group, a fluorine substituted glycidylether group, or a combination thereof, $0<a,b,c,w,x,y,z<0.9$, $0<m,n,p<0.9$, and $a+b+c+m+n+p+w+x+y+z=1$;

(ii) a hydrolysis acid catalyst;
(iii) a polar organic solvent; and
(iv) a colloidal silica nano-filler in an amount from 0.1 to 5 wt. % of the total siloxane polymer solution.

32. The coating of claim 31, wherein the siloxane polymer solution is prepared in a two-step process comprising preparing hydrolyzed organosilane in the presence of the colloidal silica nano-filler before combining with alkoxysilane.

33. The coating of claim 31, further comprising an additive selected from the group consisting of a porogen, a template, a thermal radical initiator, a photo radical initiator, an adhesion promoter, a Si—OH condensation catalyst and a surfactant.

34. The coating of claim 31, wherein the siloxane polymer solution is prepared in a two-step process comprising preparing hydrolyzed organosilane optionally combined with hydrolyzed organofluorosilane mixed with the colloidal silica nano-filler before combining with alkoxysilane.

35. The coating of claim 31, wherein the thickness of the cured film is no more than 5 times greater than the diameter of the colloidal silica nano-filler.

36. The coating of claim 31, wherein the coating exhibits:
an absolute reduction in reflection of 1.0% to 3.5% as compared to uncoated glass;
a thickness of 80 to 160 nm; and sufficient toughness, abrasion resistance, adhesion to glass to pass standard EN-1096-2 with an absolute change in reflection of no more than 0.5% as measured after 2,000 abrasion strokes.

37. The coating of claim 31, wherein the coating improves the peak power output of the solar module by 1.0% to 3.5% on a relative basis.

* * * * *

UNITED STATES PATENT AND TRADEMARK OFFICE
CERTIFICATE OF CORRECTION

| | | |
|---|---|---|
| PATENT NO. | : 9,688,863 B2 | Page 1 of 1 |
| APPLICATION NO. | : 15/182729 | |
| DATED | : June 27, 2017 | |
| INVENTOR(S) | : Sina Maghsoodi et al. | |

It is certified that error appears in the above-identified patent and that said Letters Patent is hereby corrected as shown below:

On page 2, in the Related U.S. Application Data, "60/024,440" should read --62/024,440--

Signed and Sealed this
Third Day of October, 2017

Joseph Matal
*Performing the Functions and Duties of the*
*Under Secretary of Commerce for Intellectual Property and*
*Director of the United States Patent and Trademark Office*